(12) United States Patent
Kato

(10) Patent No.: US 11,158,638 B2
(45) Date of Patent: Oct. 26, 2021

(54) SEMICONDUCTOR DEVICE

(71) Applicant: SEMICONDUCTOR ENERGY LABORATORY CO., LTD., Atsugi (JP)

(72) Inventor: Kiyoshi Kato, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 36 days.

(21) Appl. No.: 16/613,478

(22) PCT Filed: May 7, 2018

(86) PCT No.: PCT/IB2018/053143
§ 371 (c)(1),
(2) Date: Nov. 14, 2019

(87) PCT Pub. No.: WO2018/211352
PCT Pub. Date: Nov. 22, 2018

(65) Prior Publication Data
US 2021/0091083 A1 Mar. 25, 2021

(30) Foreign Application Priority Data
May 18, 2017 (JP) .............................. JP2017-098686

(51) Int. Cl.
*H01L 29/10* (2006.01)
*H01L 27/105* (2006.01)
(Continued)

(52) U.S. Cl.
CPC ........ *H01L 27/1052* (2013.01); *H01L 27/127* (2013.01); *H01L 27/1225* (2013.01);
(Continued)

(58) Field of Classification Search
CPC ............. H01L 27/1052; H01L 27/1225; H01L 27/1255; H01L 29/66969
See application file for complete search history.

(56) References Cited

U.S. PATENT DOCUMENTS

| 8,384,080 B2 | 2/2013 | Taniguchi et al. |
| 8,547,771 B2 | 10/2013 | Koyama |

(Continued)

FOREIGN PATENT DOCUMENTS

| JP | 2011-124360 A | 6/2011 |
| JP | 2011-138934 A | 7/2011 |

(Continued)

OTHER PUBLICATIONS

International Search Report (Application No. PCT/IB2018/053143) dated Jul. 31, 2018.
(Continued)

*Primary Examiner* — Phuc T Dang
(74) *Attorney, Agent, or Firm* — Fish & Richardson P.C.

(57) ABSTRACT

A semiconductor device capable of retaining data for a long period is provided. The semiconductor device includes a first memory cell and a second memory cell. The first memory cell includes a first transistor. The second memory cell includes a second transistor. The threshold voltage of the second transistor is higher than the threshold voltage of the first transistor. The first transistor includes a first metal oxide. The second transistor includes a second metal oxide. Each of the first metal oxide and the second metal oxide includes a channel formation region. Each of the first metal oxide and the second metal oxide includes In, an element M (M is Al, Ga, Y, or Sn), and Zn. The atomic ratio of the element M to In in the second metal oxide is greater than that in the first metal oxide.

18 Claims, 29 Drawing Sheets

(51) Int. Cl.
  *H01L 27/12* (2006.01)
  *H01L 29/24* (2006.01)
  *H01L 29/66* (2006.01)
  *H01L 29/786* (2006.01)

(52) U.S. Cl.
  CPC .......... *H01L 27/1255* (2013.01); *H01L 29/24* (2013.01); *H01L 29/66969* (2013.01); *H01L 29/7869* (2013.01); *H01L 29/78648* (2013.01)

(56) References Cited

U.S. PATENT DOCUMENTS

| | | | |
|---|---|---|---|
| 8,692,252 B2 | 4/2014 | Takata et al. | |
| 8,956,912 B2 | 2/2015 | Yamazaki | |
| 9,287,405 B2 | 3/2016 | Sasagawa et al. | |
| 9,337,344 B2 | 5/2016 | Hanaoka | |
| 9,455,349 B2 | 9/2016 | Suzawa et al. | |
| 9,601,632 B2 | 3/2017 | Yamazaki et al. | |
| 10,032,918 B2 | 7/2018 | Yamazaki et al. | |
| 10,115,741 B2 | 10/2018 | Matsuda et al. | |
| 2006/0101231 A1* | 5/2006 | Higashida | G06F 15/8015 712/10 |
| 2011/0051522 A1* | 3/2011 | Luo | G11C 16/28 365/185.21 |
| 2014/0138676 A1* | 5/2014 | Yamazaki | H01L 29/78627 257/43 |
| 2016/0099258 A1* | 4/2016 | Yoneda | H01L 27/1225 257/43 |
| 2016/0336055 A1 | 11/2016 | Kato | |
| 2017/0025544 A1 | 1/2017 | Yamazaki et al. | |
| 2017/0040424 A1 | 2/2017 | Tanaka et al. | |
| 2017/0229486 A1 | 8/2017 | Matsuda et al. | |
| 2017/0285817 A1* | 10/2017 | Mori | G06F 3/0412 |
| 2017/0358582 A1* | 12/2017 | Zhou | H01L 27/10814 |

FOREIGN PATENT DOCUMENTS

| | | |
|---|---|---|
| JP | 2012-257187 A | 12/2012 |
| JP | 2016-212944 A | 12/2016 |
| JP | 2017-028288 A | 2/2017 |
| JP | 2017-143239 A | 8/2017 |
| JP | 2017-143255 A | 8/2017 |

OTHER PUBLICATIONS

Written Opinion (Application No. PCT/IB2018/053143) dated Jul. 31, 2018.

* cited by examiner

FIG. 5A
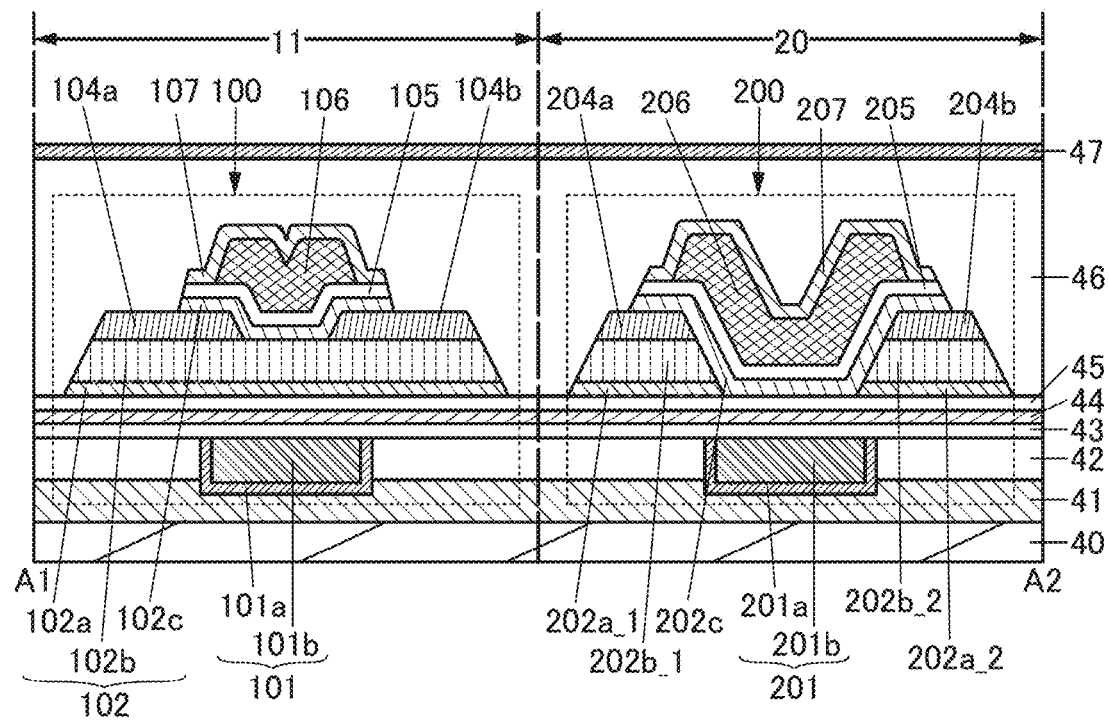
FIG. 5B1
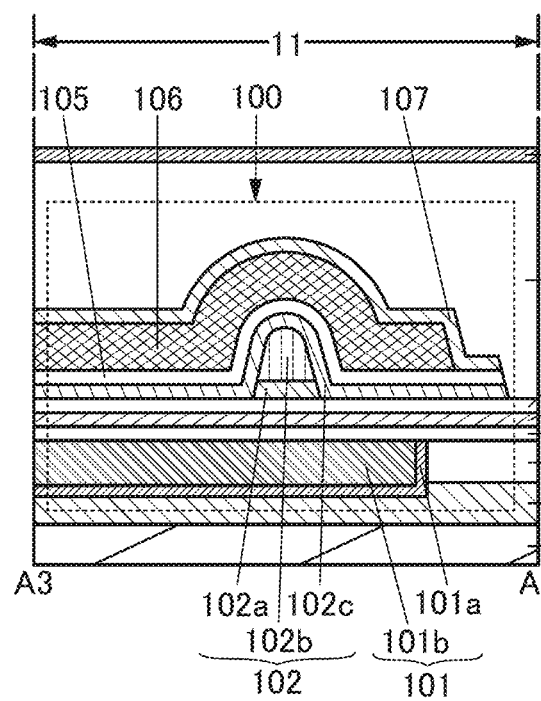
FIG. 5B2
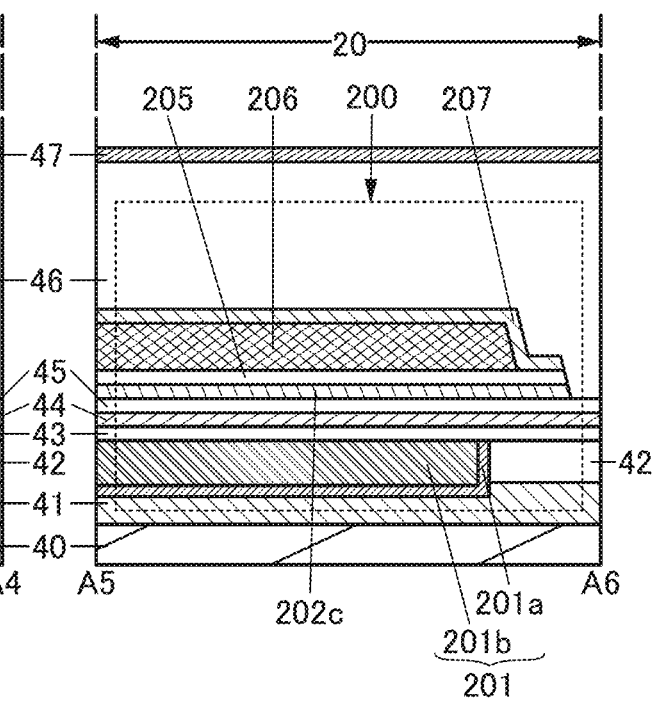

FIG. 7A
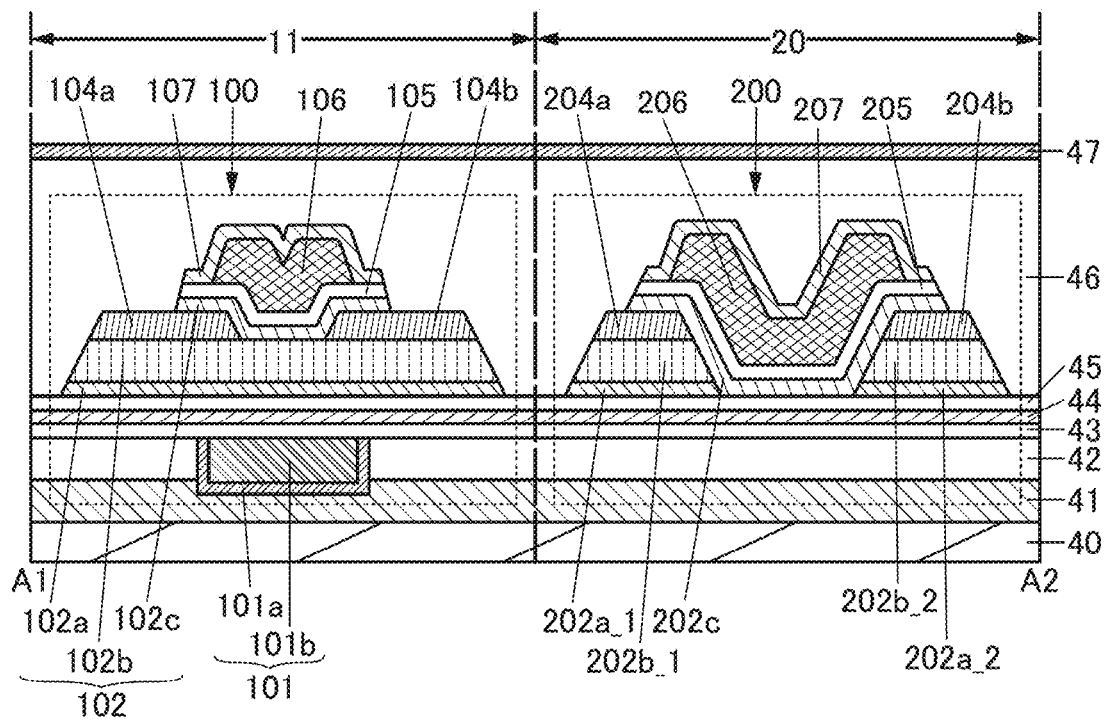
FIG. 7B1
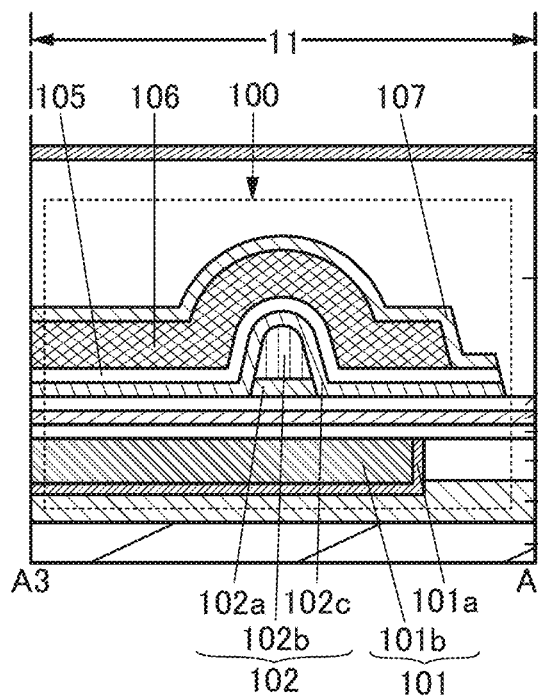
FIG. 7B2
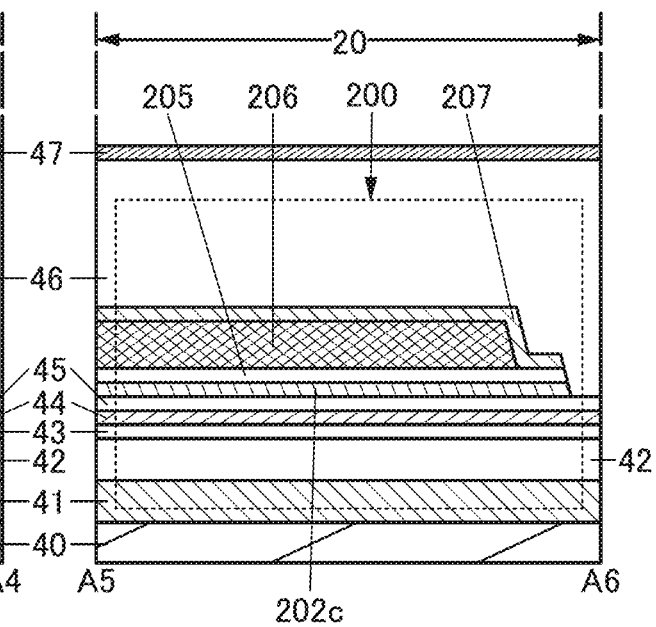

FIG. 8A
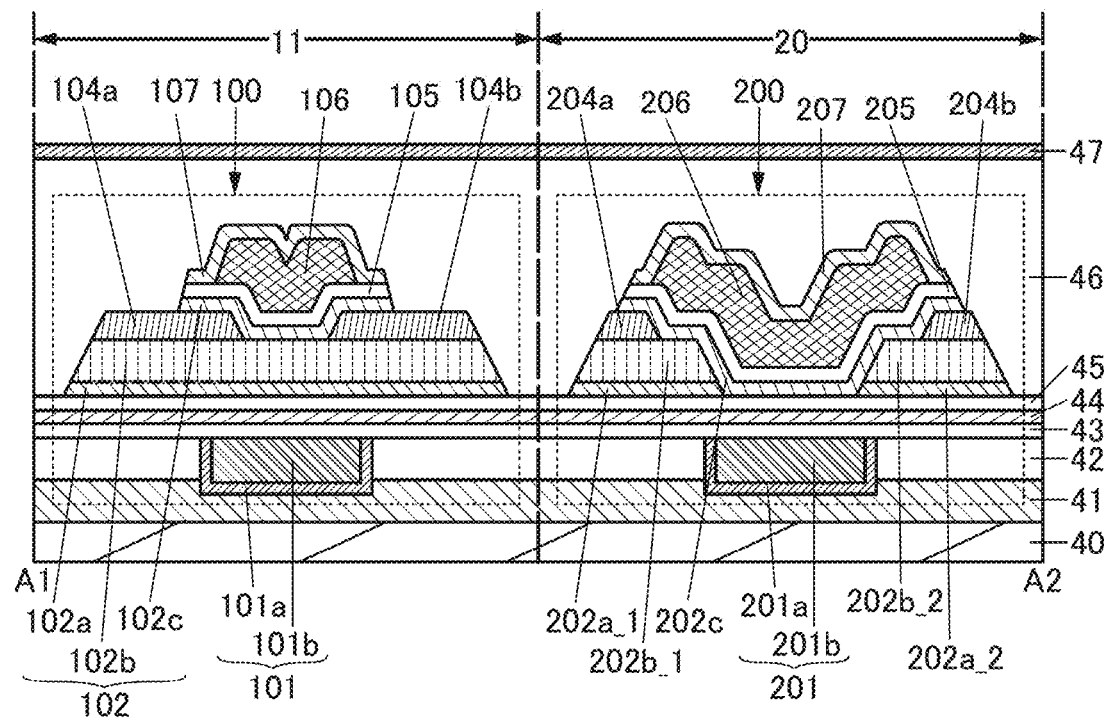
FIG. 8B1
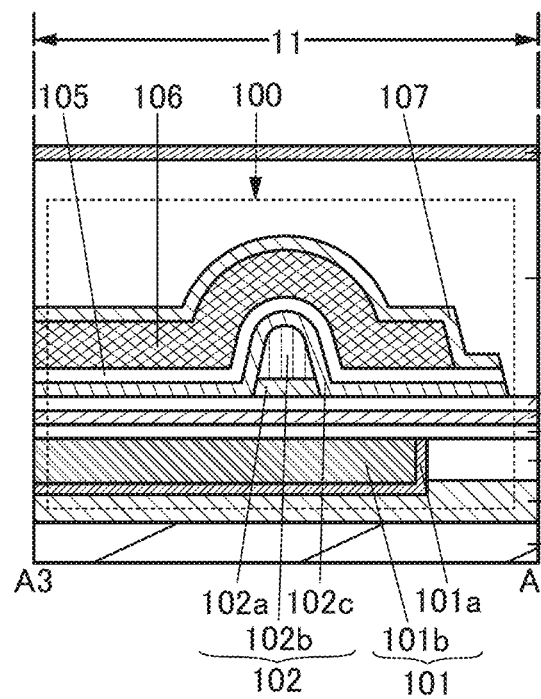
FIG. 8B2
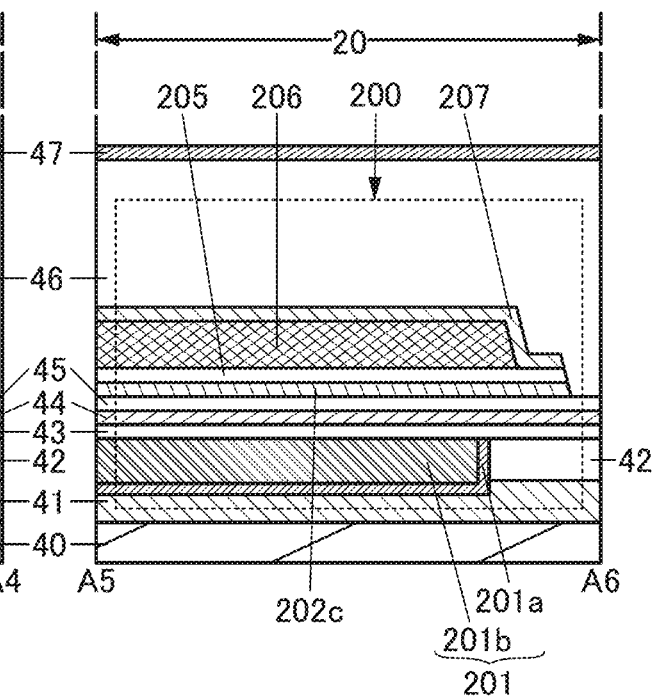

FIG. 9A
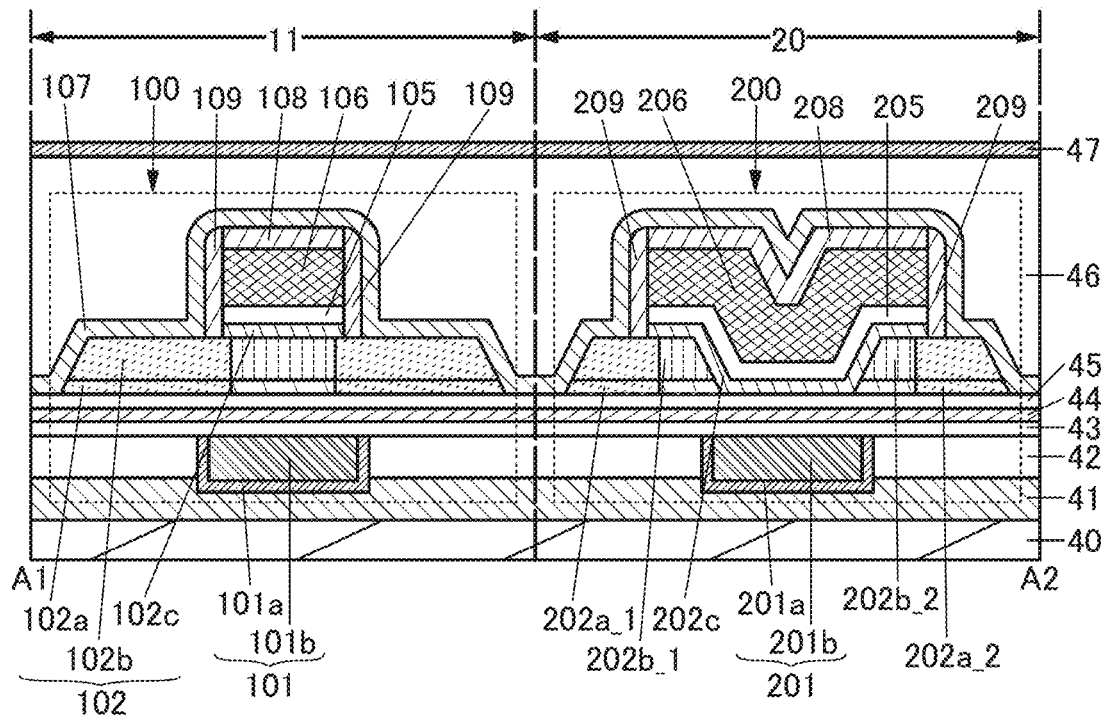
FIG. 9B1
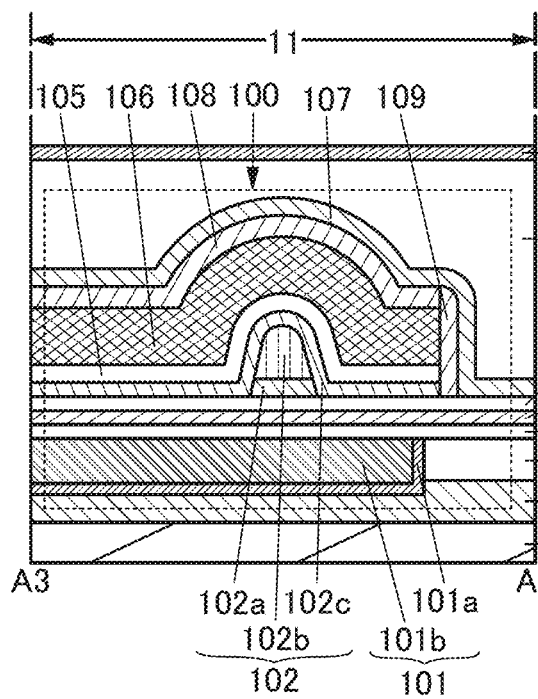
FIG. 9B2
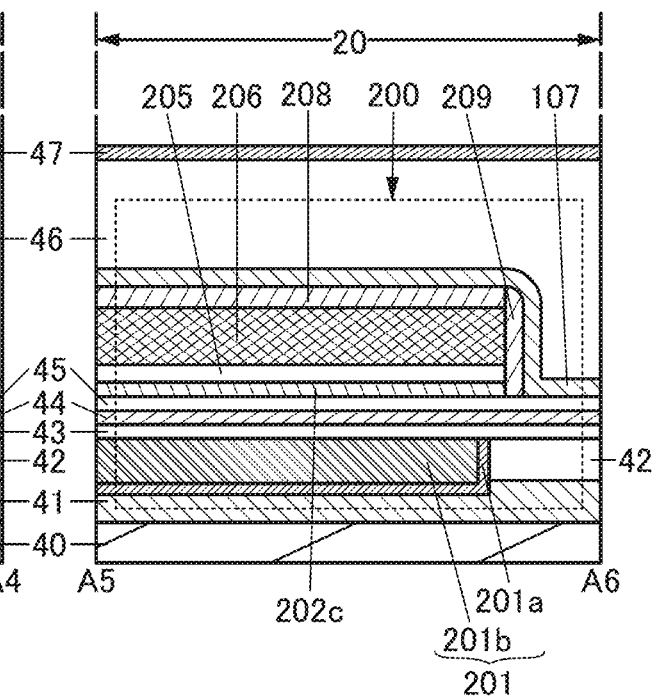

FIG. 10A
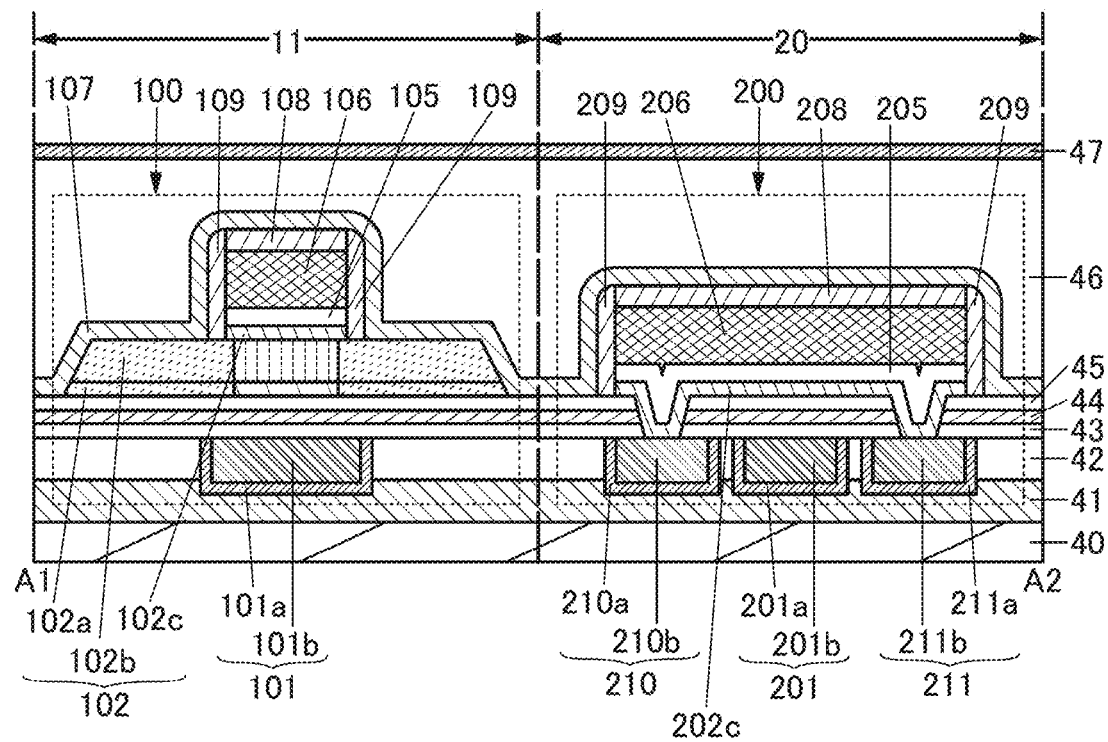
FIG. 10B1
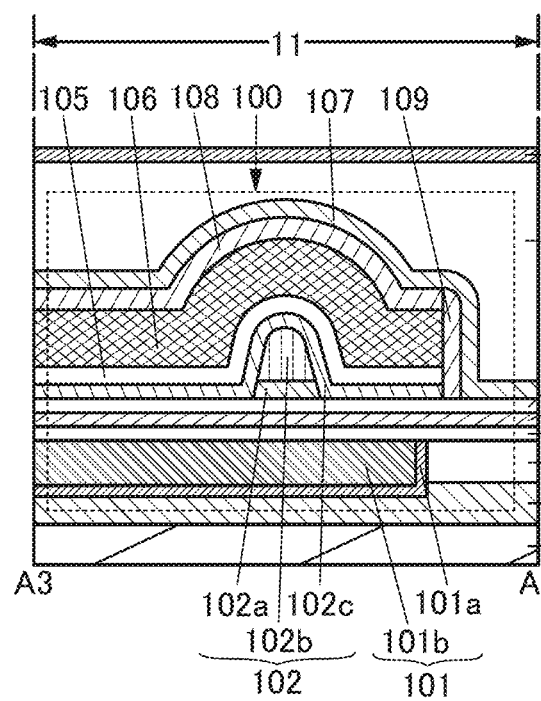
FIG. 10B2
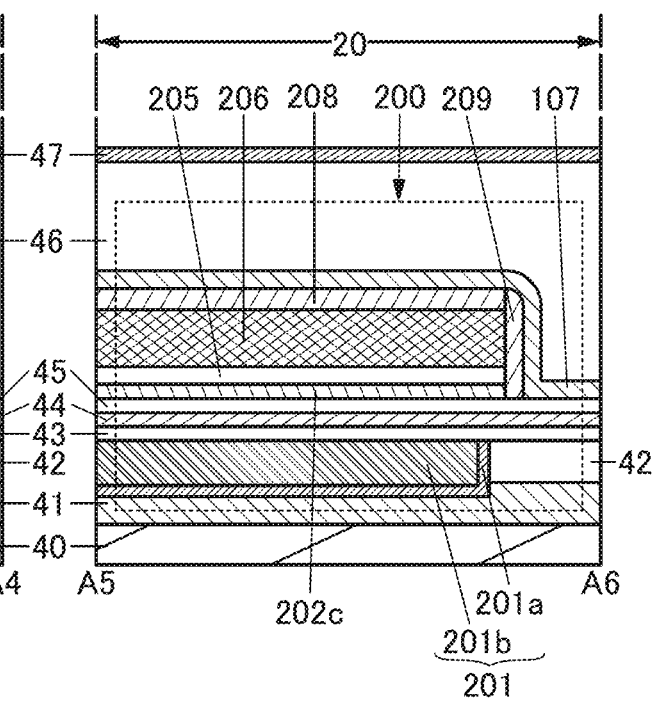

FIG. 12A
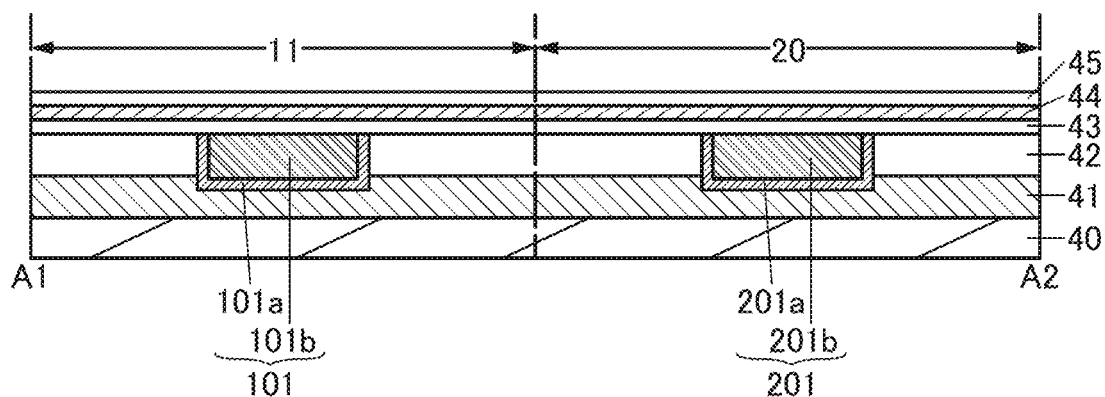
FIG. 12B1
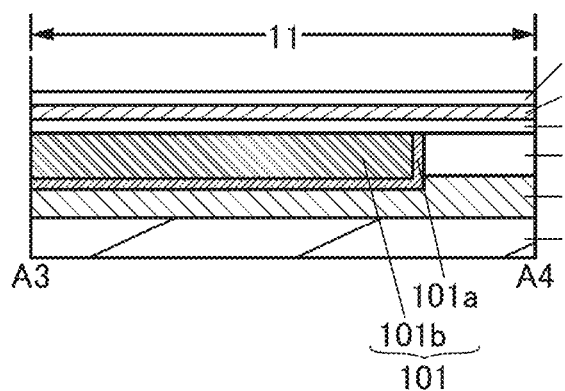
FIG. 12B2
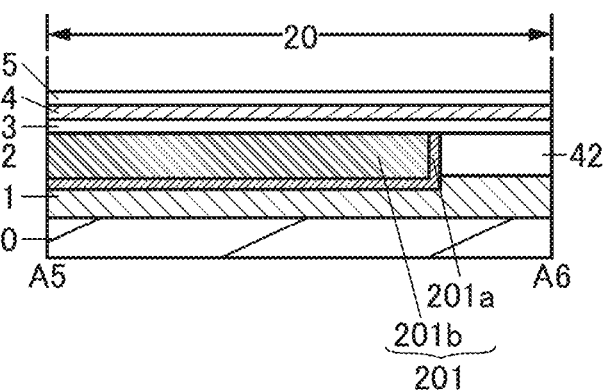

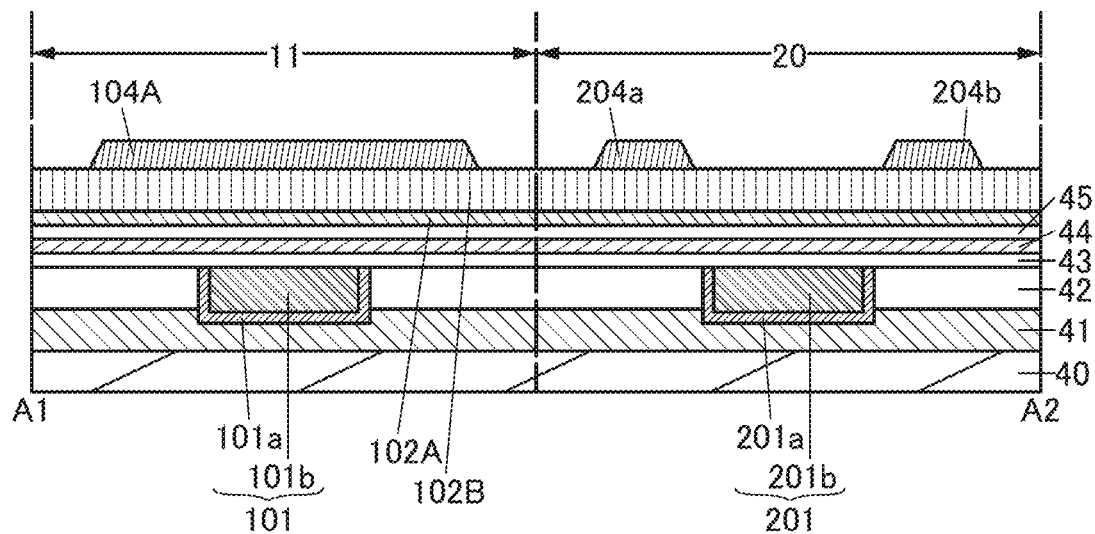
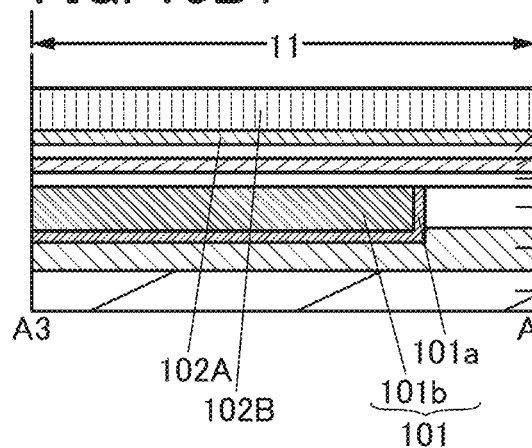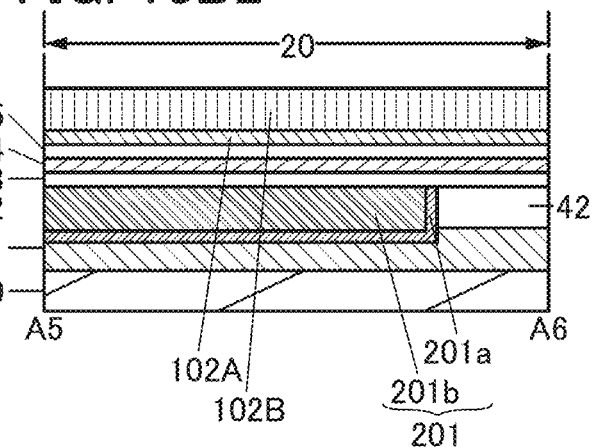

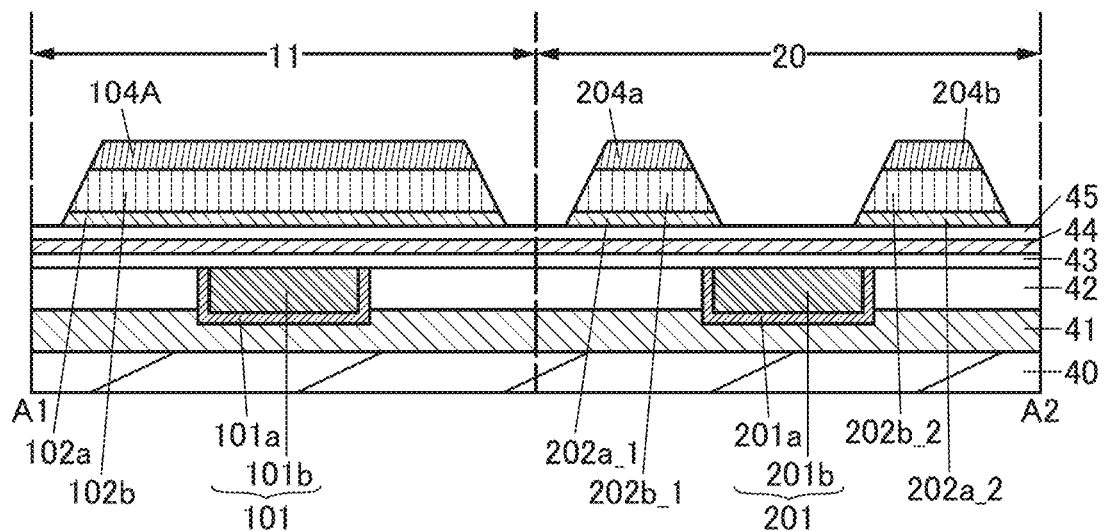
FIG. 14A
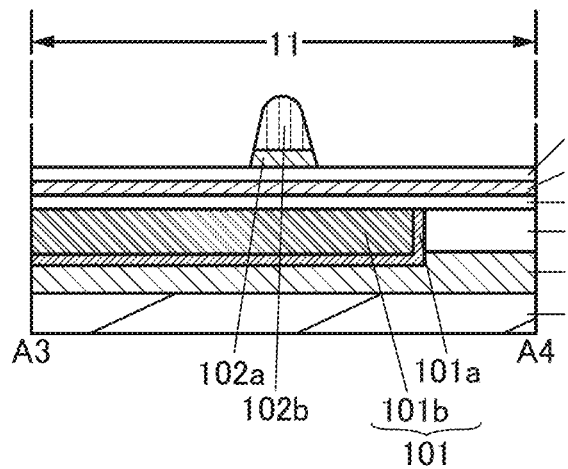
FIG. 14B1
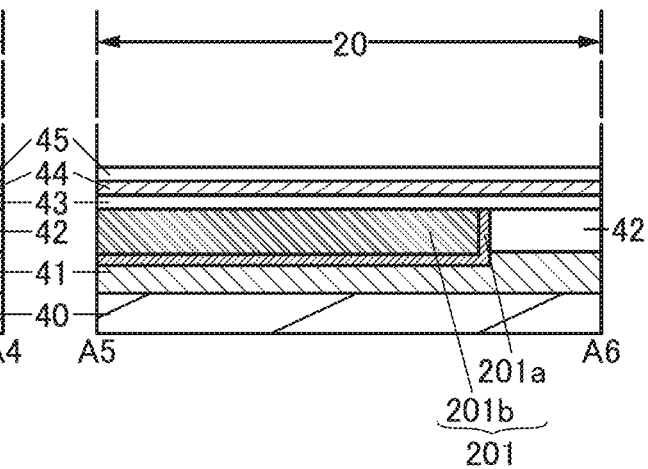
FIG. 14B2

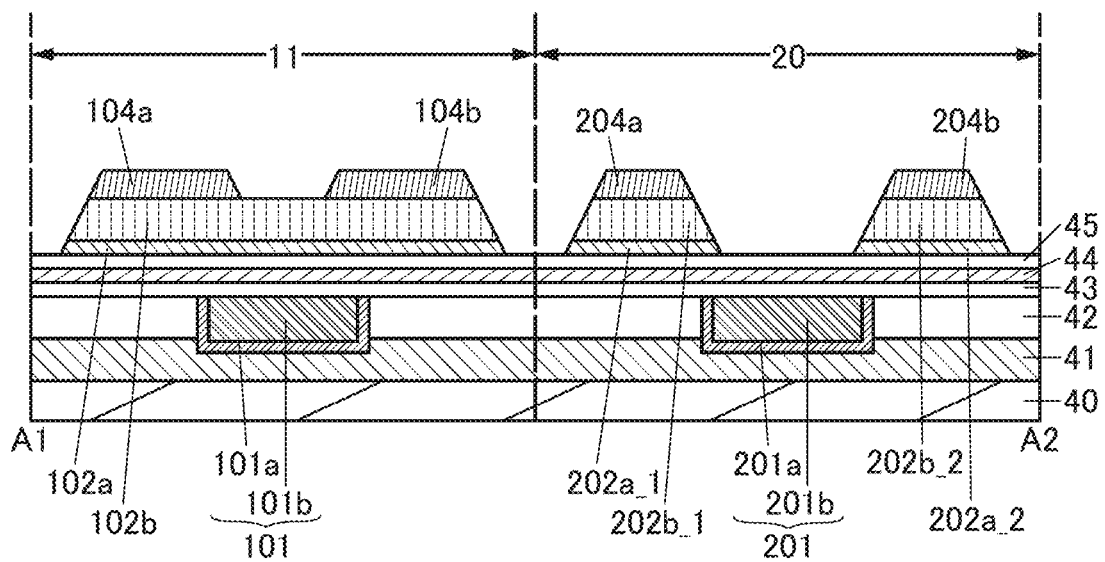
FIG. 15A
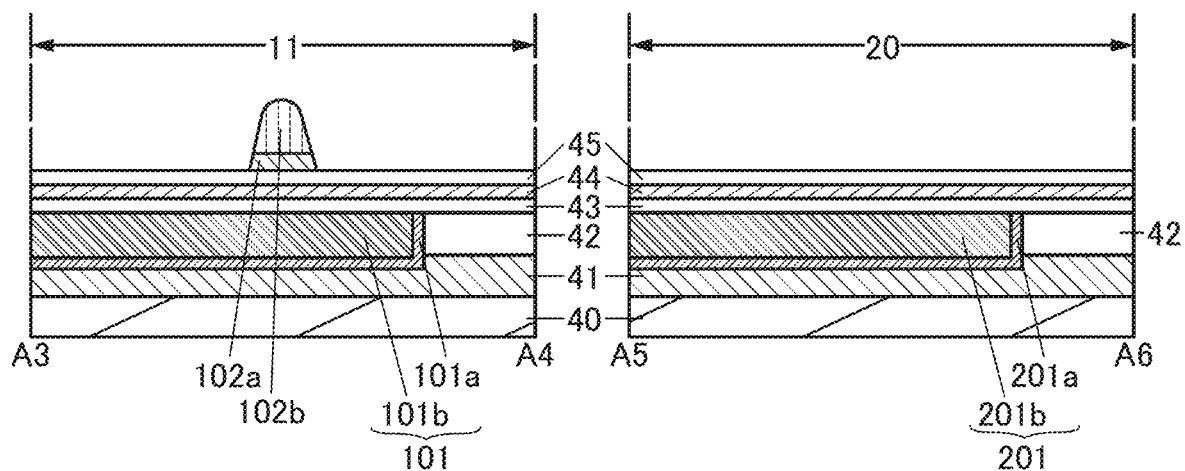
FIG. 15B1
FIG. 15B2

FIG. 16A
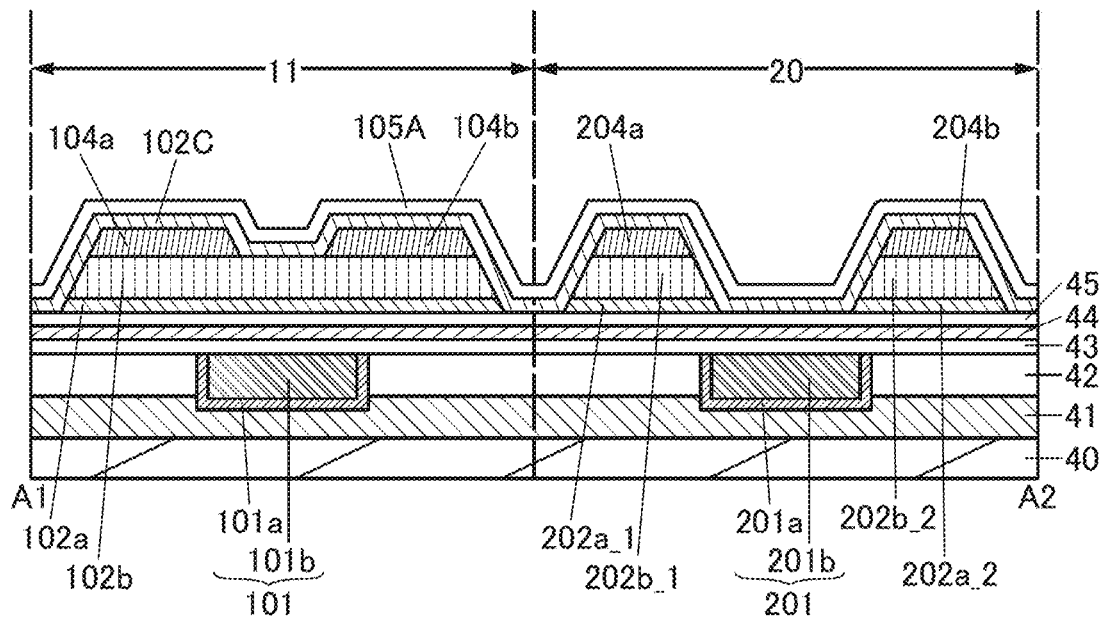
FIG. 16B1
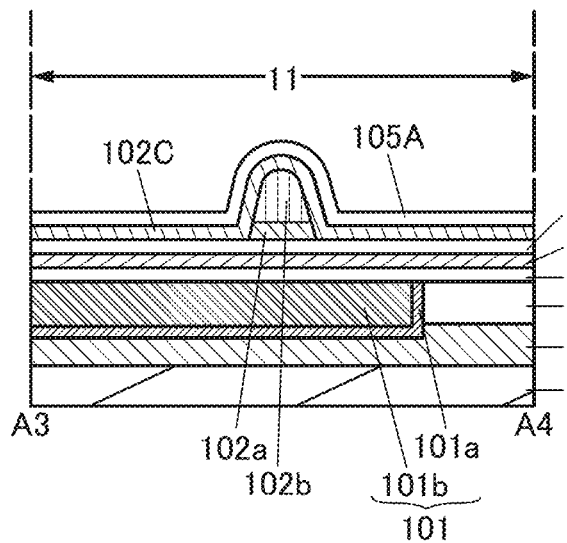
FIG. 16B2
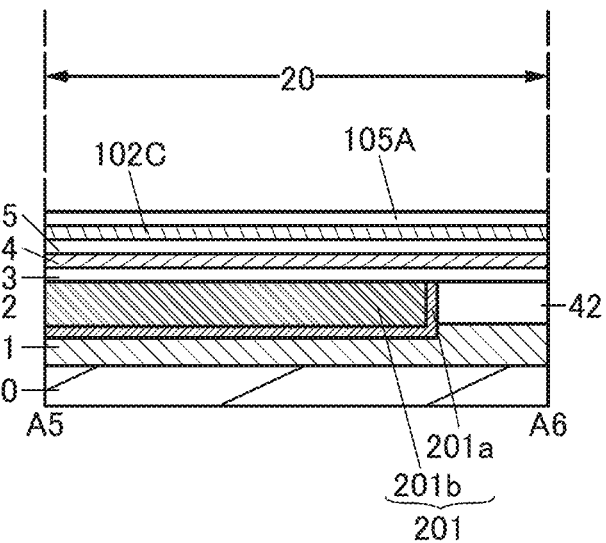

FIG. 17A
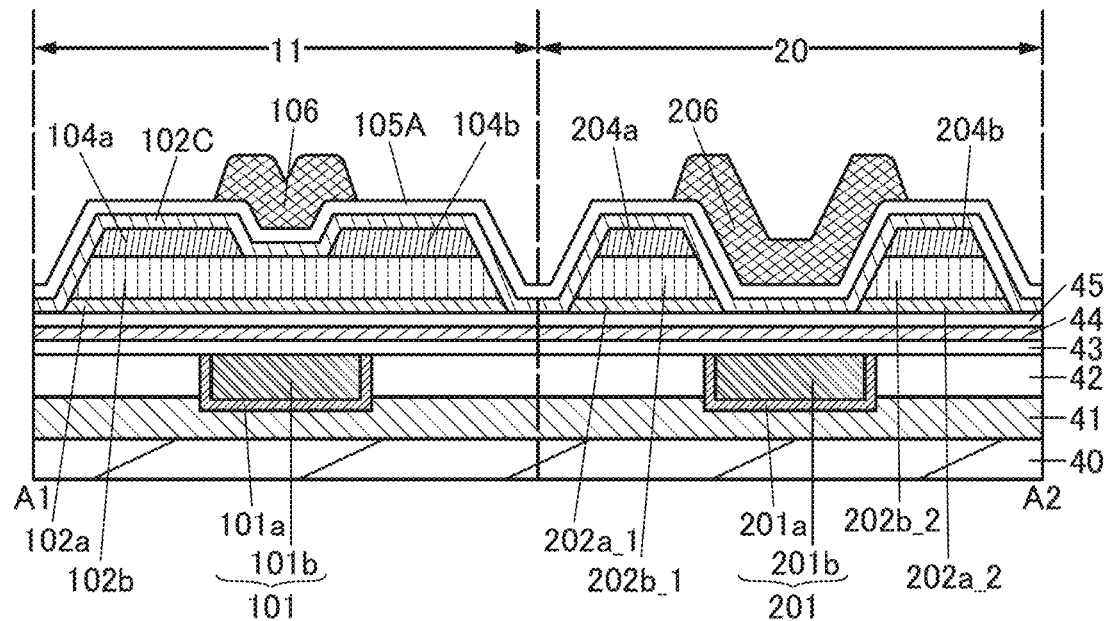
FIG. 17B1
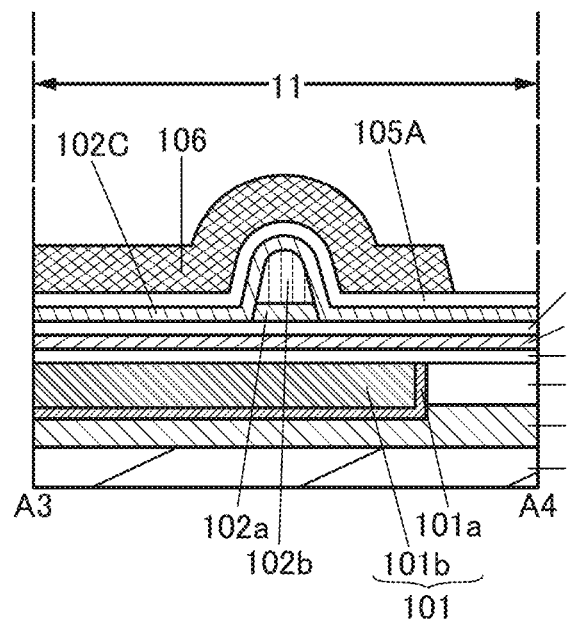
FIG. 17B2
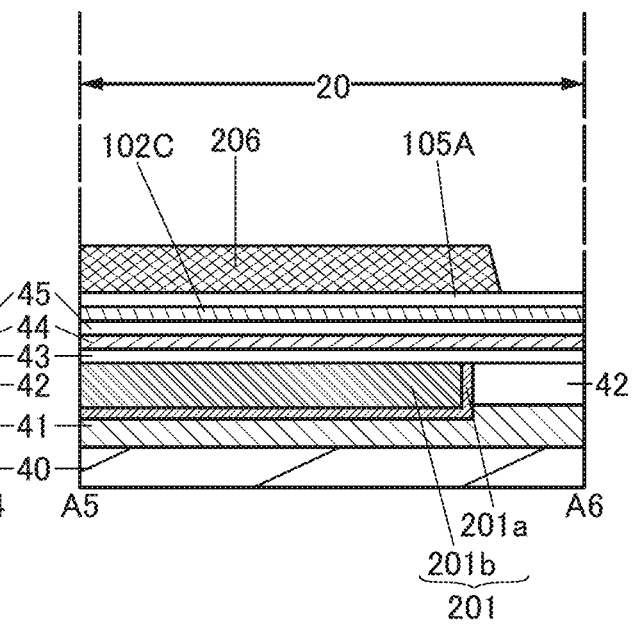

FIG. 18A
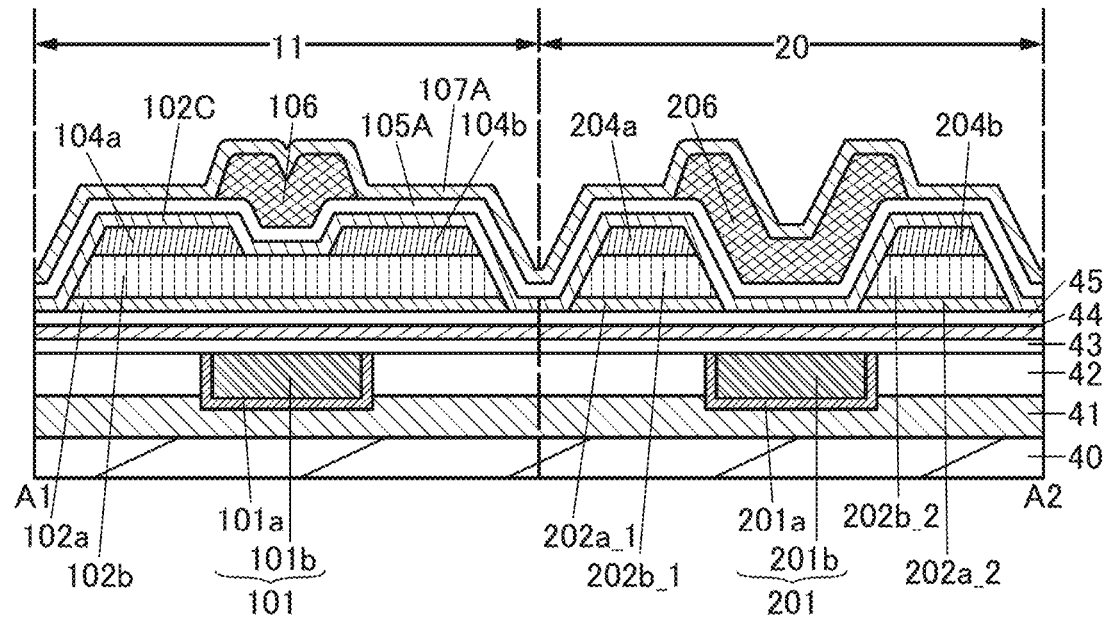
FIG. 18B1
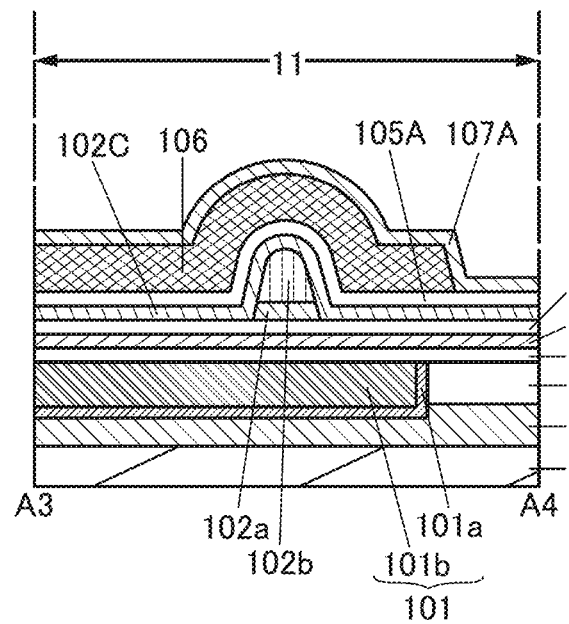
FIG. 18B2
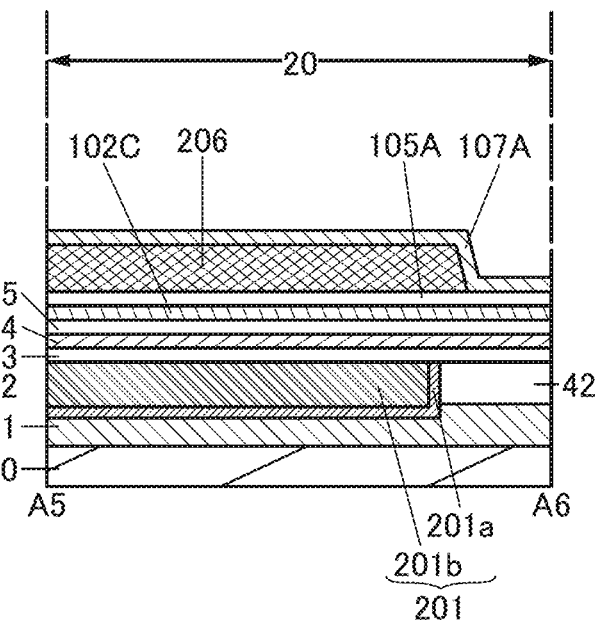

FIG. 19A
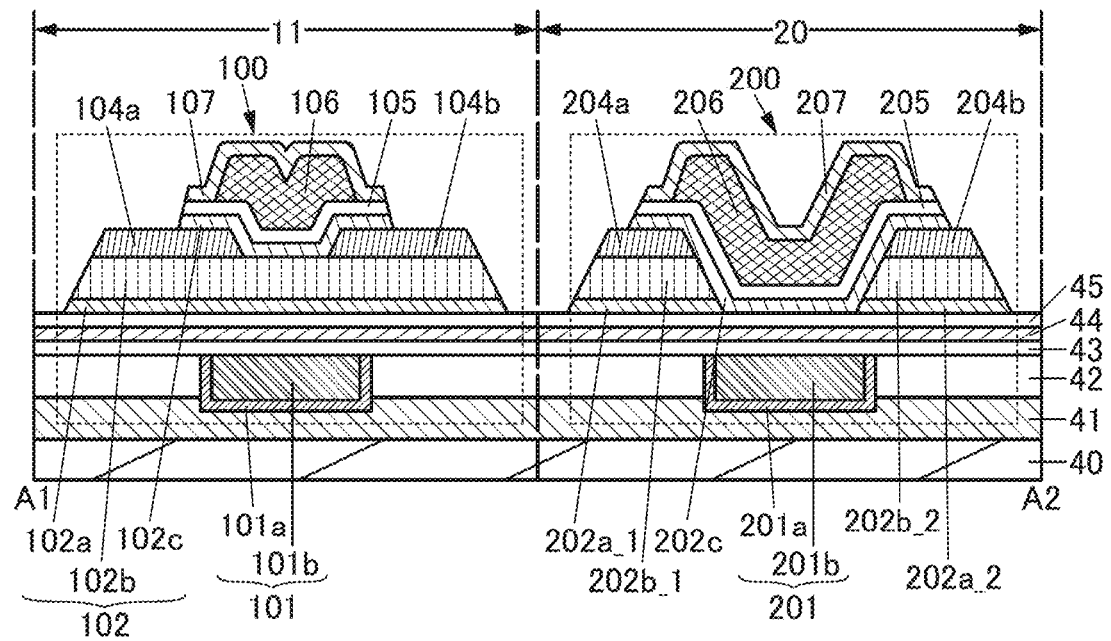
FIG. 19B1
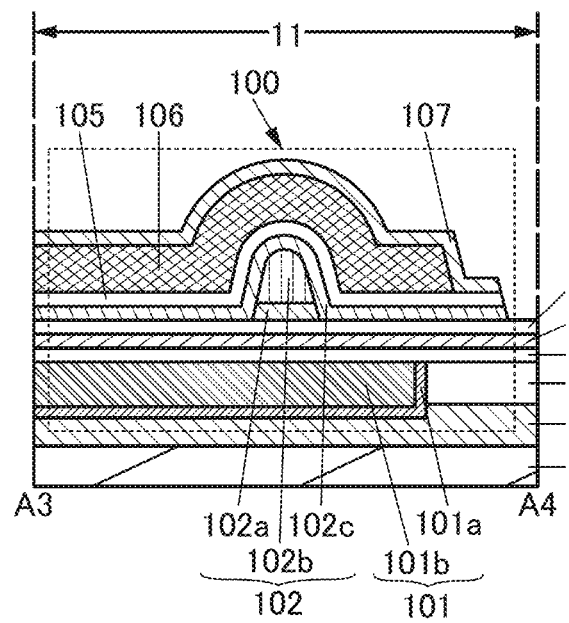
FIG. 19B2
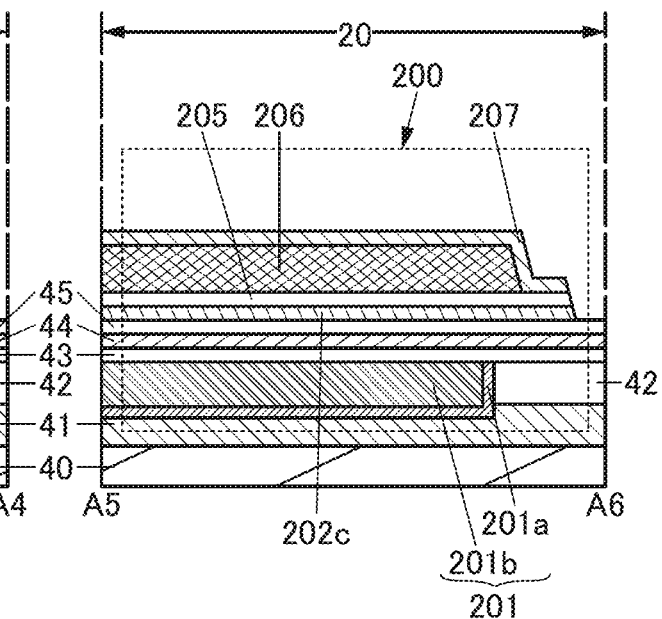

SEMICONDUCTOR DEVICE

CROSS REFERENCE TO RELATED APPLICATIONS

This application is a U.S. National Phase Application under 35 U.S.C. § 371 of International Application PCT/IB2018/053143, filed on May 7, 2018, which claims the benefit of a foreign priority application filed in Japan as Application No. 2017-098686, filed on May 18, 2017, both of which are incorporated by reference.

TECHNICAL FIELD

One embodiment of the present invention relates to a semiconductor device. Another embodiment of the present invention relates to a method for manufacturing a semiconductor device, a semiconductor wafer, a module, and an electronic device.

In this specification and the like, a semiconductor device generally means a device that can function by utilizing semiconductor characteristics. A semiconductor element such as a transistor, a semiconductor circuit, an integrated circuit, an arithmetic device, and a memory device are each one embodiment of a semiconductor device. It can be said that a display device (e.g., a liquid crystal display device and a light-emitting display device), a projection device, a lighting device, an electro-optical device, a power storage device, a memory device, a semiconductor circuit, an integrated circuit, an imaging device, an electronic device, and the like include a semiconductor device in some cases.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

BACKGROUND ART

In recent years, semiconductor devices have been developed to be used for a large scale integration (LSI), a central processing unit (CPU), a memory, and the like. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a material for a thin semiconductor film applicable to a transistor. As another material, a metal oxide material has been attracting attention.

A transistor including a metal oxide is known to have an extremely low leakage current in an off state. For example, a low-power CPU and the like utilizing the characteristics that a leakage current of the transistor including a metal oxide is low is disclosed (see Patent Document 1).

In addition, a technique in which metal oxides with different electron affinities (or conduction band minimum states) are stacked to increase the carrier mobility of a transistor is disclosed (see Patent Documents 2 and 3).

In recent years, demand for an integrated circuit in which transistors and the like are integrated with high density has risen with reductions in the size and weight of an electronic device. In addition, the productivity of a semiconductor device including an integrated circuit is required to be improved.

REFERENCE

Patent Document

[Patent Document 1] Japanese Published Patent Application No. 2012-257187
[Patent Document 2] Japanese Published Patent Application No. 2011-124360
[Patent Document 3] Japanese Published Patent Application No. 2011-138934

DISCLOSURE OF INVENTION

An object of one embodiment of the present invention is to provide a semiconductor device capable of retaining data for a long period. Another object of one embodiment of the present invention is to provide a semiconductor device with low power consumption. Another object of one embodiment of the present invention is to provide a semiconductor device with high productivity. Another object of one embodiment of the present invention is to provide a semiconductor device with high layout flexibility. Another object of one embodiment of the present invention is to provide a highly reliable semiconductor device. Another object of one embodiment of the present invention is to provide a semiconductor device whose operation can be easily controlled. Another object of one embodiment of the present invention is to provide a semiconductor device that can be miniaturized or highly integrated.

Note that the descriptions of these objects do not disturb the existence of other objects. In one embodiment of the present invention, there is no need to achieve all the objects. Objects other than the above objects will be apparent from and can be derived from the descriptions of the specification, the drawings, the claims, and the like.

One embodiment of the present invention is a semiconductor device including a first memory cell and a second memory cell. The first memory cell includes a first transistor. The second memory cell includes a second transistor. The threshold voltage of the second transistor is higher than the threshold voltage of the first transistor. The first transistor includes a first metal oxide. The second transistor includes a second metal oxide. Each of the first metal oxide and the second metal oxide includes a channel formation region. Each of the first metal oxide and the second metal oxide includes In, an element M (M is Al, Ga, Y, or Sn), and Zn. The atomic ratio of the element M to In in the second metal oxide is greater than the atomic ratio of the element M to In in the first metal oxide.

In the above embodiment, the electron affinity of the second metal oxide may be smaller than the electron affinity of the first metal oxide.

Another embodiment of the present invention is a semiconductor device including a first memory cell and a second memory cell. The first memory cell includes a first transistor. The second memory cell includes a second transistor. The first transistor includes a first insulator, a second insulator, a first semiconductor, a second semiconductor, and a first conductor. The second transistor includes the first insulator, a third insulator, a third semiconductor, a fourth semiconductor, a fifth semiconductor, and a second conductor. The first semiconductor is provided over the first insulator. The first semiconductor includes a first source region, a first drain region, and a first channel formation region sandwiched between the first source region and the first drain region. The second semiconductor is provided to include a region overlapping with the first channel formation region. The second insulator is provided over the second semiconductor. The first conductor is provided over the second insulator. The third semiconductor and the fourth semiconductor are provided over the first insulator. The third semiconductor includes a second source region. The fourth semiconductor includes a second drain region. The fifth semiconductor is provided to include a second channel formation region that is a region sandwiched between the second source region and the second drain region. The third insulator is provided over the fifth semiconductor. The second conductor is provided over the third insulator.

In the above embodiment, the first, third, and fourth semiconductors may have the same composition, and the second and fifth semiconductors may have the same composition.

In any of the above embodiments, the electron affinity of the fifth semiconductor may be smaller than the electron affinity of the first semiconductor.

In any of the above embodiments, the first to fifth semiconductors may include a metal oxide.

In the above embodiment, the metal oxide may include In, an element M (M is Al, Ga, Y, or Sn), and Zn.

In the above embodiment, the atomic ratio of the element M to In in the fifth semiconductor may be greater than the atomic ratio of the element M to In in the first semiconductor.

In any of the above embodiments, the threshold voltage of the second transistor may be higher than the threshold voltage of the first transistor.

In any of the above embodiments, the first transistor may include a third conductor, and the third conductor may be provided below the first conductor to include a region overlapping with the first channel formation region.

In any of the above embodiments, the semiconductor device may include a memory device. The first memory cells may be arranged in a matrix in the memory device.

In any of the above embodiments, the semiconductor device may include a first interface, the first interface may include the second memory cell, and the first interface may be electrically connected to the memory device.

In any of the above embodiments, the second memory cell may be included in an auxiliary memory device.

According to one embodiment of the present invention, a semiconductor device capable of retaining data for a long period can be provided. According to one embodiment of the present invention, a semiconductor device with low power consumption can be provided. According to one embodiment of the present invention, a semiconductor device with high productivity can be provided. According to one embodiment of the present invention, a semiconductor device with high layout flexibility can be provided. According to one embodiment of the present invention, a highly reliable semiconductor device can be provided. According to one embodiment of the present invention, a semiconductor device whose operation can be easily controlled can be provided. According to one embodiment of the present invention, a semiconductor device that can be miniaturized or highly integrated can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF DRAWINGS

FIGS. 5A, 5B1, and 5B2 are cross-sectional views illustrating structure examples of transistors.

FIGS. 7A, 7B1, and 7B2 are cross-sectional views illustrating structure examples of transistors.

FIGS. 8A, 8B1, and 8B2 are cross-sectional views illustrating structure examples of transistors.

FIGS. 9A, 9B1, and 9B2 are cross-sectional views illustrating structure examples of transistors.

FIGS. 10A, 10B1, and 10B2 are cross-sectional views illustrating structure examples of transistors.

FIGS. 12A, 12B1, and 12B2 are cross-sectional views illustrating an example of a method for manufacturing transistors.

FIGS. 13A, 13B1, and 13B2 are cross-sectional views illustrating an example of a method for manufacturing transistors.

FIGS. 14A, 14B1, and 14B2 are cross-sectional views illustrating an example of a method for manufacturing transistors.

FIGS. 15A, 15B1, and 15B2 are cross-sectional views illustrating an example of a method for manufacturing transistors.

FIGS. 16A, 16B1, and 16B2 are cross-sectional views illustrating an example of a method for manufacturing transistors.

FIGS. 17A, 17B1, and 17B2 are cross-sectional views illustrating an example of a method for manufacturing transistors.

FIGS. 18A, 18B1, and 18B2 are cross-sectional views illustrating an example of a method for manufacturing transistors.

FIGS. 19A, 19B1, and 19B2 are cross-sectional views illustrating an example of a method for manufacturing transistors.

BEST MODE FOR CARRYING OUT THE INVENTION

Figure 1:
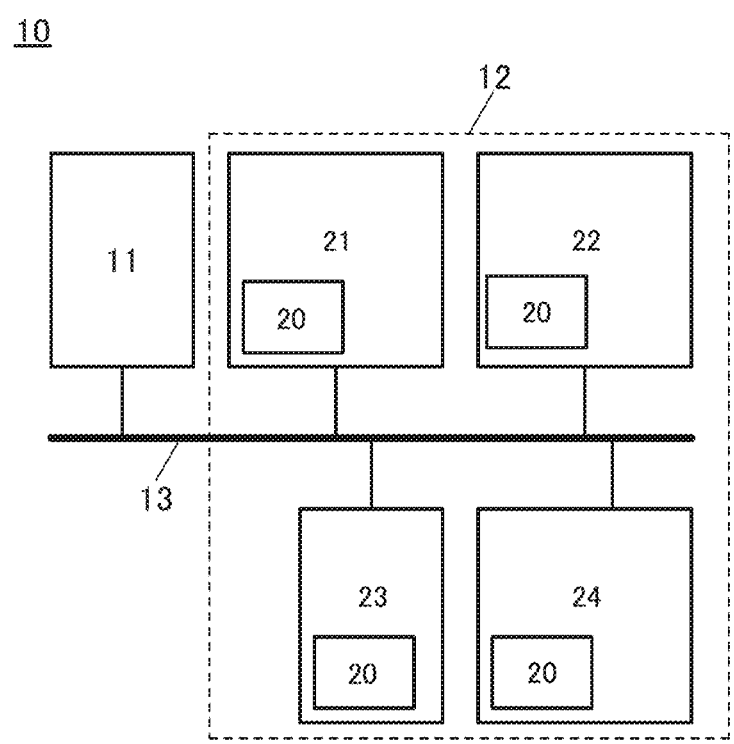
FIG. 1 is a block diagram illustrating a structure example of a semiconductor device.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof will not be repeated in some cases. Furthermore, the same hatching pattern is applied to portions having similar functions, and the portions are not especially denoted by reference numerals in some cases.

Especially in a top view (also referred to as a "plan view"), a perspective view, or the like, some components might not be illustrated for easy understanding of the invention. In addition, some hidden lines and the like might not be shown.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is turned on or off to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that allow a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

In this specification and the like, a transistor is an element having at least three terminals of a gate, a drain, and a source. The transistor has a channel region between the drain (a drain terminal, a drain region, or a drain electrode) and the source (a source terminal, a source region, or a source electrode), and current can flow between the source and the drain through the channel formation region. Note that in this specification and the like, a channel region refers to a region through which current mainly flows.

Furthermore, functions of a source and a drain might be switched when a transistor of opposite polarity is employed or a direction of current flow is changed in circuit operation, for example. Therefore, the terms "source" and "drain" can be switched in some cases in this specification and the like.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter referred to as an "effective channel width") is different from a channel width shown in a top view of a transistor (hereinafter referred to as an "apparent channel width") in some cases. For example, in a transistor having a gate electrode covering a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in a side surface of a semiconductor is increased. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Accordingly, in the case where the shape of a semiconductor is not known accurately, it is difficult to measure an effective channel width accurately.

Thus, in this specification and the like, an apparent channel width is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width. Note that a channel length, a channel width, an effective channel width, an apparent channel width, a surrounded channel width, and the like can be determined by analyzing a cross-sectional TEM image and the like.

Note that an impurity in a semiconductor refers to, for example, elements other than the main components of a semiconductor. For example, an element with a concentration lower than 0.1 atomic % can be regarded as an impurity. When an impurity is contained, the density of states (DOS) in a semiconductor may be increased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; there are hydrogen, lithium, sodium, silicon, boron, phosphorus, carbon, and nitrogen, for example. For an oxide semiconductor, water also serves as an impurity in some cases. For an oxide semiconductor, entry of impurities may lead to formation of oxygen vacancies, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

In this specification and the like, a silicon oxynitride film contains more oxygen than nitrogen. A silicon oxynitride film preferably contains, for example, oxygen, nitrogen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively. A silicon nitride oxide film contains more nitrogen than oxygen. A silicon nitride oxide film preferably contains nitrogen, oxygen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In addition, in this specification and the like, the term "insulator" can be replaced with the term "insulating film" or "insulating layer". Moreover, the term "conductor" can be replaced with the term "conductive film" or "conductive layer". Furthermore, the term "semiconductor" can be replaced with the term "semiconductor film" or "semiconductor layer."

Furthermore, unless otherwise specified, transistors described in this specification and the like are field effect transistors. Unless otherwise specified, transistors described in this specification and the like are n-channel transistors. Thus, unless otherwise specified, the threshold voltage (also referred to as "Vth") is higher than 0 V.

In this specification, trigonal and rhombohedral crystal systems are included in a hexagonal crystal system.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. In other words, an OS FET is a transistor including an oxide or an oxide semiconductor.

Embodiment 1

<Structure Example of Semiconductor Device>

An example of a semiconductor device 10 of one embodiment of the present invention is described below. Note that an integrated circuit such as a microprocessor can be used as the semiconductor device 10.

FIG. 1 is a block diagram illustrating a structure example of the semiconductor device 10. The semiconductor device 10 includes a memory device 11, a device group 12, and a transmission path 13. The memory device 11 has a function of storing, for example, a program processed by the semiconductor device 10. That is, the memory device 11 has a function of a main memory device.

A transistor included in the memory device 11 can be a transistor including a metal oxide in a semiconductor layer (hereinafter referred to as an OS transistor). The OS transistor has a characteristic of an extremely low off-state current as compared with a transistor including silicon in a semiconductor layer (hereinafter referred to as an Si transistor). Thus, the frequency of refresh operation can be reduced, so that power consumption can be suppressed. Note that the transistor included in the memory device 11 may be an Si transistor. In this case, the operation speed of the memory device 11 can be increased.

The device group 12 can include a variety of devices and the like. For example, as illustrated in FIG. 1, an arithmetic device 21, an auxiliary memory device 22, a power supply control device 23, and a clock signal generation device 24 can be included. Note that the device group 12 may include a device other than the devices illustrated in FIG. 1.

The transmission path 13 has a function of transmitting information. Information can be transmitted and received between the memory device 11, the arithmetic device 21, the auxiliary memory device 22, the power supply control device 23, and the clock signal generation device 24 through the transmission path 13.

The arithmetic device 21 has a function of performing an operation with use of information stored in the memory device 11. A program stored in the memory device 11 is executed by the arithmetic device 21. The arithmetic device 21 can include a CPU, a graphics processing unit (GPU), or the like.

The auxiliary memory device 22 has a function of retaining data for a longer period than the memory device 11. The auxiliary memory device 22 is a nonvolatile memory that keeps retaining data even when power is not supplied. As the auxiliary memory device 22, a hard disk drive (HDD), a solid state drive (SSD), or the like can be used. Alternatively, a memory device including a nonvolatile memory element, such as a flash memory, a phase change RAM (PRAM), a resistive RAM (ReRAM), or a ferroelectric RAM (FeRAM) can be used. Alternatively, a memory device including an OS transistor can be used.

The power supply control device 23 has a function of controlling power supply to the memory device 11 and power supply to the variety of devices included in the device group 12. The power supply control device 23 blocks power supply to a device that does not need to be operated, whereby power consumption of the semiconductor device 10 can be reduced.

The clock signal generation device 24 has a function of generating a clock signal. The generated clock signal can be supplied to the memory device 11 and the variety of devices included in the device group 12. The memory device 11 and the variety of devices included in the device group 12 can be operated in accordance with the supplied clock signal.

Each of the variety of devices included in the device group 12 includes a memory unit 20. Although a structure in which the arithmetic device 21, the auxiliary memory device 22, the power supply control device 23, and the clock signal generation device 24 each include the memory unit 20 is illustrated in FIG. 1, a different device which is not illustrated may include the memory unit 20. The memory unit 20 has a function of retaining data including information on setting performed on the variety of devices included in the device group 12 before shipment, such as an assignment of redundant bits and a resistance value that is in accordance with a chip. Furthermore, the memory unit 20 has a function of retaining data including information on setting that is performed after shipment and changed at a low frequency by a user or the like, such as setting of a timing and setting of an operation mode. Moreover, the memory unit 20 has a function of retaining a program necessary for the operation of the device including the memory unit 20. Although described later in detail, an OS transistor can be used as the transistor included in the memory unit 20.

The capacity of the memory unit 20 is preferably small in order to suppress an increase in area occupied by the device including the memory unit 20. Specifically, the capacity of the memory unit 20 is preferably smaller than that of the memory device 11. Data that is updated at a low frequency or not updated is retained in the memory unit 20, and thus the data retention period is preferably long. Specifically, the data retention period in the memory unit 20 is preferably longer than that in the memory device 11, further preferably longer than or equal to that in the auxiliary memory device 22. Even in the case where power is not supplied to the memory unit 20, for example, the memory unit 20 preferably has a function of keeping retaining data for a month or longer, further preferably for a year or longer, still further preferably for five years or longer, yet still further preferably for 10 years or longer.

The capacity of the memory device 11 is larger than that of the memory unit 20. Accordingly, the area occupied by one memory cell included in the memory device 11 is preferably smaller than that in the memory unit 20. Furthermore, the frequency of access to the memory device 11 and the frequency of updating data retained in the memory device 11 are higher than the frequency of access to the memory unit 20 and the frequency of updating data retained in the memory unit 20. Accordingly, the speed of writing data to the memory device 11 and the speed of reading data from the memory device 11 are preferably higher than the speed of writing data to the memory unit 20 and the speed of reading data from the memory unit 20. As described above, the data retention period in the memory unit 20 is preferably longer than that in the memory device 11.

Accordingly, the structure of the memory cell included in the memory device 11 is preferably different from that of the memory cell included in the memory unit 20. For example, a structure is preferably employed in which the threshold voltage of a transistor provided in the memory cell included in the memory unit 20 is higher than that of a transistor provided in the memory cell included in the memory device 11. In the case where a structure in which the both memory cells include OS transistors is employed, for example, the structure of the OS transistor provided in the memory cell included in the memory device 11 is preferably different from the structure of the OS transistor provided in the memory cell included in the memory unit 20. In this case, the memory device 11 which has high memory capacity and is operated at a high speed and the memory unit 20 which has a long data retention period can be separately formed while the number of steps is prevented from being significantly increased. Specific structure examples of the OS transistors included in the both memory cells are described later.

Figure 2:
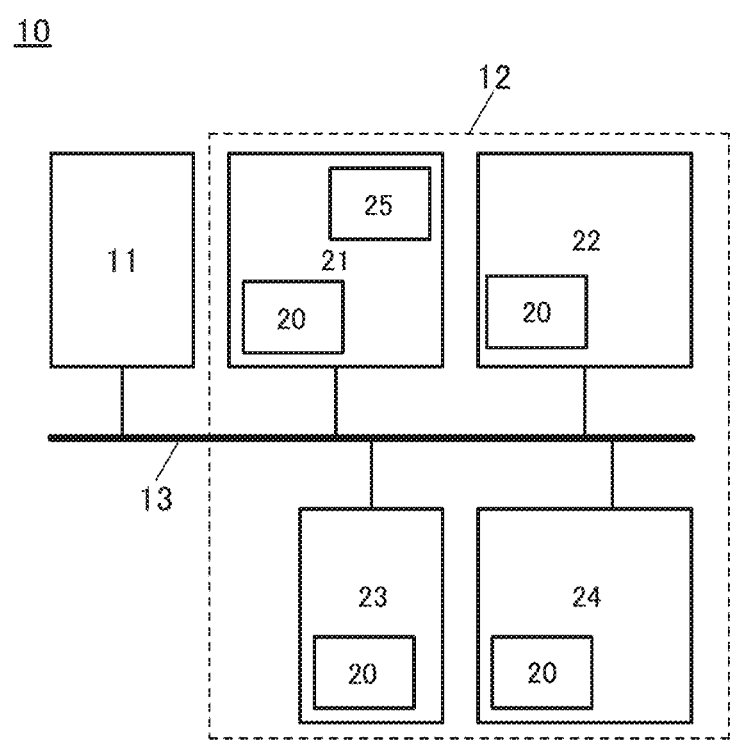
FIG. 2 is a block diagram illustrating a structure example of a semiconductor device.

FIG. 2 is a block diagram illustrating a modification example of the semiconductor device 10 with the structure illustrated in FIG. 1. The semiconductor device 10 illustrated in FIG. 2 is different from the semiconductor device 10 with the structure illustrated in FIG. 1 in that the arithmetic device 21 includes a memory unit 25. The memory unit 25 can be a cache memory, a scratchpad memory, or the like. The operation speed of the memory unit 25 is preferably higher than that of the memory unit 20. Accordingly, the memory unit 25 preferably includes an Si transistor. Alternatively, the memory unit 25 preferably includes an OS transistor whose threshold voltage is lower than that of an OS transistor included in the memory unit 20, such as an OS transistor whose threshold voltage is substantially the same as that of the OS transistor included in the memory device 11.

Figure 3:
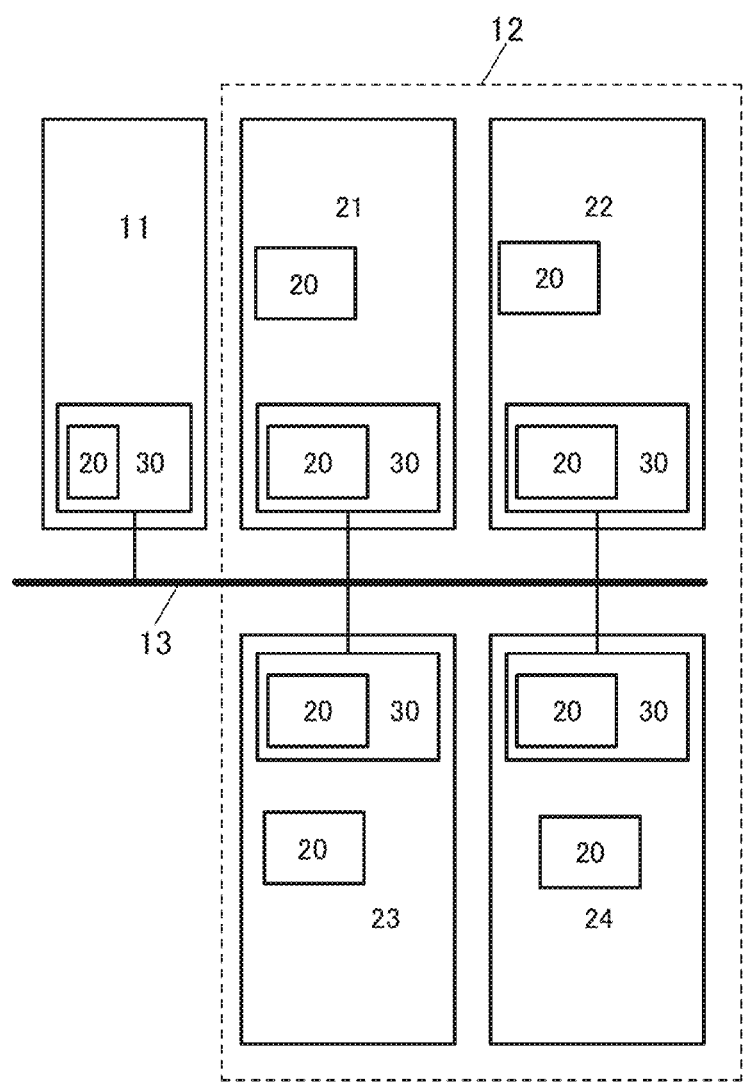
FIG. 3 is a block diagram illustrating a structure example of a semiconductor device.

FIG. 3 is a block diagram illustrating a modification example of the semiconductor device 10 with the structure illustrated in FIG. 1. The semiconductor device 10 illustrated in FIG. 3 is different from the semiconductor device 10 with the structure illustrated in FIG. 1 in that the variety of devices included in the semiconductor device 10 each include an interface 30. The interface 30 is electrically connected to the transmission path 13. The interface 30 has a function of transmitting and receiving information between the variety of devices and the transmission path 13. The interface 30 includes the memory unit 20. The memory unit 20 retains data including information on setting performed before shipment and information on setting which is performed after shipment and changed at a low frequency by the user or the like. Note that the interface 30 does not necessarily include the memory unit 20.

Figure 4:
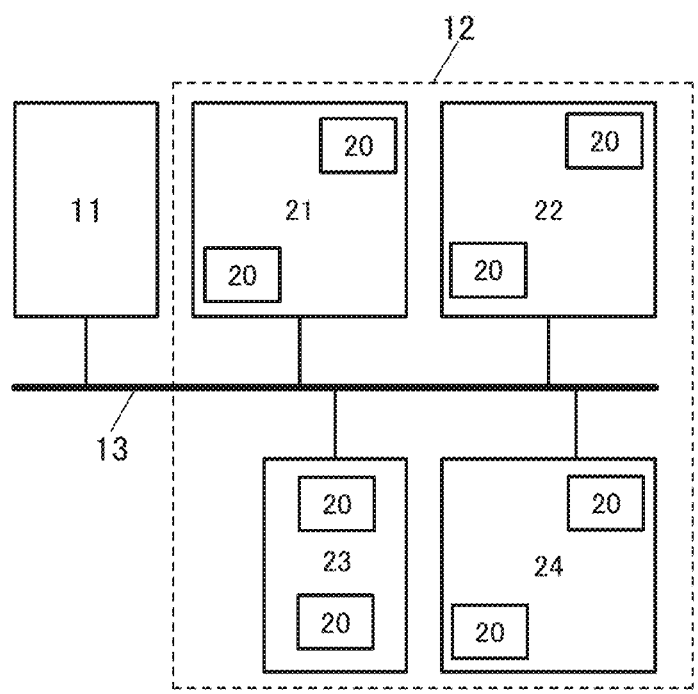
FIG. 4 is a block diagram illustrating a structure example of a semiconductor device.

FIG. 4 is a block diagram illustrating a modification example of the semiconductor device 10 with the structure illustrated in FIG. 1. The semiconductor device 10 with a structure illustrated in FIG. 4 is different from the semiconductor device 10 with the structure illustrated in FIG. 1 in that each of the arithmetic device 21, the auxiliary memory device 22, the power supply control device 23, and the clock signal generation device 24 includes the plurality of memory units 20. As illustrated in FIG. 4, the plurality of memory units 20 can be provided so as to be dispersed in the variety of devices. Thus, supposing that the capacities of the memory units 20 included in one device are the same, the flexibility in the layout for leading of a wiring can be increased, for example, as compared with the case where one device includes one memory unit 20.

Note that in particular, in the semiconductor device 10 with the structure illustrated in FIG. 4, the memory unit 20 can be provided in a register provided in each of the variety of devices included in the device group 12, for example. The register includes much space not provided with an element and the like, and accordingly, the memory unit 20 is provided in the space, whereby the area occupied by the device group 12 can be prevented from being increased even in the case where the capacity of the memory unit 20 is increased.

The structures of the semiconductor device 10 which are illustrated in FIG. 1, FIG. 2, FIG. 3, and FIG. 4 can be combined as appropriate. For example, the arithmetic device 21 provided in the semiconductor device 10 with the structure illustrated in FIG. 4 may include the memory unit 25 illustrated in FIG. 2.

<Structure Example of Transistor>

Structure examples of the transistor included in the memory device 11 and the transistor included in the memory unit 20 are described below.

Figure 6:
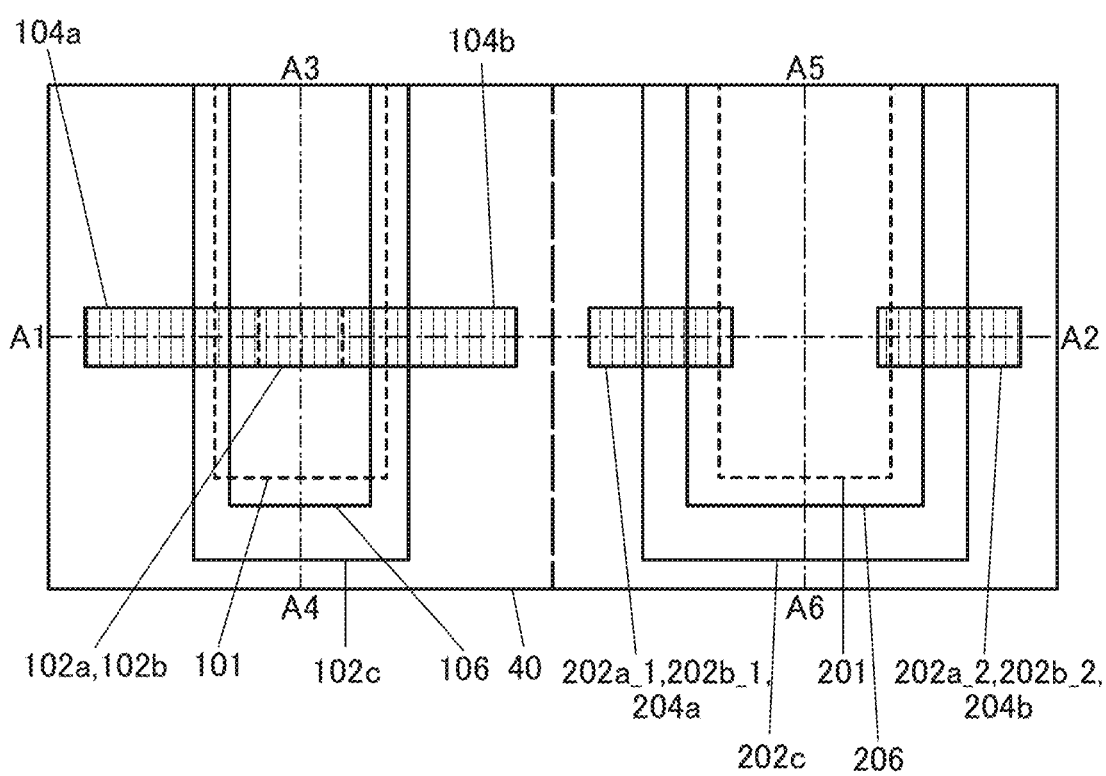
FIG. 6 is a top view illustrating structure examples of transistors.

FIGS. 5A, 5B1, and 5B2 are cross-sectional views illustrating a transistor 100 included in the memory device 11 and a transistor 200 included in the memory unit 20. FIG. 6 is a top view illustrating the transistor 100 and the transistor 200. FIG. 5A is a cross-sectional view taken along dashed-dotted line A1-A2 in FIG. 6, which corresponds to a cross-sectional view in the channel length direction of the transistor 100. FIG. 5B1 is a cross-sectional view taken along dashed-dotted line A3-A4 in FIG. 6, which corresponds to a cross-sectional view in the channel width direction of the transistor 100. FIG. 5B2 is a cross-sectional view taken along dashed-dotted line A5-A6 in FIG. 6, which corresponds to a cross-sectional view in the channel width direction of the transistor 200. Note that in the top view in FIG. 6, some components are not illustrated for simplification of the drawings.

Note that a structure in which some of the memory units 20 include the transistors 100 may be employed. As described above, a structure in which the memory device 11 includes an Si transistor may be employed. A structure in which the memory unit 25 illustrated in FIG. 2 includes the transistor 100 may be employed.

The transistors 100 and 200 formed over a substrate (not illustrated) have different structures. For example, the threshold voltage of the transistor 200 is made higher than that of the transistor 100.

The structure of each of the transistor 100 and the transistor 200 is described below with reference to FIGS. 5A, 5B1, and 5B2, and FIG. 6.

[Transistor 100]

As illustrated in FIGS. 5A and 5B1, the transistor 100 includes an insulator 40 over the substrate (not illustrated); an insulator 41 over the insulator 40; an insulator 42 over the insulator 41; a conductor 101 over the insulator 41 so as to be embedded in the insulator 42; an insulator 43 over the insulator 42 and the conductor 101; an insulator 44 over the insulator 43; an insulator 45 over the insulator 44; a metal oxide 102*a* over the insulator 45; a metal oxide 102*b* over the metal oxide 102*a*; conductors 104*a* and 104*b* over the metal oxide 102*b*; a metal oxide 102*c* over the metal oxide 102*b* and the conductors 104*a* and 104*b*; an insulator 105 over the metal oxide 102*c*; a conductor 106 over the insulator 105; and an insulator 107 over the conductor 106 and the insulator 105.

The metal oxides 102*a*, 102*b*, and 102*c* are collectively referred to as a metal oxide 102 below in some cases. Although the metal oxides 102*a*, 102*b*, and 102*c* are stacked in the transistor 100, one embodiment of the present invention is not limited to this structure. For example, only the metal oxides 102*b* and 102*c* may be provided.

The conductor 101 is preferably provided to include a region overlapping with the metal oxide 102 and the conductor 106. In the conductor 101, a conductor 101*a* is formed in contact with the insulator 41 and an inner wall of an opening in the insulator 42, and a conductor 101*b* is formed on the inner side. Here, the top surfaces of the conductors 101*a* and 101*b* can have substantially the same level as the top surface of the insulator 42. Although the conductor 101*a* and the conductor 101*b* are stacked in the transistor 100, one embodiment of the present invention is not limited to this structure. For example, only the conductor 101*b* may be provided.

The conductor 106 can function as a top gate, and the conductor 101 can function as a back gate. By changing the potential of the back gate, the threshold voltage of the transistor 100 can be changed. For example, by application of a negative potential to the back gate, the threshold voltage of the transistor 100 can be increased, and the off-state current thereof (a current in the case where the transistor is in an off state) can be reduced. On the other hand, by application of a positive potential to the back gate, the threshold voltage of the transistor 100 can be reduced, and the on-state current thereof (a current in the case where the transistor is in an on state) can be increased. When the potential applied to the conductor 101 included in the transistor 100 is variable as described above, the on-state current of the transistor 100 can be increased, and the off-state current thereof can be reduced.

Note that the potential applied to the conductor 101 may be fixed at a positive potential or a negative potential. The conductor 101 and the conductor 106 may be electrically connected to each other. In these cases, the potential applied to the conductor 101 can be controlled easily.

Here, it is preferable to use a conductive material that has a function of inhibiting the passage of impurities such as water and hydrogen (that is relatively impermeable to such impurities) for the conductor 101*a*. For example, tantalum, tantalum nitride, ruthenium, ruthenium oxide, or the like is preferably used, and a single layer or stacked layers may be used. Accordingly, diffusion of impurities such as water or hydrogen from a layer under the insulator 41 into an upper layer through the conductor 101 can be inhibited. Note that it is preferable that the conductor 101*a* have a function of inhibiting the passage of at least one of impurities such as a hydrogen atom, a hydrogen molecule, a water molecule, an oxygen atom, an oxygen molecule, a nitrogen atom, a nitrogen molecule, a nitrogen oxide molecule (e.g., $N_2O$, NO, or $NO_2$), and a copper atom, and oxygen (e.g., an oxygen atom or an oxygen molecule). Furthermore, in the following description, the same applies to a conductive material having a function of inhibiting the passage of impurities. When the conductor 101*a* has a function of inhibiting the passage of oxygen, the conductivity of the conductor 101*b* can be prevented from being lowered because of oxidation.

The conductor 101*b* is preferably formed using a conductive material including tungsten, copper, or aluminum as its main component. Although not illustrated, the conductor 101*b* may have a stacked-layer structure, and for example, stacked layers of titanium, titanium nitride, and the above-described conductive material may be formed.

The insulator 41 and the insulator 42 can each function as a barrier insulating film for preventing impurities such as water or hydrogen from entering the transistor from a lower layer. The insulator 41 and the insulator 42 are preferably formed with an insulating material having a function of inhibiting the passage of impurities such as water or hydrogen. For example, it is preferable that the insulator 41 be formed using aluminum oxide and the insulator 42 be formed using silicon nitride. This can suppress diffusion of impurities such as hydrogen and water to a layer positioned over the insulator 41 and the insulator 42. Note that it is preferable that the insulator 41 and the insulator 42 have a function of inhibiting the passage of at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Furthermore, in the following description, the same applies to an insulating material having a function of inhibiting the passage of impurities.

Furthermore, the insulator 41 and the insulator 42 are preferably formed using an insulating material that has a function of inhibiting the passage of oxygen (e.g., an oxygen atom or an oxygen molecule). With this material, oxygen contained in the insulator 45 or the like can be prevented from being diffused into lower layers.

The insulator 44 is preferably formed using an insulating material that has a function of inhibiting the passage of oxygen and impurities such as water or hydrogen, and is preferably formed using aluminum oxide or hafnium oxide, for example. This can suppress diffusion of impurities such as hydrogen or water from a layer positioned below the insulator 44 to a layer positioned above the insulator 44. Furthermore, oxygen contained in the insulator 45 or the like can be prevented from being diffused into lower layers.

Furthermore, the concentration of impurities such as water, hydrogen, or nitrogen oxide in the insulator 45 is preferably lowered. The amount of hydrogen released from the insulator 45 that is converted into hydrogen molecules per unit area of the insulator 45 is less than or equal to $2\times10^{15}$ molecules/cm$^2$, preferably less than or equal to $1\times10^{15}$ molecules/cm$^2$, further preferably less than or equal to $5\times10^{14}$ molecules/cm$^2$ in thermal desorption spectroscopy (TDS) analysis in a film-surface temperature range of 50° C. to 500° C., for example. The insulator 45 is preferably formed using an insulator from which oxygen is released by heating.

The insulator 105 can function as a first gate insulating film. The insulators 43, 44, and 45 can function as second gate insulating films. Although the transistor 100 has a structure in which the insulators 43, 44, and 45 are stacked, one embodiment of the present invention is not limited to this structure. For example, a structure in which any two selected from the insulators 43, 44, and 45 are stacked or a structure in which any one selected from the insulators 43, 44, and 45 is used may be employed.

The metal oxide 102 is preferably formed using a metal oxide that functions as an oxide semiconductor (hereinafter, the metal oxide is referred to as an oxide semiconductor in some cases). The metal oxide preferably has an energy gap of 2 eV or more, preferably 2.5 eV or more. With the use of a metal oxide having such a wide energy gap, the off-state current of the transistor can be reduced.

A transistor formed using an oxide semiconductor has an extremely low leakage current in an off state; thus, a semiconductor device with low power consumption can be provided. An oxide semiconductor can be formed by a sputtering method or the like and thus can be used in a transistor included in a highly integrated semiconductor device.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide that contains indium, an element M, and zinc is considered. The element M is aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M.

Note that in this specification and the like, a metal oxide including nitrogen is also called a metal oxide in some cases.

Here, the atomic ratio of the element M to constituent elements in the metal oxide used as the metal oxide 102*a* is preferably greater than that in the metal oxide used as the metal oxide 102*b*. Moreover, the atomic ratio of the element M to In in the metal oxide used as the metal oxide 102*a* is preferably greater than that in the metal oxide used as the metal oxide 102*b*. Moreover, the atomic ratio of In to the element M in the metal oxide used as the metal oxide 102*b* is preferably greater than that in the metal oxide used as the metal oxide 102*a*. Note that as the metal oxide 102*c*, the metal oxide that can be used as the metal oxide 102*a* can be used.

By using the above metal oxide as the metal oxide 102a and the metal oxide 102c, it is preferable that each of the energies of the conduction band minimums of the metal oxide 102a and the metal oxide 102c be higher than the energy of the conduction band minimum of the region of the metal oxide 102b where the energy of the conduction band minimum is low. In other words, the electron affinity of each of the metal oxide 102a and the metal oxide 102c is preferably smaller than the electron affinity of the region of the metal oxide 102b where the energy of the conduction band minimum is low.

Here, the energy level of the conduction band minimum gradually changes in the metal oxides 102a, 102b, and 102c. In other words, the energy level of the conduction band minimum is continuously varied or continuously connected. To obtain such an energy level, the densities of defect states in mixed layers formed at an interface between the metal oxides 102a and 102b and an interface between the metal oxides 102b and 102c are preferably made low.

Specifically, when the metal oxides 102a and 102b contain the same element (as a main component) in addition to oxygen and the metal oxides 102b and 102c contain the same element (as a main component) in addition to oxygen, mixed layers each with a low density of defect states can be formed. For example, in the case where the metal oxide 102b is an In—Ga—Zn oxide, it is preferable to use an In—Ga—Zn oxide, a Ga—Zn oxide, gallium oxide, or the like as each of the metal oxides 102a and 102c.

At this time, a narrow-gap portion formed in the metal oxide 102b serves as a main carrier path. Since the densities of defect states at the interface between the metal oxides 102a and 102b and the interface between the metal oxides 102b and 102c can be made low, the influence of interface scattering on carrier conduction is small, and a high on-state current can be obtained.

The conductor 104a functions as a source electrode of the transistor 100. The conductor 104b functions as a drain electrode of the transistor 100. Any of metals such as aluminum, titanium, chromium, nickel, copper, yttrium, zirconium, molybdenum, silver, tantalum, and tungsten, or an alloy containing any of the metals as its main component can be used for each of the conductors 104a and 104b. Note that each of the conductors 104a and 104b is not limited to a single layer, a structure can be employed in which two layers or three or more layers are stacked. For example, a structure can be employed in which two layers or three or more layers including any of the metals or an alloy containing the metal as its main component are stacked.

The insulator 105 is preferably provided in contact with the top surface of the metal oxide 102c. The insulator 105 is preferably formed using an insulator from which oxygen is released by heating. When the insulator 105 is formed in contact with the top surface of the metal oxide 102c, oxygen can be supplied to a channel formation region in the metal oxide 102b effectively. Furthermore, the concentration of impurities such as water and hydrogen in the insulator 105 is preferably lowered as in the insulator 45. The thickness of the insulator 105 is preferably more than or equal to 1 nm and less than or equal to 20 nm, and may be approximately 1 nm, for example.

Note that in the metal oxide 102, a region overlapping with the conductor 104a functions as a source region, and a region overlapping with the conductor 104b functions as a drain region. Moreover, a region which is neither the source region nor the drain region and overlaps with the conductor 106 functions as a channel formation region. That is, the channel formation region is sandwiched between the source region and the drain region.

The insulator 105 preferably contains oxygen. The amount of oxygen released from the insulator 412, which is converted into oxygen molecules per unit area of the insulator 105, is more than or equal to $1 \times 10^{14}$ molecules/cm$^2$, preferably more than or equal to $2 \times 10^{14}$ molecules/cm$^2$, further preferably more than or equal to $4 \times 10^{14}$ molecules/cm$^2$ in thermal desorption spectroscopy (TDS) in the range of the surface temperatures from 100° C. to 700° C. inclusive or from 100° C. to 500° C. inclusive, for example.

The conductor 106 can be formed using a metal such as tungsten, for example. Here, the conductor 106 functioning as a gate electrode is provided to cover the top surface, which is in the vicinity of the channel formation region and the side surface, which is in the channel width direction, of the metal oxide 102b, with the insulator 105 interposed therebetween. Thus, the electric field of the conductor 106 functioning as a gate electrode can electrically surround the top surface, which is in the vicinity of the channel formation region and the side surface, which is in the channel width direction, of the metal oxide 102b. The structure of the transistor in which the channel formation region is electrically surrounded by the electric field of the conductor 106 is referred to as a surrounded channel (s-channel) structure. Thus, a channel can be formed in the top surface and the side surface in the channel width direction of the metal oxide 102b, which are in the vicinity of the channel formation region; therefore, a large amount of current can flow between the source and the drain, and an on-state current can be increased. Moreover, since the top surface and the side surface in the channel width direction of the metal oxide 102b, which are in the vicinity of the channel formation region are surrounded by the electric field of the conductor 106, an off-state current can be reduced.

The insulator 107 is provided to cover the conductor 106. The insulator 107 functions as a barrier film that prevents oxidation of the conductor 106. As the insulator 107, aluminum oxide or the like can be used.

An insulator 46 is preferably provided over the insulator 45, the conductors 104a and 104b, and the insulator 107. The concentration of impurities such as water or hydrogen in the insulator 46 is preferably lowered as in the insulator 45 and the like. The insulator 46 functions as an interlayer insulating film and has a flat top surface. When the insulator 107 is provided to cover the conductor 106, impurities can be prevented from entering the conductor 106 from the insulator 46. As the insulator 46, aluminum oxide or the like can be used.

An insulator 47 is preferably provided over the insulator 46. The insulator 47 has a function as a barrier film that inhibits the passage of oxygen, hydrogen, water, and the like. By provision of the insulator 47, impurities can be prevented from entering the transistor 100 from a layer over the layers where the transistor 100 is provided. As the insulator 47, aluminum oxide or the like can be used.

[Transistor 200]

Next, the transistor 200 which has electrical characteristics different from those of the transistor 100 is described. The transistor 200 can be formed in parallel with the transistor 100, and is preferably formed in the same layer as the transistor 100. By being formed in parallel with the transistor 100, the transistor 200 can be formed without increasing a manufacturing step. Thus, the semiconductor device 10 can be manufactured with improved productivity.

As illustrated in FIGS. 5A and 5B2, the transistor 200 includes the insulator 40 over the substrate (not illustrated); the insulator 41 over the insulator 40; the insulator 42 over the insulator 41; a conductor 201 over the insulator 41 so as to be embedded in the insulator 42; the insulator 43 over the insulator 42 and the conductor 201; the insulator 44 over the insulator 43; the insulator 45 over the insulator 44; metal oxides 202a_1 and 202a_2 over the insulator 45; a metal oxide 202b_1 over the metal oxide 202a_1; a metal oxide 202b_2 over the metal oxide 202a_2; a conductor 204a over the metal oxide 202b_1; a conductor 204b over the metal oxide 202b_2; a metal oxide 202c over the insulator 45 and the conductors 204a and 204b; an insulator 205 over the metal oxide 202c; a conductor 206 over the insulator 205; and an insulator 207 over the conductor 206 and the insulator 205.

The metal oxides 202a_1, 202a_2, 202b_1, 202b_2, and 202c are collectively referred to as a metal oxide 202 below in some cases. Note that although a structure in which the metal oxides 202a_1 and 202b_1 are stacked and the metal oxides 202a_2 and 202b_2 are stacked is employed in the transistor 200, one embodiment of the present invention is not limited to this structure. For example, a structure in which the metal oxides 202a_1 and 202a_2 are omitted or a structure in which the metal oxides 202b_1 and 202b_2 are omitted may be employed.

Here, the conductors, the insulators, and the metal oxides included in the transistor 200 can be formed through the same steps as those for the conductors, the insulators, and the metal oxides which are included in the transistor 100 provided in the same layer as the transistor 200. Accordingly, the conductor 101a, the conductor 101b, the metal oxide 102, the conductors 104a and 104b, the insulator 105, the conductor 106, and the insulator 107 correspond to the conductor 201a, the conductor 201b, the metal oxide 202, the conductors 204a and 204b, the insulator 205, the conductor 206, and the insulator 207, respectively. Therefore, the conductors, the insulators, and the metal oxides included in the transistor 200 can be formed with the same materials as those for the transistor 100, and the description of the transistor 100 can be referred to for the conductors, the insulators, and the metal oxides in the transistor 200.

The metal oxide 202a_1, the metal oxide 202b_1, and the conductor 204a are provided to face the metal oxide 202a_2, the metal oxide 202b_2, and the conductor 204b with the conductor 201, the metal oxide 202c, the insulator 205, the conductor 206, and the insulator 207 interposed therebetween.

The conductor 204a functions as a source electrode of the transistor 200. The conductor 204b functions as a drain electrode of the transistor 200. Accordingly, the metal oxides 202a_1 and 202b_1 each of which includes a region overlapping with the conductor 204a have a region serving as a source region of the transistor 200. Furthermore, the metal oxides 202a_2 and 202b_2 each of which includes a region overlapping with the conductor 204b have a region serving as a drain region of the transistor 200.

A transistor including the metal oxide 202c and a transistor including the metal oxide 102b preferably have different electrical characteristics. For this reason, for example, the metal oxide 202c and the metal oxide 102b are preferably different in any of a material of the metal oxide, the content ratio of elements in the metal oxide, the thickness of the metal oxide, and the width and the length of a channel formation region formed in the metal oxide.

In the case where an In-M-Zn (M is Al, Ga, Y, Sn, or the like) oxide is used as each of the metal oxide 202c and the metal oxide 102b, for example, the atomic proportion of the element M in the metal oxide 202c can be larger than that in the metal oxide 102b. In addition, the atomic ratio of the element M to In in the metal oxide 202c can be larger than that in the metal oxide 102b. Thus, the threshold voltage of the transistor 200 can be higher than that of the transistor 100, and the off-state current of the transistor 200 can be smaller than that of the transistor 100.

In the metal oxide 202c serving as a channel formation region of the transistor 200, oxygen vacancies and impurities such as water or hydrogen are preferably reduced as in the metal oxide 102c of the transistor 100, or the like. Thus, the threshold voltage of the transistor 200 can be high and the off-state current can be reduced as compared with the case where the impurities are not reduced.

In the transistor 200, the channel formation region is formed in the metal oxide 202c, whereas in the transistor 100, the channel formation region is formed in the metal oxides 102a, 102b, and 102c. Accordingly, the thickness of the metal oxide 202 in the channel formation region in the transistor 200 can be smaller than that of the metal oxide 102 in the channel formation region in the transistor 100. Therefore, the threshold voltage of the transistor 200 can be higher than that of the transistor 100 in which a negative potential is not applied to the back gate.

Note that it is preferable to apply the same potential to the conductor 206 serving as the top gate of the transistor 200 and the conductor 201 serving as the back gate of the transistor 200. For example, it is preferable that the conductors 206 and 201 be electrically connected to each other. In the case of the structure where the same potential is applied to the conductors 206 and 201, when the transistor 200 is in an on state by application of a positive potential to the top gate of the transistor 200, a positive potential is also applied to the back gate of the transistor 200, so that the on-state current of the transistor 200 can be increased. Note that the potential applied to the conductor 206 and the potential applied to the conductor 201 may be separately controlled. Alternatively, the potential applied to the conductor 201 may be fixed at a negative potential or a positive potential, for example.

[Modification Examples of the Transistor 100 and the Transistor 200]

FIGS. 7A, 7B1, and 7B2 are cross-sectional views illustrating the transistor 100 included in the memory device 11 and the transistor 200 included in the memory unit 20, and illustrate a modification example of FIGS. 5A, 5B1, and 5B2. FIG. 7A, FIG. 7B1, and FIG. 7B2 correspond to FIG. 5A, FIG. 5B1, and FIG. 5B2, respectively.

The structure illustrated in FIGS. 7A, 7B1, and 7B2 is different from that in FIGS. 5A, 5B1, and 5B2 in that the transistor 200 does not include the conductor 201. When the transistor 200 has the structure illustrated in FIGS. 7A, 7B1, and 7B2, the operation of the transistor 200 can be controlled easily. Moreover, a lead wiring electrically connected to the conductor 201 can be omitted, so that the layout flexibility of the semiconductor device 10 can be increased.

FIGS. 8A, 8B1, and 8B2 are cross-sectional views illustrating the transistor 100 included in the memory device 11 and the transistor 200 included in the memory unit 20, and illustrate a modification example of FIGS. 5A, 5B1, and 5B2. FIG. 8A, FIG. 8B1, and FIG. 8B2 correspond to FIG. 5A, FIG. 5B1, and FIG. 5B2, respectively.

In the transistor 200 with the structure illustrated in FIGS. 5A, 5B1, and 5B2, the metal oxide 202c is not in contact with a top surface of the metal oxide 202b_1 and a top surface of the metal oxide 202b_2. In contrast, in the transistor 200 with the structure illustrated in FIGS. 8A, 8B1, and 8B2, the metal oxide 202c is in contact with the top surface of the metal oxide 202b_1 and the top surface of the metal oxide 202b_2. When the transistor 200 has the structure illustrated in FIGS. 8A, 8B1, and 8B2, the contact area between the metal oxide 202c and the metal oxide 202b_1 and the contact area between the metal oxide 202c and the metal oxide 202b_2 can be increased. Thus, a variation in electronic characteristics of the transistor 200, such as a threshold voltage, can be reduced. In addition, the subthreshold swing value (S value) of the transistor 200 can be made small. Accordingly, the reliability of the semiconductor device 10 can be improved.

FIGS. 9A, 9B1, and 9B2 are cross-sectional views illustrating the transistor 100 included in the memory device 11 and the transistor 200 included in the memory unit 20, and illustrate a modification example in FIGS. 5A, 5B1, and 5B2. FIG. 9A, FIG. 9B1, and FIG. 9B2 correspond to FIG. 5A, FIG. 5B1, and FIG. 5B2, respectively. The transistor 100 with the structure illustrated in FIG. 9A and FIG. 9B1 includes the insulator 40 over the substrate (not illustrated); the insulator 41 over the insulator 40; the insulator 42 over the insulator 41; the conductor 101 over the insulator 41 so as to be embedded in the insulator 42; the insulator 43 over the insulator 42 and the conductor 101; the insulator 44 over the insulator 43; the insulator 45 over the insulator 44; the metal oxide 102a over the insulator 45; the metal oxide 102b over the metal oxide 102a; the metal oxide 102c over the metal oxide 102b; the insulator 105 over the metal oxide 102c; the conductor 106 over the insulator 105; an insulator 108 over the conductor 106; an insulator 109 in contact with a top surface of the metal oxide 102b and side surfaces of the metal oxide 102c, the insulator 105, the conductor 106, and the insulator 108; and the insulator 107 in contact with the insulator 45, the metal oxide 102a, the metal oxide 102b, the insulator 108, and the insulator 109. Here, the insulator 107 is preferably provided to cover the metal oxide 102, the insulator 105, the conductor 106, the insulator 108, and the insulator 109.

Note that the transistor 100 may have a structure without the metal oxide 102c. In this case, the insulator 105 is provided in contact with the metal oxide 102b.

The insulator 108 is preferably formed by an atomic layer deposition (ALD) method. In that case, the insulator 108 can be formed with a thickness of approximately 1 nm to 20 nm inclusive, preferably approximately 5 nm to 10 nm inclusive. Here, the insulator 108 is preferably formed using an insulating material having a function of inhibiting the passage of impurities such as water or hydrogen and oxygen, and for example, is preferably formed using aluminum oxide or hafnium oxide.

A top surface of the insulator 109 is preferably substantially aligned with the top surface of the insulator 108. The insulator 109 is preferably formed by an ALD method, in which case the thickness of the insulator 109 can be approximately 1 nm to 20 nm inclusive, preferably approximately 1 nm to 3 nm inclusive, for example, 1 nm.

Here, like the insulator 108, the insulator 109 is preferably formed using an insulating material having a function of inhibiting the passage of impurities such as water or hydrogen and oxygen, and for example, is preferably formed using aluminum oxide or hafnium oxide. In this manner, oxygen in the insulator 105 can be prevented from being diffused outward. Furthermore, entry of impurities such as hydrogen or water to the metal oxide 102 from an end portion or the like of the insulator 105 can be prevented.

When the insulators 108 and 109 are provided as described above, the insulators having a function of inhibiting the passage of oxygen and impurities such as water or hydrogen can cover the top and side surfaces of the conductor 106 and the side surface of the insulator 105. This can prevent entry of impurities such as water or hydrogen to the metal oxide 102 through the conductor 106 and the insulator 105. As described above, the insulator 108 functions as a top barrier that protects the top surface of the gate electrode, and the insulator 109 functions as a side barrier that protects the side surface of the gate electrode and the side surface of the gate insulating film.

Although the transistor 100 does not include the conductors 104a and 104b, by provision of the insulator 107 in contact with the metal oxide 102b, the resistance of the metal oxide 102 can be reduced at the time of formation of the insulator 107. For example, the insulator 107 is formed using a deposition gas containing impurity elements such as hydrogen or nitrogen, whereby the impurity elements such as hydrogen or nitrogen are mainly added to a region of the metal oxide 102 which is in contact with the insulator 107. Oxygen vacancies are formed in the region to which the impurity elements are added, and the impurity elements enter the oxygen vacancies, thereby increasing the carrier density and reducing resistance. Thus, the source region and the drain region of the transistor 100 are formed. Note that examples of the impurity element include boron, carbon, fluorine, phosphorus, sulfur, chlorine, titanium, and a rare gas element. Typical examples of the rare gas element include helium, neon, argon, krypton, and xenon.

Note that at least part of a region of the metal oxide 102 that overlaps with the conductor 106, for example, does not have reduced resistance and functions as the channel formation region of the transistor 100. In the metal oxide 102 illustrated in FIG. 9A, different hatching patterns are used for the source and drain regions and the channel formation region.

As described above, the source and drain regions in the transistor 100 preferably have a higher concentration of at least one of hydrogen and nitrogen than the channel formation region in the transistor 100. The concentration of hydrogen or nitrogen can be measured by secondary ion mass spectrometry (SIMS) or the like. Here, the concentration of hydrogen or nitrogen in the channel formation region in the transistor 100 can be obtained by measurement of the concentration of hydrogen or nitrogen in the vicinity of the center of a region of the metal oxide 102b that overlaps with the insulator 105.

In the case where the transistor 100 is miniaturized to have a channel length of approximately 10 nm to 30 nm inclusive, impurity elements contained in the source region or the drain region might diffuse and the source region and the drain region might be electrically connected to each other. By formation of the insulator 108 and the insulator 109, entry of impurities such as hydrogen or water to the insulator 105 and the conductor 106 can be suppressed, and diffusion of oxygen in the insulator 105 into the insulator 46 and the like can be suppressed, so that the source region and the drain region can be prevented from being electrically connected to each other when the gate potential is 0 V.

Moreover, the insulator 109 formed by an ALD method can have a thickness substantially equal to or less than a miniaturized channel length, which can prevent the distance between the source and drain regions from being longer than necessary and the resistance from increasing.

The insulator 109 is preferably formed in the following manner: an insulator is formed by an ALD method and then subjected to anisotropic etching so as to remain in a portion in contact with the side surfaces of the metal oxide 102c, the insulator 105, the conductor 106, and the insulator 108. Thus, the insulator 109 having a small thickness as described above can be easily formed. At this time, even when the insulator 108 provided over the conductor 106 is partly removed by the anisotropic etching, the portion of the insulator 109 in contact with the insulator 105 and the conductor 106 can be left sufficiently.

The insulator 107 is preferably formed using an insulating material that has a function of inhibiting the passage of oxygen and impurities such as water or hydrogen. For example, the insulator 107 is preferably formed using silicon nitride, silicon nitride oxide, silicon oxynitride, aluminum nitride, or aluminum nitride oxide. By formation of the insulator 107, oxygen can be prevented from passing through the insulator 107 and being supplied to the oxygen vacancies in the source region and the drain region of the transistor 100, so that the carrier density can be prevented from being lowered. In addition, entry of impurities such as water or hydrogen through the insulator 107, which causes the source region and the drain region of the transistor 100 to excessively extend to the channel formation region side, can be prevented. Note that the insulator 46 is preferably provided over the insulator 107.

The transistor 200 with the structure illustrated in FIGS. 9A and 9B2 includes the insulator 40 over the substrate (not illustrated); the insulator 41 over the insulator 40; the insulator 42 over the insulator 41; the conductor 201 over the insulator 41 so as to be embedded in the insulator 42; the insulator 43 over the insulator 42 and the conductor 201; the insulator 44 over the insulator 43; the insulator 45 over the insulator 44; the metal oxide 202a_1 and the metal oxide 202a_2 over the insulator 45; the metal oxide 202b_1 over the metal oxide 202a_1; the metal oxide 202b_2 over the metal oxide 202a_2; the metal oxide 202c over the insulator 45, the metal oxide 202b_1, and the metal oxide 202b_2; the insulator 205 over the metal oxide 202c; the conductor 206 over the insulator 205; an insulator 208 over the conductor 206; an insulator 209 in contact with top surfaces of the metal oxide 202b_1 and the metal oxide 202b_2 and side surfaces of the metal oxide 202c, the insulator 205, the conductor 206, and the insulator 208; and the insulator 107 in contact with the insulator 45, the metal oxide 202a_1, the metal oxide 202a_2, the metal oxide 202b_1, the metal oxide 202b_2, the insulator 208, and the insulator 209. Here, the insulator 107 is preferably provided to cover the metal oxide 202, the insulator 205, the conductor 206, the insulator 208, and the insulator 209.

The insulator 208 corresponds to the insulator 108, and the insulator 209 corresponds to the insulator 109.

The metal oxide 202 includes a region in contact with the insulator 107. The resistance of the region and its vicinity is lowered in a manner similar to that of the source region and the drain region in the transistor 100. Accordingly, part of the metal oxide 202a_1 and part of the metal oxide 202b_1 function as the source region in the transistor 200, and part of the metal oxide 202a_2 and part of the metal oxide 202b_2 function as the drain region in the transistor 200.

FIGS. 10A, 10B1, and 10B2 are cross-sectional views illustrating the transistor 100 included in the memory device 11 and the transistor 200 included in the memory unit 20, and illustrate a modification example of FIGS. 9A, 9B1, and 9B2. FIG. 10A, FIG. 10B1, and FIG. 10B2 correspond to FIG. 9A, FIG. 9B1, and FIG. 9B2, respectively.

The structure illustrated in FIGS. 10A, 10B1, and 10B2 is different from that in FIGS. 9A, 9B1, and 9B2 in that the transistor 200 does not include the metal oxide 202a_1, the metal oxide 202a_2, the metal oxide 202b_1, and the metal oxide 202b_2. In the transistor 200 with the structure illustrated in FIGS. 10A and 10B2, the metal oxide 202c is electrically connected to the conductor 210 and the conductor 211. The conductor 210 functions as the source electrode in the transistor 200, and the conductor 211 functions as the drain electrode in the transistor 200. The conductors 210 and 211 can be provided in the same layer as the conductor 201. In this case, the conductor 210 and the conductor 211 can be provided to face each other with the conductor 201 positioned therebetween. Moreover, an opening reaching the conductor 210 and an opening reaching the conductor 211 are provided in the insulators 43, 44, and 45. The metal oxide 202c is electrically connected to the conductors 210 and 211 through the openings.

In the conductor 210, a conductor 210a is formed in contact with the insulator 41 and the inner wall of the opening in the insulator 42, and a conductor 210b is formed on the inner side. In the conductor 211, a conductor 211a is formed in contact with the insulator 41 and the inner wall of the opening in the insulator 42, and a conductor 211b is formed on the inner side. The conductors 210a and 211a can be formed using a material similar to that for the conductor 201a. The conductors 210b and 211b can be formed using a material similar to that for the conductor 201b.

Note that the top surfaces of the conductors 210a, 210b, 211a, and 211b can have substantially the same level as the top surface of the insulator 42. Note that although a structure in which the conductors 210a and 210b are stacked and a structure in which the conductors 211a and 211b are stacked are illustrated in FIG. 10A, one embodiment of the present invention is not limited to these structures. For example, a structure in which only the conductors 210b and 211b are provided may be employed.

When the transistor 200 has the structure illustrated in FIGS. 10A and 10B2, a variation in electrical characteristics of the transistor 200 can be reduced.

Note that the structures illustrated in FIG. 5A to FIG. 10B2 can be combined as appropriate. For example, the transistor 100 with the structure illustrated in FIGS. 5A and 5B1 can be combined with the transistor 200 with the structure illustrated in FIGS. 10A and 10B2. That is, the transistor 100 with the structure illustrated in FIGS. 5A and 5B1 and the transistor 200 with the structure illustrated in FIGS. 10A and 10B2 can be formed over the same substrate.

Next, components of the transistor 100 and the transistor 200 are described.

<Substrate>

As a substrate over which the transistor 100 and the transistor 200 are formed, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a register, a switching element, a light-emitting element, a memory element, or the like is used.

Alternatively, a flexible substrate may be used as the substrate. As a method of providing the transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. As the substrate, a sheet, a film, or a foil containing a fiber may be used. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 µm and less than or equal to 700 µm, preferably greater than or equal to 10 µm and less than or equal to 500 µm, further preferably greater than or equal to 15 µm and less than or equal to 300 µm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Therefore, an impact applied to the semiconductor device over the substrate, which is caused by dropping or the like, can be reduced. That is, a robust semiconductor device can be provided.

For the substrate that is a flexible substrate, metal, an alloy, resin, glass, or fiber thereof can be used, for example. The flexible substrate preferably has a lower coefficient of linear expansion because deformation due to an environment is suppressed. The flexible substrate is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

<Insulator>

The insulator can be an oxide, nitride, oxynitride, nitride oxide, metal oxide, metal oxynitride, metal nitride oxide, or the like having an insulating property.

Note that when the transistor is surrounded by an insulator that has a function of inhibiting the passage of oxygen and impurities such as hydrogen, the electrical characteristics of the transistor can be stabilized. For example, an insulator that has a function of inhibiting the passage of oxygen and impurities such as hydrogen is used for each of the insulators 44, 42, and 41.

The insulator that has a function of inhibiting the passage of oxygen and impurities such as hydrogen can have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulators 44, 42, and 41 may each be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulators 44, 42, and 41 preferably contain aluminum oxide, hafnium oxide, or the like.

The insulators 40, 41, 42, 43, 45, 105, and 205 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulators 40, 41, 42, 43, 45, 105, and 205 each preferably contain silicon oxide, silicon oxynitride, or silicon nitride.

It is preferable that the insulator 43, the insulator 44, the insulator 45, the insulator 105, and/or the insulator 205 be formed using an insulator with a high dielectric constant. For example, it is preferable that the insulator 43, the insulator 44, the insulator 45, the insulator 105, and/or the insulator 205 contain gallium oxide, hafnium oxide, zirconium oxide, an oxide containing aluminum and hafnium, an oxynitride containing aluminum and hafnium, an oxide containing silicon and hafnium, an oxynitride containing silicon and hafnium, or a nitride containing silicon and hafnium. Alternatively, it is preferable that the insulator 43, the insulator 44, the insulator 45, the insulator 105, and/or the insulator 205 have a stacked-layer structure of silicon oxide or silicon oxynitride and an insulator with a high dielectric constant. Because silicon oxide and silicon oxynitride have thermal stability, a combination of silicon oxide or silicon oxynitride with an insulator with a high dielectric constant allows the stacked-layer structure to be thermally stable and have a high dielectric constant. For example, when aluminum oxide, gallium oxide, or hafnium oxide is positioned in contact with the metal oxide 102 in each of the insulators 45 and 105, silicon contained in silicon oxide or silicon oxynitride can be prevented from entering the metal oxide 102. Furthermore, for example, when silicon oxide or silicon oxynitride is in contact with the metal oxide 102 in each of the insulators 45 and 105, trap centers might be formed at the interface between aluminum oxide, gallium oxide, or hafnium oxide and silicon oxide or silicon oxynitride. The trap centers can shift the threshold voltage of the transistor in the positive direction by trapping electrons, in some cases.

Each of the insulators 40, 41, 42, 46, and 47 preferably includes an insulator with a low dielectric constant. For example, each of the insulators 40, 41, 42, 46, and 47 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, each of the insulators 40, 41, 42, 46, and 47 preferably has a stacked-layer structure of a resin and one of the following materials: silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide. Because silicon oxide and silicon oxynitride have thermal stability, a combination of silicon oxide or silicon oxynitride with a resin allows the stacked-layer structure to be thermally stable and have a low dielectric constant. Examples of the resin include polyester, polyolefin, polyamide (e.g., nylon or aramid), polyimide, polycarbonate, and acrylic.

For the insulators 108, 109, 208, and 209, an insulator having a function of inhibiting the passage of oxygen and impurities such as hydrogen is used. For the insulators 108, 109, 208, and 209, for example, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; or silicon nitride can be used.

<Conductor>

For the conductors 101a, 101b, 104a, 104b, 106, 201a, 201b, 204a, 204b, 206, 210a, 210b, 211a, and 211b, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having a high electric conductivity typified by polycrystalline silicon containing an impurity element such as phosphorus, or silicide such as nickel silicide may be used.

Alternatively, for the above conductors, a conductive material containing oxygen and a metal element contained in the metal oxide which can be used for the metal oxide 102 can be used. A conductive material containing the above metal element and nitrogen may be used. For example, a conductive material containing nitrogen such as titanium nitride or tantalum nitride may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. By using such a material, hydrogen contained in the metal oxide 102 can be captured in some cases. Alternatively, hydrogen entering from an external insulator or the like can be captured in some cases.

A stack including a plurality of conductors formed using the above materials may be used. For example, a stacked-layer structure formed using a combination of a material containing the above-described metal element and a conductive material containing oxygen may be used. Alternatively, a stacked-layer structure formed using a combination of a material containing the above-described metal element and a conductive material containing nitrogen may be used. Alternatively, a stacked-layer structure formed using a combination of a material containing the above-described metal element, a conductive material containing oxygen, and a conductive material containing nitrogen may be used.

<Metal Oxide Applicable to Metal Oxides 102 and 202>

The metal oxides 102 and 202 of one embodiment of the present invention are described below. For the metal oxides 102 and 202, a metal oxide functioning as an oxide semiconductor (hereinafter, the metal oxide is also referred to as an oxide semiconductor) is preferably used.

The oxide semiconductor preferably contains at least indium or zinc. In particular, indium and zinc are preferably contained. In addition, aluminum, gallium, yttrium, tin, or the like is preferably contained. Furthermore, one or more kinds of elements selected from boron, silicon, titanium, iron, nickel, germanium, zirconium, molybdenum, lanthanum, cerium, neodymium, hafnium, tantalum, tungsten, magnesium, and the like may be contained.

Here, a case where the oxide semiconductor is an InMZnO containing indium, an element M, and zinc is considered. The element M is aluminum, gallium, yttrium, tin, or the like. Other elements that can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M.

Here, the case where the metal oxide contains indium, the element M, and zinc is considered. The terms of the atomic ratio of indium to the element M and zinc contained in the metal oxide are denoted by [In], [M], and [Zn], respectively.

Preferred ranges of the atomic ratio of indium to the element M and zinc contained in the metal oxide that can be used for the metal oxides 102a and 102b are described with reference to FIGS. 11A to 11C. Note that the proportion of oxygen atoms is not shown in FIGS. 11A to 11C. The terms of the atomic ratio of indium to the element M and zinc contained in the metal oxide are denoted by [In], [M], and [Zn], respectively.

Figure 11A:
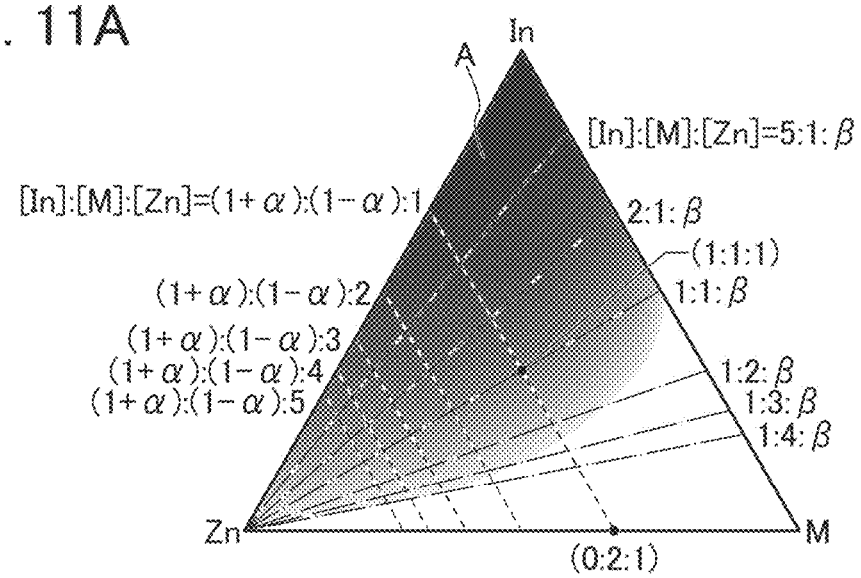
FIGS. 11A to 11C each illustrate an atomic ratio range of a metal oxide.
Figure 11B:
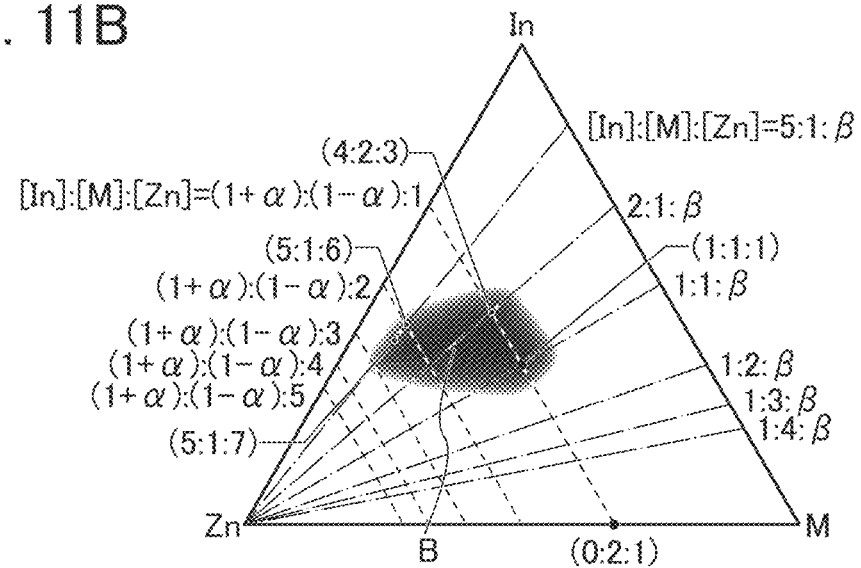
Figure 11C:
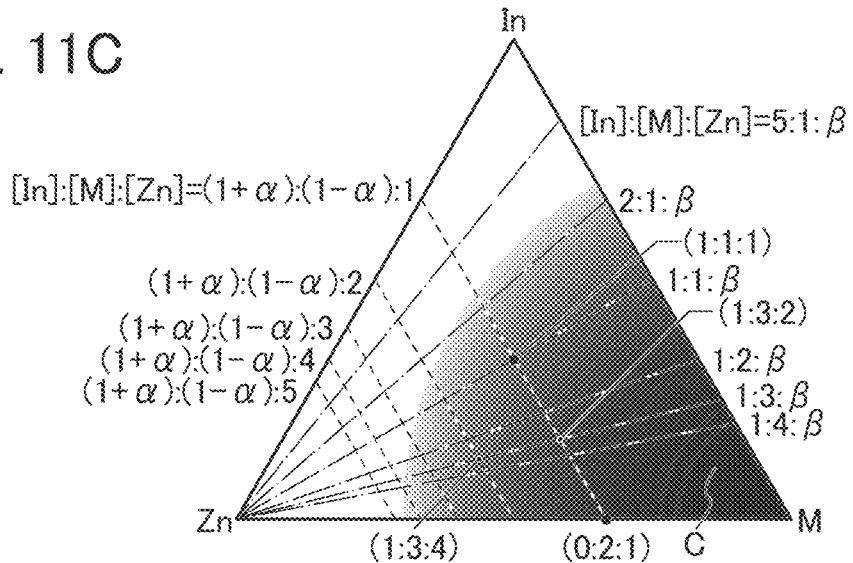

In FIGS. 11A to 11C, broken lines indicate a line where the atomic ratio [In]:[M]:[Zn] is $(1+\alpha):(1-\alpha):1$ $(-1\leq\alpha\leq1)$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Furthermore, dashed-dotted lines indicate a line where the atomic ratio [In]:[M]:[Zn] is $5:1:\beta$ $(\beta\geq0)$, a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

Furthermore, a metal oxide with the atomic ratio of [In]:[M]:[Zn]=0:2:1 or a neighborhood thereof in FIGS. 11A to 11C tends to have a spinel crystal structure.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 11A represents an example of the preferred range of the atomic ratio of indium, the element M, and zinc contained in the metal oxide.

In addition, the metal oxide having a higher content of indium can have higher carrier mobility (electron mobility). Thus, a metal oxide having a high content of indium has higher carrier mobility than a metal oxide having a low content of indium.

By contrast, when the indium content and the zinc content in a metal oxide become lower, carrier mobility becomes lower. Thus, with an atomic ratio of [In]:[M]:[Zn]=0:1:0 and the neighborhood thereof (e.g., the region C in FIG. 11C), insulation performance becomes better.

For example, the metal oxide used as the metal oxide 102b, the metal oxide 202b_1, and the metal oxide 202b_2 preferably have an atomic ratio represented by the region A in FIG. 11A. The metal oxide with the atomic ratio has high carrier mobility. The atomic ratio of In to Ga and Zn of the metal oxide used as the metal oxide 102b, the metal oxide 202b_1, and the metal oxide 202b_2 may be 4:2:3 to 4:2:4.1 or in the neighborhood thereof, for example. By contrast, the metal oxide used as the metal oxide 102a, the metal oxide 202a_1, and the metal oxide 202a_2 preferably have an atomic ratio represented by the region C in FIG. 11C. The metal oxide with the atomic ratio has relatively high insulating properties. The atomic ratio of In to Ga and Zn of the metal oxide used as the metal oxide 102a the metal oxide 202a_1, and the metal oxide 202a_2 may be approximately 1:3:4, for example. Note that the metal oxide that is used as the metal oxide 102c and the metal oxide 202c may be the metal oxide that can be used as the metal oxide 102a the metal oxide 202a_1, and the metal oxide 202a_2 or the metal oxide that can be used as the metal oxide 102b, the metal oxide 202b_1, and the metal oxide 202b_2.

A metal oxide having an atomic ratio in the region A, particularly in a region B in FIG. 11B, has high carrier mobility and high reliability and is excellent.

Note that the region B includes an atomic ratio of [In]:[M]:[Zn]=4:2:3 to 4:2:4.1 and the neighborhood thereof. The neighborhood includes an atomic ratio of [In]:[M]:[Zn]=5:3:4. Note that the region B includes an atomic ratio of [In]:[M]:[Zn]=5:1:6 and the neighborhood thereof and an atomic ratio of [In]:[M]:[Zn]=5:1:7 and the neighborhood thereof.

In the case where the metal oxide is formed of an In-M-Zn oxide, it is preferable to use a target containing a polycrystalline In-M-Zn oxide as the sputtering target. Note that the atomic ratio of the formed metal oxide varies from the above atomic ratios of metal elements of the sputtering targets in a range of ±40%. For example, when a sputtering target with an atomic ratio of In:Ga:Zn=4:2:4.1 is used for forming the metal oxide, the atomic ratio of In to Ga and Zn in the formed metal oxide may be 4:2:3 or in the neighborhood of 4:2:3. When a sputtering target with an atomic ratio of In:Ga:Zn=5:1:7 is used for forming the metal oxide, the atomic ratio of In to Ga and Zn in the formed metal oxide may be 5:1:6 or in the neighborhood of 5:1:6.

Note that the property of a metal oxide is not uniquely determined by an atomic ratio. Even with the same atomic ratio, the property of a metal oxide might be different depending on a formation condition. For example, in the case where the metal oxide is deposited with a sputtering apparatus, a film having an atomic ratio deviated from the atomic ratio of the target is formed. In particular, [Zn] in the film might be smaller than [Zn] in the target depending on the substrate temperature in deposition. Thus, the illustrated regions each represent an atomic ratio with which a metal oxide tends to have specific characteristics, and boundaries of the regions A to C are not clear.

<Composition of Metal Oxide>

Described below is the composition of a cloud-aligned composite oxide semiconductor (CAC-OS) applicable to a transistor disclosed in one embodiment of the present invention.

In this specification and the like, "c-axis aligned crystal (CAAC)" or "cloud-aligned composite (CAC)" might be stated. Note that CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide contains a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, high on-state current and high field-effect mobility, can be obtained.

In other words, the CAC-OS or the CAC metal oxide can be called a matrix composite or a metal matrix composite.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of distortion in the CAAC-OS. That is, a lattice arrangement is distorted and thus formation of a grain boundary is inhibited. This is probably because the CAAC-OS can tolerate distortion owing to a low density of oxygen atom arrangement in an a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as an (In, M, Zn) layer. When indium of the In layer is replaced by the element M, the layer can also be referred to as an (In, M) layer.

The CAAC-OS is an oxide semiconductor with high crystallinity. By contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

An oxide semiconductor can have any of various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Containing Oxide Semiconductor>

Next, the case where the oxide semiconductor is used for a transistor is described.

When the oxide semiconductor is used in a transistor, the transistor can have high field-effect mobility. In addition, the transistor can have high reliability.

Moreover, the carrier density in the channel formation region of the metal oxide 102b in the transistor is preferably low. In order to reduce the carrier density of the oxide semiconductor film, the concentration of impurities in the oxide semiconductor film is reduced so that the density of defect states can be reduced. In this specification and the like, a state with a low impurity concentration and a low density of defect states is referred to as a highly purified intrinsic or substantially highly purified intrinsic state. The channel formation region of the metal oxide 102b has, for example, a carrier density lower than $8 \times 10^{11}/cm^3$, preferably lower than $1 \times 10^{11}/cm^3$, and further preferably lower than $1 \times 10^{10}/cm^3$, and higher than or equal to $1 \times 10^{-9}/cm^3$.

A highly purified intrinsic or substantially highly purified intrinsic oxide semiconductor film has a low density of defect states and accordingly has a low density of trap states in some cases.

Charges trapped by the trap states in the oxide semiconductor take a long time to be released and may behave like fixed charges. Thus, a transistor whose channel region is formed in the oxide semiconductor having a high density of trap states has unstable electrical characteristics in some cases.

In order to obtain stable electrical characteristics of the transistor, it is effective to reduce the concentration of impurities in the channel formation region of the metal oxide 102b. In addition, in order to reduce the concentration of impurities in the channel formation region of the metal oxide 102b, the concentration of impurities in a film that is adjacent to the metal oxide 102b is preferably reduced. As examples of the impurities, hydrogen, nitrogen, alkali metal, alkaline earth metal, iron, nickel, silicon, and the like are given.

<Impurity>

Here, the influence of impurities in the oxide semiconductor is described.

When silicon or carbon that is one of Group 14 elements is contained in the oxide semiconductor, defect states are formed. Thus, the concentration of silicon or carbon (the concentration is measured by SIMS) in the channel formation region of the metal oxide 102b is set to be lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated, in some cases. Thus, a transistor including an oxide semiconductor that contains an alkali metal or an alkaline earth metal is likely to be normally-on. Therefore, it is preferable to reduce the concentration of an alkali metal or an alkaline earth metal in the channel formation region of the metal oxide 102b. Specifically, the concentration of alkali metal or alkaline earth metal in the channel formation region of the metal oxide 102b, which is measured by SIMS, is lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type by generation of electrons serving as carriers and an increase of carrier density. Thus, a transistor containing nitrogen in the channel formation region of the metal oxide 102b tends to have normally-on characteristics. For this reason, nitrogen in the channel formation region of the metal oxide 102b is preferably reduced as much as possible; for example, the concentration of nitrogen in the channel formation region of the metal oxide 102b measured by SIMS is set to lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, the transistor containing much hydrogen in the channel formation region of the metal oxide 102b tends to have normally-on characteristics. For this reason, hydrogen in the channel formation region of the metal oxide 102b is preferably reduced as much as possible. Specifically, the hydrogen concentration of the oxide semiconductor measured by SIMS is lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

By reducing impurities in the channel formation region of the metal oxide 102b to an enough level, the transistor can have stable electrical characteristics.

<Method for Fabricating Semiconductor Device>

Next, a method for fabricating the transistor 100 and the transistor 200 with the structure illustrated in FIGS. 5A, 5B1, and 5B2 and FIG. 6 in parallel is described. Note that FIG. 12A, FIG. 13A, FIG. 14A, FIG. 15A, FIG. 16A, FIG. 17A, FIG. 18A, and FIG. 19A are cross-sectional views taken along the dashed-dotted line A1-A2 in FIG. 6. FIG. 12B1, FIG. 13B1, FIG. 14B1, FIG. 15B1, FIG. 16B1, FIG. 17B1, FIG. 18B1, and FIG. 19B1 are cross-sectional views taken along the dashed-dotted line A3-A4 in FIG. 6. FIG. 12B2, FIG. 13B2, FIG. 14B2, FIG. 15B2, FIG. 16B2, FIG. 17B2, FIG. 18B2, and FIG. 19B2 are cross-sectional views taken along the dashed-dotted line A5-A6 in FIG. 6.

First, a substrate (not illustrated) is prepared, and the insulator 40 is formed over the substrate. The insulator 40 can be formed by a sputtering method, a chemical vapor deposition (CVD) method, a molecular beam epitaxy (MBE) method, a pulsed laser deposition (PLD) method, an ALD method, or the like. A silicon oxynitride can be formed as the insulator 40 by a CVD method, for example.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

The use of a PECVD method can provide a high-quality film at a relatively low temperature. A thermal CVD method does not use plasma and thus causes less plasma damage to an object. A wiring, an electrode, an element (e.g., a transistor or a capacitor), or the like included in a semiconductor device might be charged up by receiving charges from plasma, for example. In that case, accumulated charges might break the wiring, electrode, element, or the like included in the semiconductor device. By contrast, when a thermal CVD method not using plasma is employed, such plasma damage is not caused and the yield of semiconductor devices can be increased. A thermal CVD method does not cause plasma damage during deposition, so that a film with few defects can be obtained.

An ALD method also causes less plasma damage to an object. Since an ALD method does not cause plasma damage during deposition, a film with few defects can be obtained.

Unlike in a deposition method in which particles ejected from a target or the like are deposited, in a CVD method and an ALD method, a film is formed by reaction at a surface of an object. Thus, a CVD method and an ALD method can provide favorable step coverage almost regardless of the shape of an object. In particular, an ALD method can provide excellent step coverage and excellent thickness uniformity and thus can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, the composition of a film to be formed can be controlled with the flow rate ratio of a source gas. For example, by a CVD method or an ALD method, a film with a certain composition can be formed depending on the flow rate ratio of a source gas. Moreover, by changing the flow rate ratio of a source gas during deposition by a CVD method or an ALD method, a film whose composition is continuously changed can be formed. In the case where a film is formed while changing the flow rate ratio of a source gas, as compared with the case where a film is formed using a plurality of deposition chambers, time taken for the deposition can be reduced because time taken for transfer and pressure adjustment is omitted. Thus, semiconductor devices can be manufactured with improved productivity in some cases.

Next, the insulator 41 is formed over the insulator 40. The insulator 41 can be formed by any of the formation methods of the insulator 40. Aluminum oxide can be formed as the insulator 41 by a sputtering method, for example. The insulator 41 may have a multilayer structure. For example, aluminum oxide may be formed by a sputtering method and another aluminum oxide may be formed by an ALD method over the aluminum oxide. Alternatively, aluminum oxide may be formed by an ALD method and another aluminum oxide may be formed by a sputtering method over the aluminum oxide.

Next, the insulator 42 is formed over the insulator 41. The insulator 42 can be formed by a sputtering method, a CVD method, an MBE method, a PLD method, an ALD method, or the like. Silicon oxide can be formed as the insulator 42 by a CVD method, for example.

Next, a groove that reaches the insulator 41 is formed in the insulator 42. Examples of the groove include a hole and an opening. In forming the groove, wet etching may be employed; however, dry etching is preferably employed in terms of microfabrication. Note that as illustrated in FIGS. 12A, 12B1, and 12B2, when the grooves that reach the insulator 41 are formed in the insulator 42, the insulator 41 may be partially removed in regions overlapping with the grooves.

After the formation of the grooves, a conductor to be the conductors 101a and 201a is formed. The conductor to be the conductors 101a and 201a preferably includes a conductive material that has a function of inhibiting the passage of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductor to be the conductors 101a and 201a can be formed by a sputtering method, a CVD method, an MBE method, a PLD method, an ALD method, or the like. Tantalum nitride can be formed as the conductor to be the conductors 101a and 201a by a sputtering method, for example.

Then, a conductor to be the conductor 101b and the conductor 201b is formed over the conductor to be the conductor 101a and the conductor 201a. The conductors can be formed by a sputtering method, a CVD method, an MBE method, a PLD method, an ALD method, or the like. For the conductor to be the conductor 101b and the conductor 201b, for example, titanium nitride can be formed by a CVD method and tungsten can be formed by a CVD method over the titanium nitride.

Next, portions of the conductor to be the conductors 101a and 201a and the conductor to be the conductor 101b and the conductor 201b which are above the insulator 42 are removed by a chemical mechanical polishing (CMP) treatment. As a result, the conductor to be the conductor 101a and the conductor 201a and the conductor to be the conductor 101b and the conductor 201b remain only in the grooves. Thus, the conductor 101 including the conductor 101a and the conductor 101b whose top surfaces are flat and the conductor 201 including the conductor 201a and the conductor 201b whose top surfaces are flat can be formed.

Next, the insulator 43 is formed over the insulator 42, the conductor 101, and the conductor 201. The insulator 43 can be formed by a sputtering method, a CVD method, an MBE method, a PLD method, an ALD method, or the like.

Next, the insulator 44 is formed over the insulator 43. The insulator 44 can be formed by a sputtering method, a CVD method, an MBE method, a PLD method, an ALD method, or the like.

Then, the insulator 45 is formed over the insulator 44. The insulator 45 can be formed by a sputtering method, a CVD method, an MBE method, a PLD method, an ALD method, or the like (see FIGS. 12A, 12B1, and 12B2).

Next, first heat treatment is preferably performed. The first heat treatment can be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The first heat treatment is performed in nitrogen, an inert gas atmosphere, or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in nitrogen or an inert gas atmosphere, and then another heat treatment is performed in an atmosphere containing an oxidizing gas at 10 ppm or more, 1% or more, or 10% or more in order to compensate for released oxygen. By the first heat treatment, impurities such as hydrogen or water included in the insulator 45 can be removed, for example. Alternatively, in the first heat treatment, plasma treatment using oxygen may be performed under a reduced pressure. The plasma treatment containing oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF to the substrate side allows oxygen radicals generated by the high-density plasma to be efficiently introduced into the insulator 45. Alternatively, after plasma treatment using an inert gas with the apparatus, plasma treatment using oxygen in order to compensate for released oxygen may be performed. The first heat treatment is not necessarily performed.

Alternatively, the heat treatment can be performed after the formation of the insulator 43, after the formation of the insulator 44, and after the formation of the insulator 45. Although the heat treatment can be performed under the conditions for the first heat treatment, heat treatment after the formation of the insulator 43 is preferably performed in an atmosphere containing nitrogen.

Next, a metal oxide 102A to be the metal oxides 102a, 202a_1, and 202a_2 and a metal oxide 102B to be the metal oxides 102b, 202b_1, and 202b_2 are formed over the insulator 45 in this order. Note that it is preferable that the metal oxide 102A and the metal oxide 102B be successively formed without being exposed to the atmosphere. By such formation, impurities or moisture from the atmosphere can be prevented from being attached to the metal oxide 102A, and an interface between the metal oxide 102A and the metal oxide 102B and the vicinity of the interface can be kept clean.

The metal oxides 102A and 102B can be formed by a sputtering method, a CVD method, an MBE method, a PLD method, an ALD method, or the like.

For example, in the case where the metal oxide 102A and the metal oxide 102B are formed by a sputtering method, oxygen or a mixed gas of oxygen and a rare gas can be used as a sputtering gas. By increasing the proportion of oxygen in the sputtering gas, the amount of excess oxygen in the oxide film to be formed can be increased. In the case where the above metal oxides are formed by a sputtering method, the above In-M-Zn oxide target can be used. The metal oxide 102A can be formed using a target having an atomic ratio of In:Ga:Zn=1:3:4, for example. The metal oxide 102B can be formed using a target having an atomic ratio of In:Ga:Zn=4:2:4.1, for example.

Part of oxygen in the sputtering gas may be supplied to the insulator 45 particularly in formation of the metal oxide 102A.

Thus, the proportion of oxygen in the sputtering gas for the metal oxide 102A is 70% or higher, preferably 80% or higher, and further preferably 100%.

In the case where the metal oxide 102B is formed by a sputtering method, when the proportion of oxygen in the sputtering gas is higher than or equal to 1% and lower than or equal to 30%, preferably higher than or equal to 5%, and lower than or equal to 20%, an oxygen-deficient oxide semiconductor is formed. A transistor including an oxygen-deficient oxide semiconductor can have relatively high field-effect mobility.

Thus, when an oxygen-deficient oxide semiconductor is used as the metal oxide 102B, a metal oxide containing excess oxygen is preferably used as the metal oxide 102A. Oxygen doping treatment may be performed after the formation of the metal oxide 102B.

After that, second heat treatment may be performed. For the second heat treatment, the conditions for the first heat treatment can be used. By the second heat treatment, impurities such as hydrogen or water in the metal oxides 102A and 102B can be removed. The second heat treatment may be performed in such a manner that treatment is performed in a nitrogen atmosphere at 400° C. for one hour and then another treatment is successively performed in an oxygen atmosphere at 400° C. for one hour, for example.

Next, a conductor to be the conductors 104a, 104b, 204a, and 204b is formed. As the conductor, tantalum nitride, tungsten nitride, titanium nitride, or the like can be used. Alternatively, tantalum, tungsten, titanium, molybdenum, aluminum, copper, a molybdenum-tungsten alloy, or the like can be used. The conductor to be the conductors 104a, 104b, 204a, and 204b can be formed by a sputtering method, a CVD method, an MBE method, a PLD method, an ALD method, or the like.

Next, the conductor to be the conductors 104a, 104b, 204a, and 204b is processed to form a conductor 104A, the conductor 204a, and the conductor 204b. Here, the conductor 104A is a conductor to be the conductor 104a and the conductor 104b (see FIGS. 13A, 13B1, and 13B2). The conductor can be processed by a lithography method and an etching method, for example. Specifically, patterning is performed by a lithography method or the like, and then the conductor can be processed by an etching according to the pattern, for example. As an etching method, a dry etching method or a wet etching method can be used. It is particularly preferable to use a dry etching method because it is suitable for microfabrication.

In the lithography method, first, a resist is exposed to light through a mask. Next, a region exposed to light is removed or left using a developing solution, so that a resist mask is formed. Then, etching is conducted with the resist mask. As a result, a conductor, a semiconductor, an insulator, or the like can be processed into a desired shape. The resist mask is formed by, for example, exposure of the resist to light such as KrF excimer laser light, ArF excimer laser light, or extreme ultraviolet (EUV) light. A liquid immersion technique may be employed in which a portion between a substrate and a projection lens is filled with a liquid (e.g., water) to perform light exposure. An electron beam or an ion beam may be used instead of the above-mentioned light. Note that a mask is not necessary in the case of using an electron beam or an ion beam. To remove the resist mask, dry etching treatment such as ashing or wet etching treatment can be used. Alternatively, wet etching treatment can be performed after dry etching treatment. Further alternatively, dry etching treatment can be performed after wet etching treatment.

As a dry etching apparatus, a capacitively coupled plasma (CCP) etching apparatus including parallel plate electrodes can be used. The capacitively coupled plasma etching apparatus including parallel plate electrodes may have a structure in which high-frequency power is applied to one of the parallel plate electrodes. Alternatively, different high-frequency powers are applied to one of the parallel plate electrodes. Further alternatively, high-frequency powers with the same frequency are applied to the parallel plate electrodes. Still further alternatively, high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

Next, the metal oxides 102A and 102B are processed by an etching or the like using the conductors 104A, 204a, and 204b as a hard mask. Thus, the metal oxides 102a, 202a_1, and 202a_2, 102b, 202b_1, and 202b_2 are formed (see FIGS. 14A, 14B1, and 14B2).

Next, the conductor 104A is processed to form the conductors 104a and 104b (see FIGS. 15A, 15B1, and 15B2). The conductor 104A can be processed by a lithography method and an etching method, for example.

Next, a metal oxide 102C is formed over the insulator 45, the metal oxide 102b, the conductor 104a, the conductor 104b, the conductor 204a, and the conductor 204b. The metal oxide 102C can be formed by a sputtering method, a CVD method, an MBE method, a PLD method, an ALD method, or the like.

The metal oxide 102C is a metal oxide to be the metal oxides 102c and 202c. Accordingly, in accordance with characteristics required for the metal oxides 102c and 202c, the metal oxide 102C may be formed by a method similar to the method for forming the metal oxide to be the metal oxides 102a, 202a_1, and 202a_2 or a method similar to the method for forming the metal oxide to be the metal oxides 102b, 202b_1, and 202b_2. The metal oxide 102C can be formed using a target having an atomic ratio of In:Ga:Zn=1:3:4 by a sputtering method, for example.

Next, an insulator 105A to be the insulators 105 and 205 is formed over the metal oxide 102C (see FIGS. 16A, 16B1, and 16B2). The insulator 105A can be formed by a sputtering method, a CVD method, an MBE method, a PLD method, an ALD method, or the like.

Note that oxygen is excited by microwaves to generate high-density oxygen plasma, and the insulator 105A is exposed to the oxygen plasma, whereby oxygen can be supplied to the insulator 105A and the metal oxides 102 and 202.

Here, third heat treatment can be performed. For the third heat treatment, the conditions for the first heat treatment can be used. The heat treatment can reduce the moisture concentration and the hydrogen concentration in the insulator 105A. Note that the third heat treatment is not necessarily performed in some cases.

Next, a conductor to be the conductor 106 and the conductor 206 is formed. As the conductor, tantalum nitride, tungsten nitride, titanium nitride, or the like can be used. Alternatively, tantalum, tungsten, titanium, molybdenum, aluminum, copper, a molybdenum-tungsten alloy, or the like can be used. The conductor to be the conductors 106 and 206 can be formed by a sputtering method, a CVD method, an MBE method, a PLD method, an ALD method, or the like.

Next, the conductor to be the conductors 106 and 206 is processed to form the conductors 106 and 206 (see FIGS. 17A, 17B1, and 17B2). The conductor can be processed by a lithography method and an etching method, for example.

Next, an insulator 107A to be the insulators 107 and 207 is formed over the insulator 105A, the conductor 106, and the conductor 206 (see FIGS. 18A, 18B1, and 18B2). The insulator 107A can be formed by a sputtering method, a CVD method, an MBE method, a PLD method, an ALD method, or the like.

Next, the metal oxide 102C, the insulator 105A, and the insulator 107A are processed to form the metal oxide 102c, the metal oxide 202c, the insulator 105, the insulator 205, the insulator 107, and the insulator 207 (see FIGS. 19A, 19B1, and 19B2). The processing can be performed by a lithography method and an etching method, for example.

Next, the insulator 46 is formed over the insulator 45, the conductor 104a, the conductor 104b, the insulator 107, the conductor 204a, the conductor 204b, and the insulator 207. The insulator 46 can be formed by a sputtering method, a CVD method, an MBE method, a PLD method, an ALD method, or the like. Alternatively, the insulator 46 can be formed by a spin coating method, a dipping method, a droplet discharging method (such as an ink-jet method), a printing method (such as screen printing or offset printing), a doctor knife method, a roll coater method, a curtain coater method, or the like.

After that, a top surface of the formed insulator 46 is planarized. The planarization can be performed by a CMP method, for example. Note that the insulator 46 is not necessarily planarized.

Next, the insulator 47 is formed over the insulator 46. The insulator 47 can be formed by a sputtering method, a CVD method, an MBE method, a PLD method, an ALD method, or the like. Aluminum oxide can be formed by a sputtering method as the insulator 42, for example.

Through the above process, the semiconductor device including the transistors 100 and 200 can be manufactured. As illustrated in FIGS. 12A to 12B1 to FIGS. 19A to 19B2, by the method of manufacturing a semiconductor device described in this embodiment, the transistor 100 and the transistor 200 can be formed in parallel, whereby the productivity of the semiconductor device can be improved.

<Structure Examples of Memory Cell Included in Memory Unit 20>

Next, structure examples of a memory cell included in the memory unit 20 are described. FIGS. 20A to 20D, FIGS. 21A to 21C, and FIG. 22 are circuit diagrams illustrating structure examples of the memory cell.

Figure 20A:
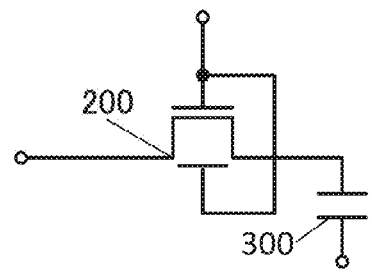
FIGS. 20A to 20D are circuit diagrams each illustrating a structure example of a memory cell.

A memory cell with a structure illustrated in FIG. 20A includes the transistor 200 and a capacitor 300. One of a source and a drain of the transistor 200 is electrically connected to one electrode of the capacitor 300. A gate of the transistor 200 is electrically connected to a back gate of the transistor 200. Note that a low potential, in particular, a ground potential can be applied to the other electrode of the capacitor 300, for example. Moreover, data to be written to the memory cell including the transistor 200 can be input to the other of the source and the drain of the transistor 200. In addition, data to be read from the memory cell including the transistor 200 can be output from the other of the source and the drain of the transistor 200.

As the transistor 200, the transistor 200 with any of the structures illustrated in FIGS. 5A to 5B2 to FIGS. 10A to 10B2 can be used. Note that also in the following drawings, the transistor 200 with any of the structures illustrated in FIGS. 5A to 5B2 to FIGS. 10A to 10B2 can be used as the transistor 200.

The on/off of the transistor 200 can be controlled by a potential applied to the gate of the transistor 200. In the case where the transistor 200 is an n-channel transistor, for example, the transistor 200 is turned on by application of a high potential to the gate of the transistor 200, and the transistor 200 is turned off by application of a low potential to the gate of the transistor 200. When the transistor 200 is turned on, a charge corresponding to data input to the other of the source and the drain of the transistor 200 is written to the capacitor 300.

The transistor 200 is turned off after the charge is written to the capacitor 300, whereby the charge written to the capacitor 300 can be retained. As the off-state current of the transistor 200 is extremely low, the charge written to the capacitor 300 can be retained for a long period, e.g., a year or more, even without a refresh operation.

Furthermore, when the transistor 200 is turned on in the state where the charge is retained in the capacitor 300, data corresponding to the charge retained in the capacitor 300 is read and output from the other of the source and the drain of the transistor 200.

Figure 20B:
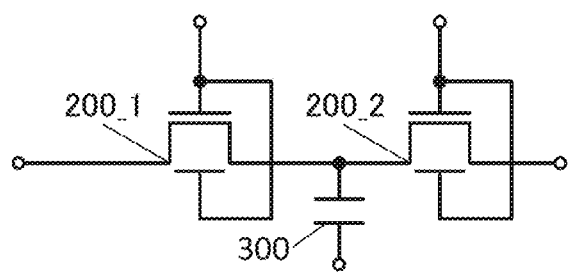

A memory cell with a structure illustrated in FIG. 20B includes a transistor 200_1, a transistor 200_2, and the capacitor 300. One of a source and a drain of the transistor 200_1 is electrically connected to one of a source and a drain of the transistor 200_2 and the one electrode of the capacitor 300. A gate of the transistor 200_1 is electrically connected to a back gate of the transistor 200_1. A gate of the transistor 200_2 is electrically connected to a back gate of the transistor 200_2. Note that a low potential, in particular, a ground potential can be applied to the other electrode of the capacitor 300, for example. Moreover, data to be written to the memory cell including the transistor 200_1 can be input to the other of the source and the drain of the transistor 200_1. In addition, data to be read from the memory cell including the transistor 200_2 can be output from the other of the source and the drain of the transistor 200_2. As for the memory cell with the structure illustrated in FIG. 20B, data output from the memory cell can be recursively input to the same memory cell. For example, data output from the memory cell is input to a flip-flop, and data output from the flip-flop can be input to the same memory cell.

As each of the transistors 200_1 and 200_2, the transistor 200 with any of the structures illustrated in FIGS. 5A to 5B2 to FIGS. 10A to 10B2 can be used. Note that also in the following drawings, the transistor 200 with any of the structures illustrated in FIGS. 5A to 5B2 to FIGS. 10A to 10B2 can be used as each of the transistors 200_1 and 200_2.

When the transistor 200_1 is turned on, a charge corresponding to data input to the other of the source and the drain of the transistor 200_1 is written to the capacitor 300.

The transistors 200_1 and 200_2 are turned off after the charge is written to the capacitor 300, whereby the charge written to the capacitor 300 can be retained. Furthermore, when the transistor 200_2 is turned on in the state where the charge is retained in the capacitor 300, the data corresponding to the charge retained in the capacitor 300 is read and output from the other of the source and the drain of the transistor 2002.

Figure 20C:
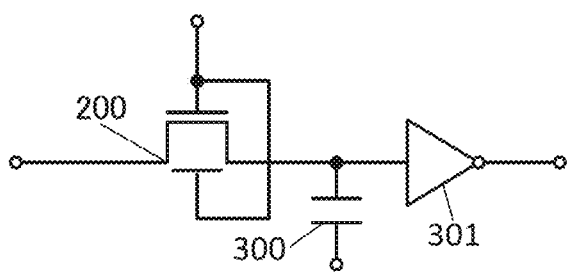

A memory cell with a structure illustrated in FIG. 20C includes the transistor 200, the capacitor 300, and an inverter 301. The one of the source and the drain of the transistor 200 is electrically connected to one electrode of the capacitor 300 and an input terminal of the inverter 301. The gate of the transistor 200 is electrically connected to the back gate of the transistor 200. Note that a low potential, in particular, a ground potential can be applied to the other electrode of the capacitor 300, for example. Moreover, data to be written to the memory cell including the transistor 200 can be input to the other of the source and the drain of the transistor 200. In addition, data to be read from the memory cell including the transistor 200 can be output from an output terminal of the inverter 301.

When the transistor 200 is turned on, a charge corresponding to data input to the other of the source and the drain of the transistor 200 is written to the capacitor 300. The transistor 200 is turned off after the charge is written to the capacitor 300, whereby the charge written to the capacitor 300 can be retained.

The inverter 301 has a function of inverting the logic of data corresponding to the charge retained in the capacitor 300. In the case where data corresponding to the charge retained in the capacitor 300 is high-potential data, for example, low-potential data is output from the output terminal of the inverter 301. In the case where data corresponding to the charge retained in the capacitor 300 is low-potential data, high-potential data is output from the output terminal of the inverter 301.

Figure 20D:
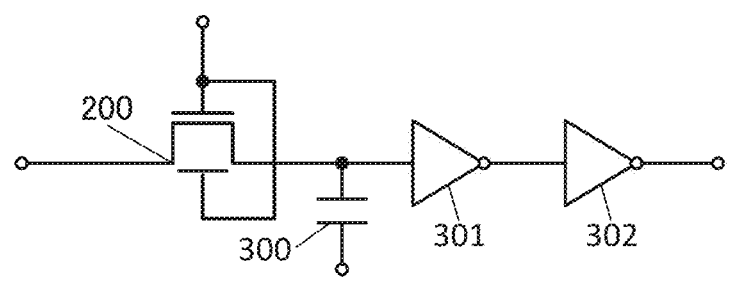

A memory cell with a structure illustrated in FIG. 20D is different from the memory cell with the structure illustrated in FIG. 20C in including an inverter 302. An input terminal of the inverter 302 is electrically connected to the output terminal of the inverter 301.

In the memory cell with the structure illustrated in FIG. 20D, the inverters 301 and 302 form a buffer. That is, when data corresponding to the charge retained in the capacitor 300 is read, the buffer has a function of correcting the potential of the data, for example, without changing the logic of the data. Accordingly, the memory cell with the structure illustrated in FIG. 20D can read data corresponding to the charge retained in the capacitor 300 accurately.

Figure 21A:
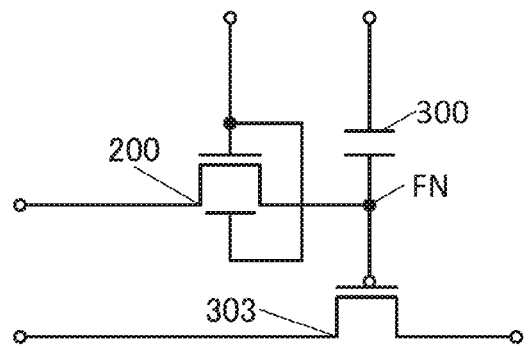
FIGS. 21A to 21C are circuit diagrams each illustrating a structure example of a memory cell.

A memory cell with a structure illustrated in FIG. 21A includes the transistor 200, a transistor 303, and the capacitor 300. The one of the source and the drain of the transistor 200 is electrically connected to the one electrode of the capacitor 300 and a gate of the transistor 303. The gate of the transistor 200 is electrically connected to the back gate of the transistor 200. Note that a node which is electrically connected to the one of the source and the drain of the transistor 200, the one electrode of the capacitor 300, and the gate of the transistor 303 is referred to as a node FN.

Data to be written to the memory cell including the transistor 200 can be input to the other of the source and the drain of the transistor 200. A constant potential can be applied to one of a source and a drain of the transistor 303. Data to be read from the memory cell including the transistor 303 can be output from the other of the source and the drain of the transistor 303.

Although described later in detail, data retained in the memory cell is read through the transistor 303. Accordingly, the transistor 303 is preferably a transistor with a small variation in threshold voltage and the like. Furthermore, the transistor 303 is preferably a transistor with a high on-state current. As such a transistor, an Si transistor can be given. Note that the transistor 303 may include a back gate in addition to the gate. In this case, the gate and the back gate of the transistor 303 may be electrically connected to each other, and the potentials of the gate and the back gate of the transistor 303 may be controlled separately.

Note that although a p-channel transistor is used as the transistor 303 in FIG. 21A, the transistor 303 may be an n-channel transistor.

Since the transistor 200 has an extremely low off-state current, the memory cell with the structure illustrated in FIG. 21A can retain the charge of the node FN for a long period, e.g., a year or more. Accordingly, data can be retained in the memory cell for a long period, e.g., a year or more, even without a refresh operation. With the use of such a feature, writing, retaining, and reading of data can be performed in the following manner. Note that although the description is made on the assumption that the transistor 200 is an n-channel transistor and the transistor 303 is a p-channel transistor, the following description can be referred to also in the case where a p-channel transistor is used as the transistor 200 due to appropriate inversion of the magnitude relation between the potentials, for example. Moreover, the following description can be referred to also in the case where an n-channel transistor is used as the transistor 303.

To begin with, writing of data to the memory cell with the structure illustrated in FIG. 21A and retaining of the data in the memory cell are described. First, a high potential is applied to the gate of the transistor 200 to turn on the transistor 200. Thus, a charge corresponding to data input from the other of the source and the drain of the transistor 200 is written to the node FN. After that, a low potential is applied to the gate of the transistor 200 to turn off the transistor 200. Thus, the charge written to the node FN is retained.

Since the transistor 200 has an extremely low off-state current here, the amount of leakage of the charge written to the node FN through the transistor 200 is extremely small. Accordingly, the magnitude of the potential applied to the gate of the transistor 303 is hardly changed for a long period.

Next, reading of data from the memory cell with the structure illustrated in FIG. 21A is described. When an appropriate potential (a reading potential) is supplied to the other electrode of the capacitor 300 in a state where a predetermined potential (constant potential) is supplied to one of the source and the drain of the transistor 303, the potential applied to the gate of the transistor 303 is changed owing to capacitive coupling with the capacitor 300, so that the value of the drain current flowing through the transistor 303 is changed. By the change in the value of the drain current, the potential applied to the other of the source and the drain of the transistor 303 is also changed. In the case where the transistor 303 is a p-channel transistor as illustrated in FIG. 21A, an apparent threshold voltage $V_{th\_H}$ when a charge corresponding to a high potential is retained in the node FN is lower than an apparent threshold voltage $V_{th\_L}$ when a charge corresponding to a low potential is retained in the node FN. Here, the apparent threshold voltage refers to a potential applied to the other electrode of the capacitor 300, which is needed to turn on the transistor 303. Accordingly, the potential of the other electrode of the capacitor 300 is set at a potential V 0 ($V_{th\_H}$<V 0<$V_{th\_L}$) that has the magnitude between $V_{th\_H}$ and $V_{th\_L}$, whereby it can be determined whether the potential corresponding to the charge written to the node FN is a high potential or a low potential.

In the case where the charge writing to the node FN is a charge corresponding to a low potential, for example, a potential lower than or equal to $V_{th\_L}$ needs to be applied to the gate of the transistor 303 in order to turn on the transistor 303. Although the potential V 0 is also applied to the gate of the transistor 303 owing to capacitive coupling with the capacitor 300 when the potential applied to the other electrode of the capacitor 300 is V 0, V 0 is a potential higher than $V_{th\_H}$, and thus the transistor 303 is kept off. Since the transistor 303 is kept off, the potential applied to the source or the drain of the transistor 303 is hardly changed before and after the application of the potential V 0 to the other electrode of the capacitor 300.

A change in the potential applied to the other of the source and the drain of the transistor 303 is monitored in the above manner, whereby it can be determined whether the charge retained in the node FN is a charge corresponding to a high potential or a charge corresponding to a low potential. Thus, data to be read from the memory cell including the transistor 303 can be output from the other of the source and the drain of the transistor 303. The above is the operation of reading of data from the memory cell with the structure illustrated in FIG. 21A.

Figure 21B:
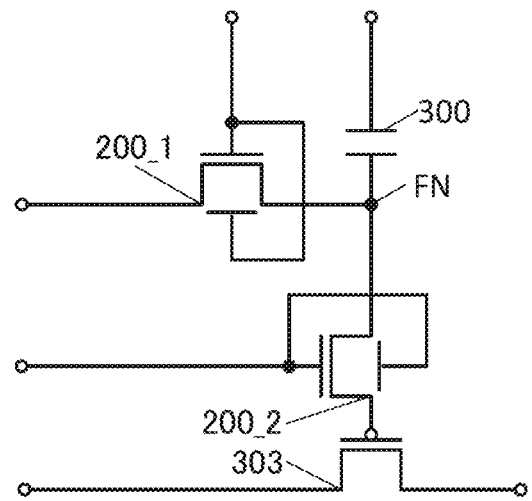

A memory cell with a structure illustrated in FIG. 21B includes the transistor 200_1, the transistor 200_2, the transistor 303, and the capacitor 300. The one of the source and the drain of the transistor 200_1 is electrically connected to the one of the source and the drain of the transistor 200_2 and the one electrode of the capacitor 300. The other of the source and the drain of the transistor 200_2 is electrically connected to the gate of the transistor 303. The gate of the transistor 200_1 is electrically connected to the back gate of the transistor 200_1. The gate of the transistor 200_2 is electrically connected to the back gate of the transistor 200_2. Note that a node which is electrically connected to the one of the source and the drain of the transistor 200_1, the one electrode of the capacitor 300, and the one of the source and the drain of the transistor 2002 is referred to as a node FN.

Data to be written to the memory cell including the transistor 200_1 can be input to the other of the source and the drain of the transistor 200_1. A constant potential can be applied to the one of the source and the drain of the transistor 303. Data to be read from the memory cell including the transistor 303 can be output from the other of the source and the drain of the transistor 303.

Since the transistors 200_1 and 200_2 have an extremely low off-state current, the memory cell with the structure illustrated in FIG. 21B can retain the charge of the node FN for a long period, e.g., a year or more. Accordingly, data can be retained in the memory cell for a long period, e.g., a year or more, even without a refresh operation.

In the memory cell with the structure illustrated in FIG. 21B, a charge is written to the node FN, and then the transistor 200_2 is turned on, whereby data of a potential corresponding to the charge is read and output from the other of the source and the drain of the transistor 303. With the use of the memory cell with the structure illustrated in FIG. 21B, the charge retained in the node FN can be prevented from leaking through the gate of the transistor 303.

Figure 21C:
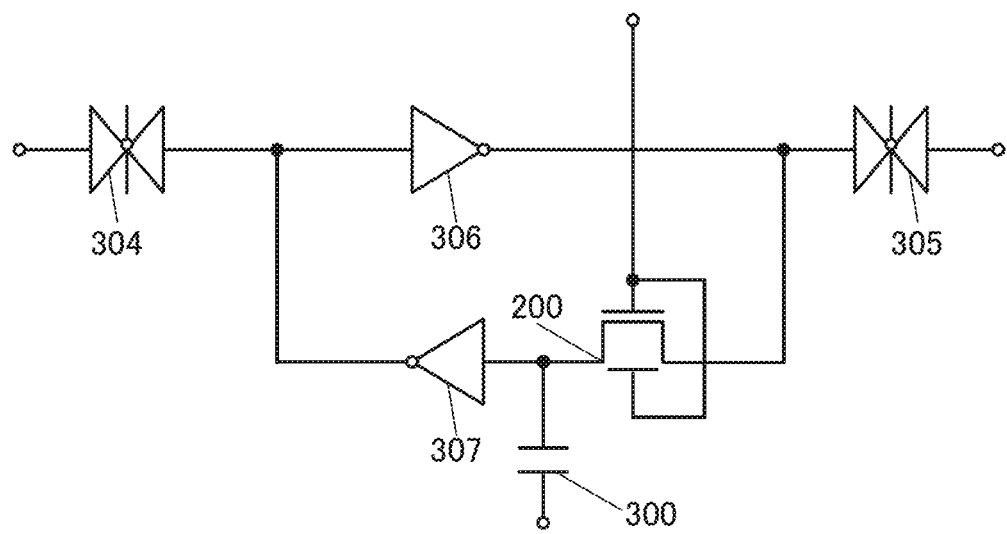

A memory cell with a structure illustrated in FIG. 21C includes the transistor 200, the capacitor 300, a switch 304, a switch 305, an inverter 306, and an inverter 307. The one of the source and the drain of the transistor 200 is electrically connected to the one electrode of the capacitor 300 and an input terminal of the inverter 307. The other of the source and the drain of the transistor 200 is electrically connected to one terminal of the switch 305 and an output terminal of the inverter 306. An output terminal of the inverter 307 is electrically connected to one terminal of the switch 304 and an input terminal of the inverter 306. The gate of the transistor 200 is electrically connected to the back gate of the transistor 200. Note that a low potential, in particular, a ground potential can be applied to the other electrode of the capacitor 300, for example. Data to be written to the memory cell including the switch 304 can be input to the other terminal of the switch 304. Data to be read from the memory cell including the switch 305 can be output from the other terminal of the switch 305.

Each of the switches 304 and 305 can be formed using a CMOS transistor which is a combination of an n-channel transistor and a p-channel transistor. Note that each of the switches 304 and 305 may be formed using only an n-channel transistor or a p-channel transistor.

In the memory cell with the structure illustrated in FIG. 21C, the switch 304 and the transistor 200 are turned on, whereby the logic of data input to the other terminal of the switch 304 is inverted by the inverter 306, so that a charge corresponding to data whose logic has been inverted is written to the capacitor 300.

The transistor 200 is turned off after the charge is written to the capacitor 300, whereby the charge written to the capacitor 300 can be retained. As the off-state current of the transistor 200 is extremely low, the charge written to the capacitor 300 can be retained for a long period, e.g., a year or more, even without a refresh operation.

The switch 305 is turned on after the charge is written to the capacitor 300, whereby data corresponding to the charge retained in the capacitor 300 is output from the other terminal of the switch 305 through the inverters 307 and 306. In this case, the inverters 307 and 306 form a buffer. Accordingly, data corresponding to the charge retained in the capacitor 300 can be read accurately.

Note that when another inverter is added in the memory cell with the structure illustrated in FIG. 21C, the logic of data to be input to the other terminal of the switch 304 can be equal to the logic of data to be output from the other terminal of the switch 305. For example, another inverter can be added such that an input terminal thereof is electrically connected to the other terminal of the switch 305.

Figure 22:
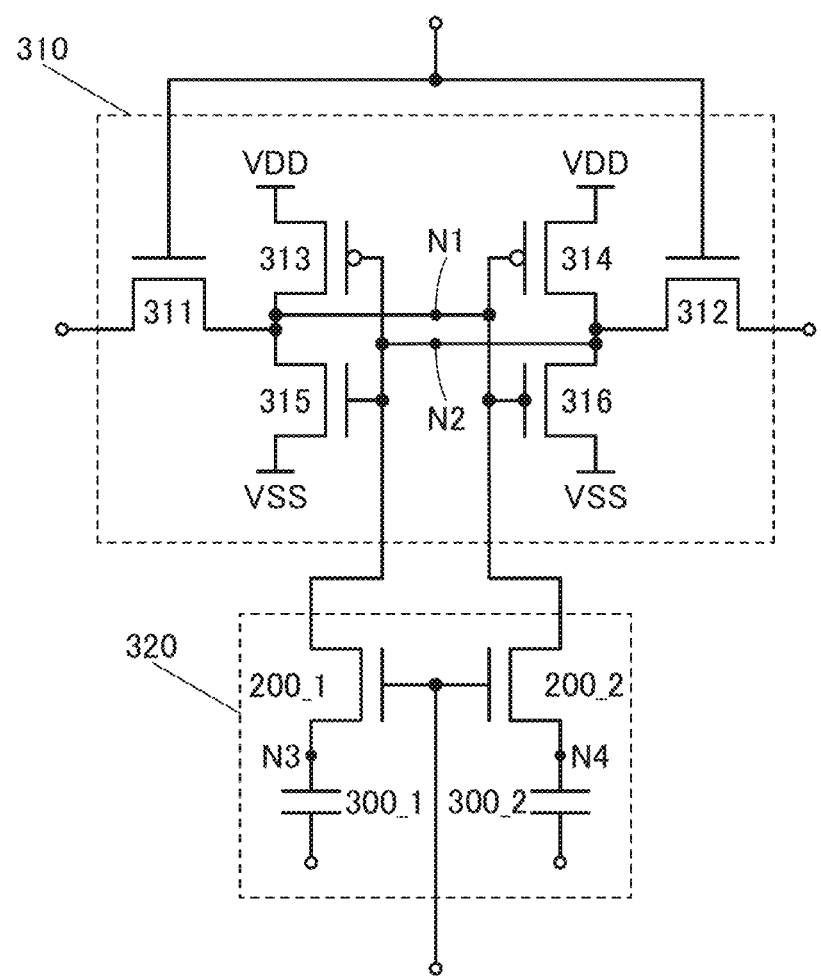
FIG. 22 is a circuit diagram illustrating a structure example of a memory cell.

A memory cell with a structure illustrated in FIG. 22 includes a circuit 310 and a circuit 320. The circuit 310 includes a transistor 311, a transistor 312, a transistor 313, a transistor 314, a transistor 315, and a transistor 316. The transistors 311, 312, 315, and 316 are n-channel transistors. The transistors 313 and 314 are p-channel transistors. Note that the transistors 311 and 312 may be p-channel transistors.

One of a source and a drain of the transistor 311 is electrically connected to one of a source and a drain of the transistor 313, one of a source and a drain of the transistor 315, a gate of the transistor 314, and a gate of the transistor 316. A gate of the transistor 311 is electrically connected to a gate of the transistor 312. One of a source and a drain of the transistor 312 is electrically connected to one of a source and a drain of the transistor 314, one of a source and a drain of the transistor 316, a gate of the transistor 313, and a gate of the transistor 315.

A high power supply potential (VDD) can be applied to the other of the source and the drain of the transistor 313 and the other of the source and the drain of the transistor 314, for example. A low power supply potential (VSS) can be applied to the other of the source and the drain of the transistor 315 and the other of the source and the drain of the transistor 316, for example. A high potential or a low potential can be applied to the gate of the transistor 311 and the gate of the transistor 312, for example. Thus, the on/off of the transistors 311 and 312 can be controlled.

Note that a node electrically connected to the gate of the transistor 313 and the gate of the transistor 315 is referred to as a node N2, and a node electrically connected to the gate of the transistor 314 and the gate of the transistor 316 is referred to as a node N1.

Data to be written to the memory cell including the transistors 311 and 312 can be input to the other of the source and the drain of the transistor 311 and the other of the source and the drain of the transistor 312. Data to be read from the memory cell including the transistors 311 and 312 can be output from the other of the source and the drain of the transistor 311 and the other of the source and the drain of the transistor 312. Note that data to be input to the other of the source and the drain of the transistor 312 can be complementary data (data obtained by inversion of a logic) of data input to the other of the source and the drain of the transistor 311. Furthermore, data to be output from the other of the source and the drain of the transistor 312 can be complementary data of data to be output from the other of the source and the drain of the transistor 311.

In above manner, the circuit 310 has the structure of an SRAM cell, which is a volatile memory. A charge corresponding to data to be input to the other of the source and the drain of the transistor 311 can be retained in the node N1. A charge corresponding to data to be input to the other of the source and the drain of the transistor 312 can be retained in the node N2.

The circuit 320 includes the transistor 200_1, the transistor 200_2, a capacitor 300_1, and a capacitor 300_2.

The one of the source and the drain of the transistor 200_1 is electrically connected to the node N2. The other of the source and the drain of the transistor 200_1 is electrically connected to one electrode of the capacitor 300_1. The gate of the transistor 200_1 is electrically connected to the gate of the transistor 200_2. The one of the source and the drain of the transistor 200_2 is electrically connected to the node N1. The other of the source and the drain of the transistor 200_2 is electrically connected to one electrode of the capacitor 300_2. Note that a low potential, in particular, a ground potential can be applied to the other electrode of the capacitor 300_1 and the other electrode of the capacitor 300_2, for example. A high potential or a low potential can be applied to the gate of the transistor 200_1 and the gate of the transistor 200_2, for example. Thus, the on/off of the transistors 200_1 and 200_2 can be controlled.

Note that a node electrically connected to the other of the source and the drain of the transistor 200_1 and the one electrode of the capacitor 300_1 is referred to as a node N3, and a node electrically connected to the other of the source and the drain of the transistor 200_2 and the one electrode of the capacitor 300_2 is referred to as a node N4.

The node N1 where a charge corresponding to data input to the other of the source and the drain of the transistor 311 is retained is connected to the node N4 through the transistor 200_2. The node N2 where a charge corresponding to data input to the other of the source and the drain of the transistor 312 is retained is connected to the node N3 through the transistor 200_1. Thus, the data retained in the circuit 310, which has the structure of an SRAM cell, can be saved in the circuit 320. Furthermore, the data that has been saved can be restored to the circuit 310.

Specifically, in a period during which writing and reading of data are not performed in the circuit 310, a high potential is applied to the gate of the transistor 200_1 and the gate of the transistor 200_2 to turn on the transistor 200_1 and the transistor 200_2. Thus, a charge retained in the node N1 can be saved in the node N4, and a charge retained in the node N2 can be saved in the node N3. After that, a low potential is applied to the gate of the transistor 200_1 and the gate of the transistor 200_2 to turn off the transistor 200_1 and the transistor 200_2. Thus, the charges of the nodes N3 and N4 can be retained. Moreover, a high potential is applied to the gate of the transistor 200_1 and the gate of the transistor 200_2 again to turn on the transistor 200_1 and the transistor 200_2, whereby the charge saved in the node N3 can be restored to the node N2, and the charge saved in the node N4 can be restored to the node N1. By making the high power supply potential VDD high at the time of saving of data retained in the circuit 310 to the circuit 320 and making the high power supply potential VDD low at the time of restoration of data saved in the circuit 320 to the circuit 310, data saving and restoration can be performed more stably.

As described above, the off-state current of each of the transistors 200_1 and 200_2 is extremely low. Thus, when the transistors 200_1 and 200_2 are in an off state, the charges of the nodes N3 and N4 can be retained for a long period. Accordingly, immediately before power supply to the memory cell with the structure illustrated in FIG. 22 is stopped, the charge retained in the node N1 is saved in the node N4, and the charge retained in the node N2 is saved in the node N3, whereby the charges written to the nodes N1 and N2 can continue to be retained even when the power supply to the memory cell is stopped. Then, after the power supply to the memory cell is started, the charges retained in the nodes N3 and N4 can be restored to the nodes N1 and N2.

Note that since the circuit 310 has the structure of a SRAM cell, a high-speed operation is required for the circuit 310. Thus, each of the transistors 311 to 316 is preferably a transistor with a high on-state current. As each of the transistors 311 to 316, an Si transistor is preferably used, for example.

Furthermore, in a period during which power is supplied to the memory cell with the structure illustrated in FIG. 22 and the circuit 310 is operated, the transistors 200_1 and 200_2 are preferably in an off state. This can prevent a hindrance to a high-speed operation of the circuit 310.

Note that although an example in which the circuit 320 includes the transistor 200_1 and the transistor 200_2, the capacitor 300_1, the capacitor 300_2 is illustrated in FIG. 22, a structure in which the transistor 200_1 and the capacitor 300_1 are omitted may be employed, and a structure in which the transistor 200_2 and the capacitor 300_2 are omitted may be employed.

Although the circuit 310 has the structure of a SRAM in FIG. 22, a different volatile memory may be used. Even in the case where the circuit 310 includes a different volatile memory, provision of the circuit 320 enables data to be saved and restored.

In the above manner, in the memory cell with the structure illustrated in FIG. 22, data written to the circuit 310 is saved and retained in the circuit 320; thus, the data can be retained even in a period during which power is not supplied to the memory cell. Furthermore, after the power supply is restarted, the data retained in the circuit 320 can be restored to the circuit 310.

<Structure Example of Memory Device 11>

Figure 23:
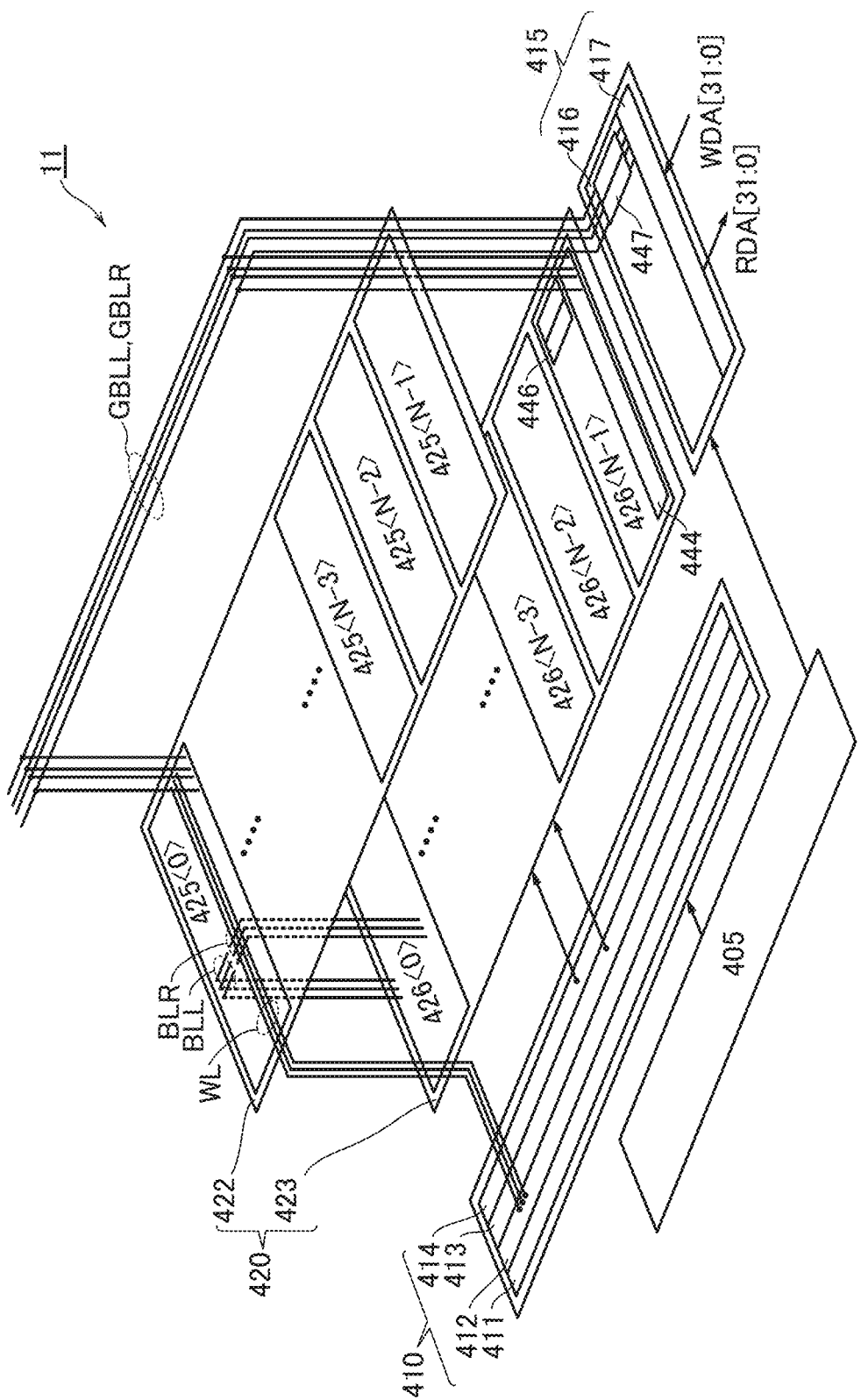
FIG. 23 is a block diagram illustrating a structure example of a memory device.

Next, a structure example of the memory device 11 is described. FIG. 23 is a block diagram illustrating a structure example of the memory device 11.

The memory device 11 includes a controller 405, a row circuit 410, a column circuit 415, and a memory cell and sense amplifier array 420 (hereinafter referred to as MC-SA array 420).

The row circuit 410 includes a decoder 411, a word line driver circuit 412, a column selector 413, and a sense amplifier driver circuit 414. The column circuit 415 includes a global sense amplifier array 416 and an input/output circuit 417. The global sense amplifier array 416 includes a plurality of global sense amplifiers 447. The MC-SA array 420 includes a memory cell array 422, a sense amplifier array 423, and global bit lines GBLL and GBLR.

[MC-SA Array 420]

The MC-SA array 420 has a stacked-layer structure where the memory cell array 422 is stacked over the sense amplifier array 423. The global bit lines GBLL and GBLR are stacked over the memory cell array 422. The memory device 11 can adopt a hierarchical bit line structure, where the bit lines are layered into local and global bit lines.

Figure 24A:
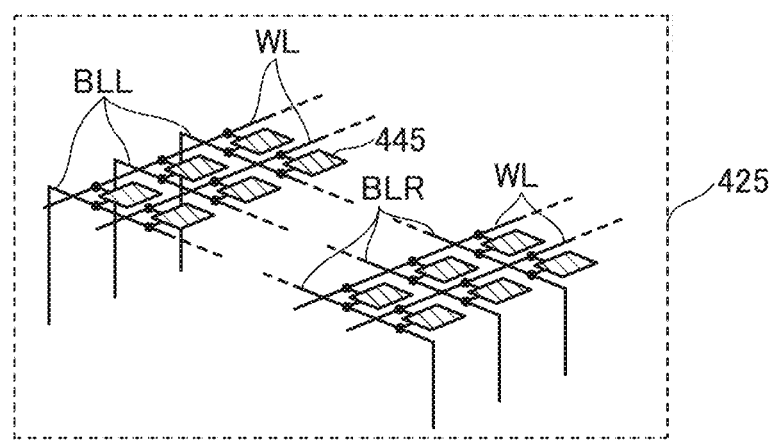
FIG. 24A is a block diagram illustrating a structure example of a memory cell array.

The memory cell array 422 includes N local memory cell arrays 425<0> to 425<N−1>, where N is an integer greater than or equal to 2. FIG. 24A illustrates a structure example of the local memory cell array 425. In the local memory cell array 425, a plurality of memory cells 445 are arranged in a matrix. Moreover, the local memory cell array 425 includes a plurality of word lines WL, a plurality of bit lines BL, and a plurality of bit lines BLR. In the example in FIG. 24A, the local memory cell array 425 has an open bit-line architecture but may have a folded bit-line architecture.

Figure 24B:
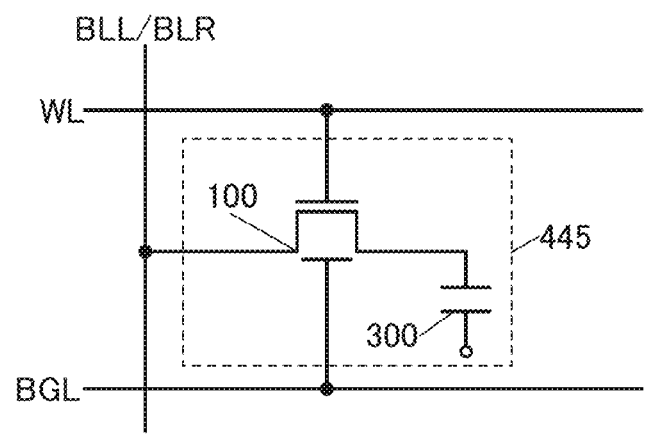
FIG. 24B is a circuit diagram illustrating a structure example of a memory cell.

FIG. 24B illustrates a circuit structure example of the memory cell 445. The memory cell 445 includes the transistor 100 and the capacitor 300. One of a source and a drain of the transistor 100 is electrically connected to the one electrode of the capacitor 300. The other of the source and the drain of the transistor 100 is electrically connected to the bit line BLL or BLR. A gate of the transistor 100 is electrically connected to the word line WL. The back gate of the transistor 100 is electrically connected to a wiring BGL.

Note that a low potential, in particular, a ground potential can be applied to the other electrode of the capacitor 300, for example. The transistor 100 with any of the structures illustrated in FIGS. 5A to 5B2 to FIGS. 10A to 10B2 can be used as the transistor 100.

The on/off of the transistor 100 can be controlled by a potential applied to the word line WL. In the case where the transistor 100 is an n-channel transistor, for example, the transistor 100 is turned on by application of a high potential to the gate of the transistor 100, and the transistor 100 is turned off by application of a low potential to the gate of the transistor 100. When the transistor 100 is turned on, a charge corresponding to data input to the bit line BLL or BLR is written to the capacitor 300.

When the transistor 100 is turned off after the charge is written to the capacitor 300, the charge written to the capacitor 300 can be retained. The off-state current of the transistor 100 is lower than that of an Si transistor or the like, and thus the frequency of refresh operation can be reduced. Accordingly, the power consumption of the semiconductor device of one embodiment of the present invention can be reduced.

When the transistor 100 is turned on in a state where the charge is retained in the capacitor 300, data corresponding to the charge retained in the capacitor 300 is read and output from the bit line BLL or BLR.

By control of the potential of the wiring BGL, the potential applied to the back gate of the transistor 100 can be controlled. That is, the threshold voltage of the transistor 100 can be controlled by the potential of the wiring BGL. For example, in the case where the transistor 100 is in an on state, the potential of the wiring BGL is set at a positive potential, and in the case where the transistor 100 is in an off state, the potential of the wiring BGL is set at a negative potential. In this manner, the on-state current of the transistor 100 can be increased, and the off-state current of the transistor 100 can be reduced. The potential of the wiring BGL may be fixed at a positive potential or a negative potential, for example. In this case, the potential applied to the back gate can be controlled easily.

Note that the structure example of the memory cell 445 is not limited to the structure illustrated in FIG. 24B. For example, the transistor 100 is replaced with any of the transistor 200, the transistor 200_1, and the transistor 200_2, whereby any of the memory cells with the structures illustrated in FIGS. 20B to 20D, FIGS. 21A to 21C, and FIG. 22 can be used as the memory cell 445.

The sense amplifier array 423 includes N local sense amplifier arrays 426<0> to 426<N−1>. The local sense amplifier array 426 includes one switch array 444 and a plurality of sense amplifiers 446. A bit line pair is electrically connected to the sense amplifier 446. The sense amplifier 446 has a function of precharging the bit line pair, amplifying a difference between the potentials of the bit line pair, and retaining the potential difference. The switch array 444 has a function of selecting a bit line pair and electrically connecting the selected bit line pair and a global bit line pair to each other.

Here, a bit line pair refers to two bit lines which are compared by a sense amplifier at the same time. A global bit line pair refers to two global bit lines which are compared by a global sense amplifier at the same time. A bit line pair can be referred to as a pair of bit lines, and a global bit line pair can be referred to as a pair of global bit lines. Here, a bit line BLL and a bit line BLR form one bit line pair. The global bit line GBLL and the global bit line GBLR form one global bit line pair. In the description hereinafter, the expressions "bit line pair (BLL, BLR)" and "global bit line pair (GBLL, GBLR)" are also used.

[Controller 405]

The controller 405 has a function of controlling the entire operation of the memory device 11. The controller 405 has a function of performing logic operation on a command signal that is input from the outside and determining an operation mode, a function of generating control signals for the row circuit 410 and the column circuit 415 so that the determined operation mode is executed, a function of retaining an address signal that is input from the outside, and a function of generating an internal address signal.

[Row Circuit 410]

The row circuit 410 has a function of driving the MC-SA array 420. The decoder 411 has a function of decoding an address signal. The word line driver circuit 412 generates a selection signal for selecting the word line WL of a row that is to be accessed.

The column selector 413 and the sense amplifier driver circuit 414 are circuits for driving the sense amplifier array 423. The column selector 413 has a function of generating a selection signal for selecting the bit line of a column that is to be accessed. The selection signal from the column selector 413 controls the switch array 444 of each local sense amplifier array 426. The control signal from the sense amplifier driver circuit 414 drives each of the plurality of local sense amplifier arrays 426 independently.

[Column Circuit 415]

The column circuit 415 has a function of controlling the input of data signals WDA[31:0], and a function of controlling the output of data signals RDA[31:0]. The data signals WDA[31:0] are write data signals, and the data signals RDA[31:0] are read data signals.

The global sense amplifier 447 is electrically connected to the global bit line pair (GBLL, GBLR). The global sense amplifier 447 has a function of amplifying a difference between the potentials of the global bit line pair (GBLL, GBLR) and a function of retaining the potential difference. The input/output circuit 417 writes and reads data to and from the global bit line pair (GBLL, GBLR).

The write operation of the memory device 11 is briefly described. Data are written to the global bit line pair by the input/output circuit 417. The data of the global bit line pair is retained by the global sense amplifier array 416. By the switch array 444 of the local sense amplifier array 426 specified by an address signal, the data of the global bit line pair is written to the bit line pair of a column where data is to be written. The local sense amplifier array 426 amplifies the written data, and then retains the amplified data. In the specified local memory cell array 425, the word line WL of the row where data is to be written is selected by the row circuit 410, and the data retained at the local sense amplifier array 426 is written to the memory cell 445 of the selected row.

The read operation of the memory device 11 is briefly described. One row of the local memory cell array 425 is specified with the address signal. In the specified local memory cell array 425, the word line WL of a row where data is to be read is selected, and data of the memory cell 445 is written to the bit line. The local sense amplifier array 426 detects a potential difference in the bit line pair in each column as data, and retains the data. The switch array 444 writes the data of a column specified by the address to the global bit line pair; the data is chosen from the data retained at the local sense amplifier array 426. The global sense amplifier array 416 determines and retains the data of the global bit line pair. The data retained at the global sense amplifier array 416 is output to the input/output circuit 417. Thus, the read operation is completed.

The memory device 11 has no limitations on the number of rewrites in principle and data can be read and written with low power consumption, because data are rewritten by charging and discharging the capacitor 300. Owing to a simple circuit configuration of the memory cell 445, the capacity can be easily increased.

Since the MC-SA array 420 has a stacked-layer structure, the bit line can be shortened to a length that is close to the length of the local sense amplifier array 426. A shorter bit line result in lower bit line capacitance, which allows the storage capacitance of the memory cell 445 to be reduced. In addition, providing the switch array 444 on the local sense amplifier array 426 allows the number of long bit lines to be reduced. For the above reasons, a load to be driven during access to the memory device 11 is reduced, enabling a reduction in power consumption of the semiconductor device of one embodiment of the present invention.

The structures, methods, and the like described in this embodiment can be combined as appropriate with any of the structures, methods, and the like described in the other embodiments.

Embodiment 2

In this embodiment, a structure example of an arithmetic device included in the semiconductor device of one embodiment of the present invention is described.

<Structure of CPU>

Figure 25:
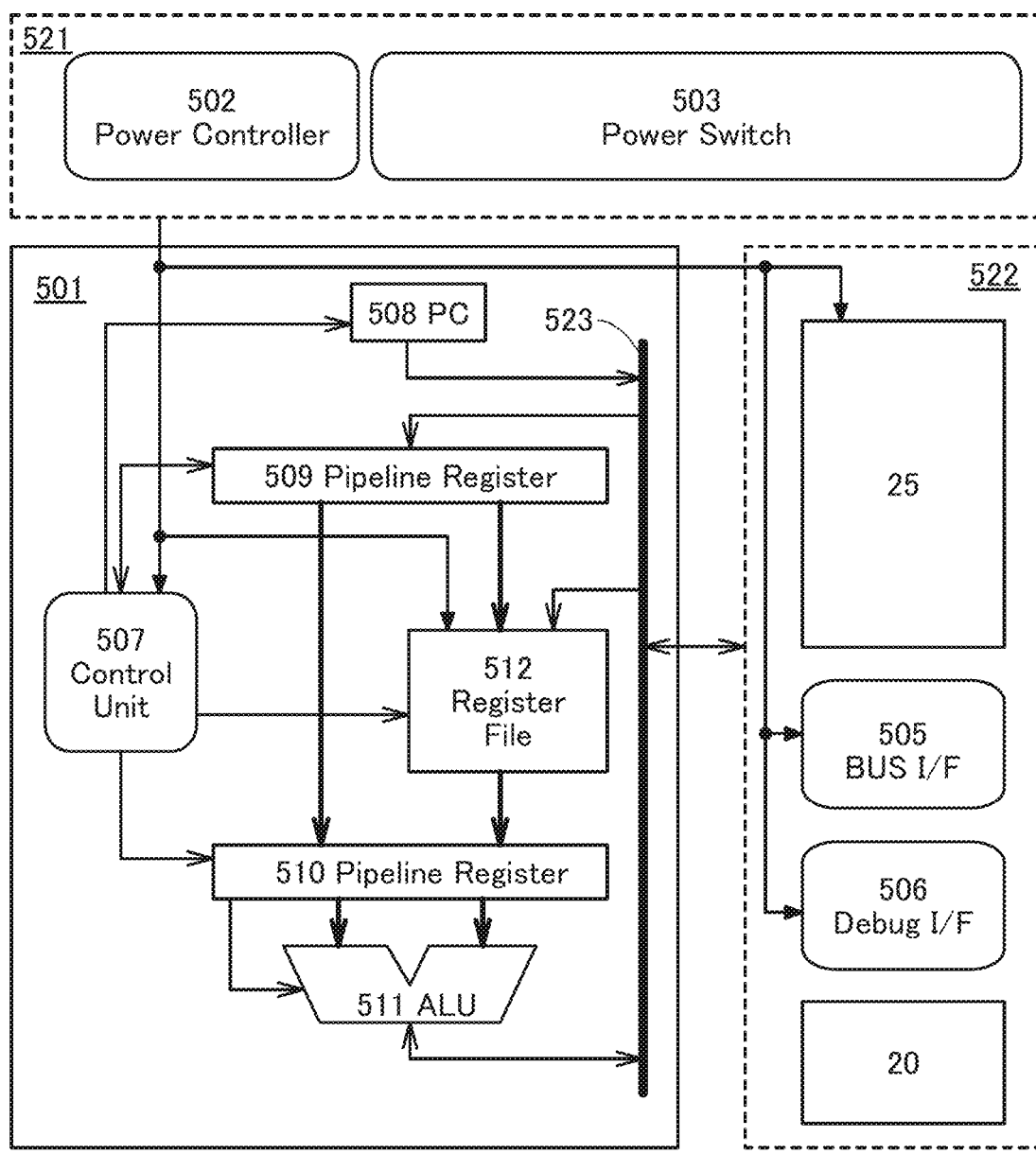
FIG. 25 is a block diagram illustrating a structure example of an arithmetic device.

FIG. 25 is a block diagram illustrating a structure example of the arithmetic device 21 described in Embodiment 1. The description is made below on the assumption that the arithmetic device 21 is a CPU.

The arithmetic device 21 illustrated in FIG. 25 includes a CPU core 501, a power management unit 521, and a peripheral circuit 522. The power management unit 521 includes a power controller 502 and a power switch 503. The peripheral circuit 522 includes a bus interface (BUS I/F) 505, and a debug interface (Debug I/F) 506 in addition to the memory units 20 and 25 described in Embodiment 1. The CPU core 501 includes a data bus 523, a control unit 507, a program counter (PC) 508, a pipeline register 509, a pipeline register 510, an arithmetic logic unit (ALU) 511, and a register file 512. Data is transmitted between the CPU core 501 and the peripheral circuit 522 such as the memory unit 25 via the data bus 523.

The memory unit 20 may be provided in the bus interface 505 or the debug interface 506. Alternatively, the memory unit 20 may be provided in the CPU core 501 or the power management unit 521.

The control unit 507 has functions of totally controlling operations of the PC 508, the pipeline register 509, the pipeline register 510, the ALU 511, the register file 512, the memory unit 25, the bus interface 505, the debug interface 506, and the power controller 502; and decoding and executing instructions contained in a program such as input applications.

The ALU 511 has a function of performing a variety of arithmetic operations such as four arithmetic operations and logic operations.

The memory unit 25 has a function of temporarily storing frequently used data. The PC 508 is a register having a function of storing an address of an instruction to be executed next. Although not illustrated in FIG. 25, the memory unit 25 includes a controller for controlling the operation of the cache memory.

The pipeline register 509 has a function of temporarily storing instruction data.

The register file 512 includes a plurality of registers including a general purpose register and can store data that is read from a main memory, data obtained as a result of arithmetic operations in the ALU 511, or the like.

The pipeline register 510 has a function of temporarily storing data used for arithmetic operations performed in the ALU 511, data obtained as a result of arithmetic operations in the ALU 511, or the like.

The bus interface 505 functions as a path for data between the arithmetic device 21 and devices outside the arithmetic device 21. The debug interface 506 functions as a path of a signal for inputting an instruction to control debugging to the arithmetic device 21.

The power switch 503 has a function of controlling power supply to circuits other than the power controller 502 in the arithmetic device 21. These circuits belong to several different power domains. The power switch 503 controls whether the power is supplied to circuits in the same power domain. The power controller 502 has a function of controlling the operation of the power switch 503.

The arithmetic device 21 having the above structure can perform power gating. A description is given of an example of the power gating operation sequence.

First, the CPU core 501 sets the timing for stopping the power supply in a register of the power controller 502. Next, an instruction to start power gating is sent from the CPU core 501 to the power controller 502. Then, various registers and the memory unit 25 included in the arithmetic device 21 start data saving. Subsequently, the power switch 503 stops the power supply to the circuits other than the power controller 502 in the arithmetic device 21. Then, an interrupt signal is input to the power controller 502, thereby starting the power supply to the circuits included in the arithmetic device 21. Note that a counter may be provided in the power controller 502 to be used to determine the timing of starting the power supply regardless of input of an interrupt signal. Next, the various registers and the memory unit 25 start data restoration. After that, execution of an instruction is resumed in the control unit 507.

Such power gating can be performed in the whole processor or one or a plurality of logic circuits forming the processor. Furthermore, power supply can be stopped even for a short time. Accordingly, power consumption can be reduced at a fine granularity in space or time.

In performing power gating, data retained by the CPU core 501 or the peripheral circuit 522 is preferably saved in a short time. In that case, the power can be turned on or off in a short time, and an effect of saving power becomes significant.

In order that the data retained by the CPU core 501 or the peripheral circuit 522 be saved in a short time, the data is preferably saved in a flip-flop circuit itself (referred to as a flip-flop circuit capable of backup operation). Furthermore, the data is preferably saved in an SRAM cell itself (referred to as an SRAM cell capable of backup operation). The flip-flop circuit or the SRAM cell which are capable of backup operation preferably includes an OS transistor, in particular, the transistor 100 described in Embodiment 1. Consequently, the transistor has a low off-state current; thus, the flip-flop circuit and SRAM cell which are capable of backup operation can retain data for a long time without power supply. When the transistor has a high switching speed, the flip-flop circuit and SRAM cell which are capable of backup operation can save and restore data in a short time in some cases.

Figure 26:
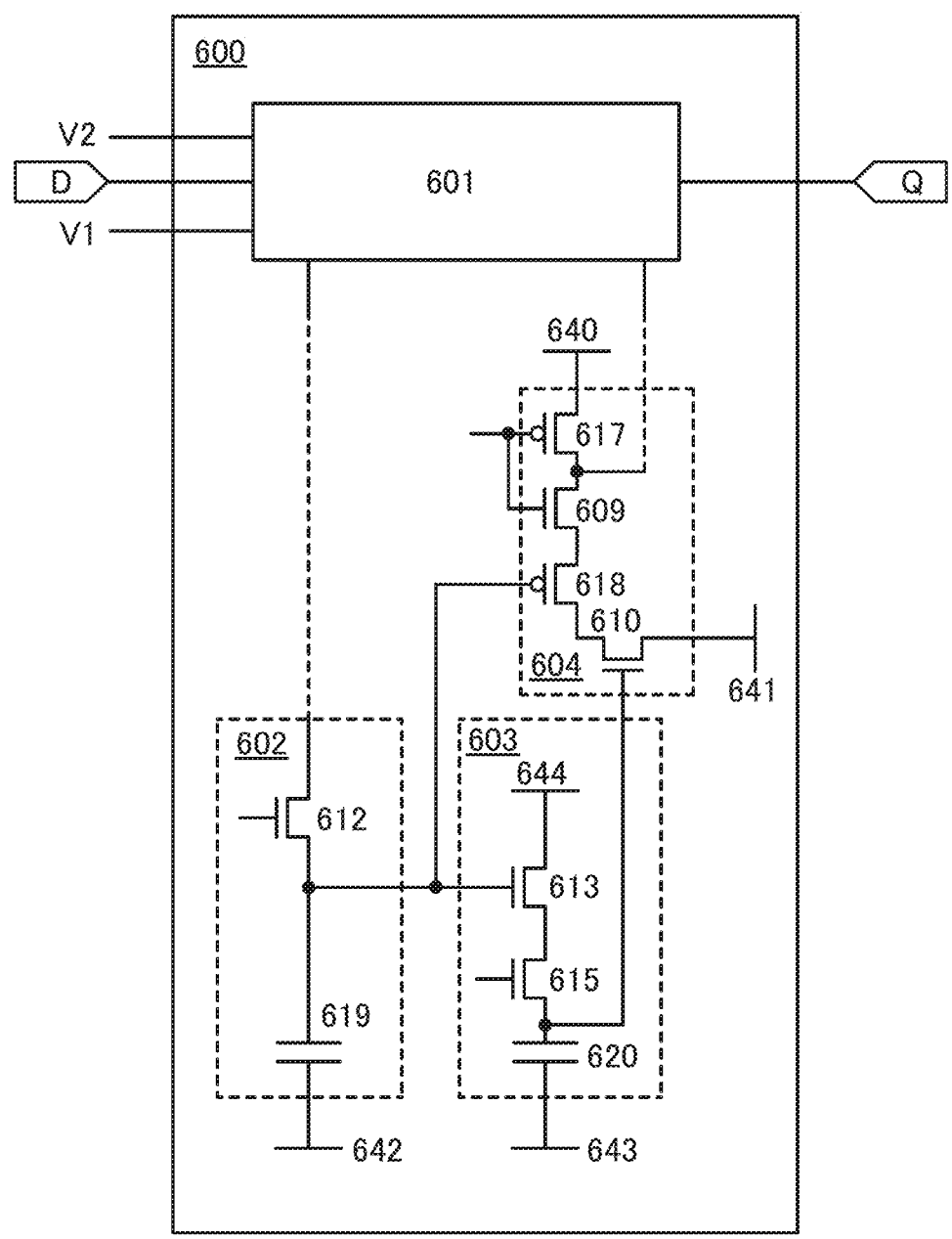
FIG. 26 is a circuit diagram illustrating a structure example of an arithmetic device.

FIG. 26 is a circuit diagram illustrating a structure example of a flip-flop circuit 600 capable of backup operation. The flip-flop circuit 600 includes a first memory circuit 601, a second memory circuit 602, a third memory circuit 603, and a reading circuit 604. A potential difference between a potential V1 and a potential V2 is supplied to the flip-flop circuit 600 as a power supply potential. One of the potentials V1 and V2 is a high potential, and the other is a low potential. The structure example of the flip-flop circuit 600 is described below by taking the case where the potential V1 is a low potential and the potential V2 is a high potential as an example.

The first memory circuit 601 has a function of retaining data when a signal D including the data is input in a period during which the power supply potential is supplied to the flip-flop circuit 600. Furthermore, the first memory circuit 601 outputs a signal Q including the retained data in the period during which the power supply potential is supplied to the flip-flop circuit 600. On the other hand, the first memory circuit 601 cannot retain data in a period during which the power supply potential is not supplied to the flip-flop circuit 600. That is, the first memory circuit 601 can be referred to as a volatile memory circuit.

The second memory circuit 602 has a function of reading data retained in the first memory circuit 601 to store (or save) it. The third memory circuit 603 has a function of reading the data retained in the second memory circuit 602 to store (or save) it. The reading circuit 604 has a function of reading the data retained in the second memory circuit 602 or the third memory circuit 603 to store (or restore) it in (to) the first memory circuit 601.

In particular, the third memory circuit 603 has a function of reading the data retained in the second memory circuit 602 to store (or save) it even in the period during which the power supply potential is not supplied to the flip-flop circuit 600.

As illustrated in FIG. 26, the second memory circuit 602 includes a transistor 612 and a capacitor 619. The third memory circuit 603 includes a transistor 613, a transistor 615, and a capacitor 620. The reading circuit 604 includes a transistor 610, a transistor 618, a transistor 609, and a transistor 617.

The transistor 612 has a function of charging and discharging the capacitor 619 in accordance with data retained in the first memory circuit 601. The transistor 612 is preferably capable of charging and discharging the capacitor 619 at a high speed in accordance with data retained in the first memory circuit 601. Specifically, the transistor 612 preferably includes crystalline silicon (preferably polycrystalline silicon, further preferably single crystal silicon) in a channel formation region.

The on/off of the transistor 613 is controlled in accordance with a charge retained in the capacitor 619. The transistor 615 has a function of charging and discharging the capacitor 620 in accordance with the potential of a wiring 644 when the transistor 613 is in an on state.

Specific connection relations between the elements are described. One of a source and a drain of the transistor 612 is connected to the first memory circuit 601. The other of the source and the drain of the transistor 612 is electrically connected to one electrode of the capacitor 619, a gate of the transistor 613, and a gate of the transistor 618. The other electrode of the capacitor 619 is connected to a wiring 642. One of a source and a drain of the transistor 613 is connected to the wiring 644. The other of the source and the drain of the transistor 613 is connected to one of a source and a drain of the transistor 615. The other of the source and the drain of the transistor 615 is electrically connected to one electrode of the capacitor 620 and a gate of the transistor 610. The other electrode of the capacitor 620 is connected to a wiring 643. One of a source and a drain of the transistor 610 is connected to a wiring 641. The other of the source and the drain of the transistor 610 is connected to one of a source and a drain of the transistor 618. The other of the source and the drain of the transistor 618 is connected to one of a source and a drain of the transistor 609. The other of the source and the drain of the transistor 609 is connected to one of a source and a drain of the transistor 617 and the first memory circuit 601. The other of the source and the drain of the transistor 617 is connected to a wiring 640. Although a gate of the transistor 609 is connected to a gate of the transistor 617 in FIG. 26, it is not necessarily connected to the gate of the transistor 617.

As the transistor 615, an OS transistor, in particular, the transistor 100 described in Embodiment 1 can be used. Because of the low off-state current of the transistor 615, the flip-flop circuit 600 can retain data for a long period without power supply. The favorable switching characteristics of the transistor 615 allow the flip-flop circuit 600 to perform high-speed backup and recovery.

The structures, methods, and the like described in this embodiment can be combined as appropriate with any of the structures, methods, and the like described in the other embodiments.

Embodiment 3

In this embodiment, one mode of a semiconductor device of one embodiment of the present invention is described with reference to FIGS. 27A and 27B and FIGS. 28A and 28B.

<Semiconductor Wafer and Chip>

Figure 27A:
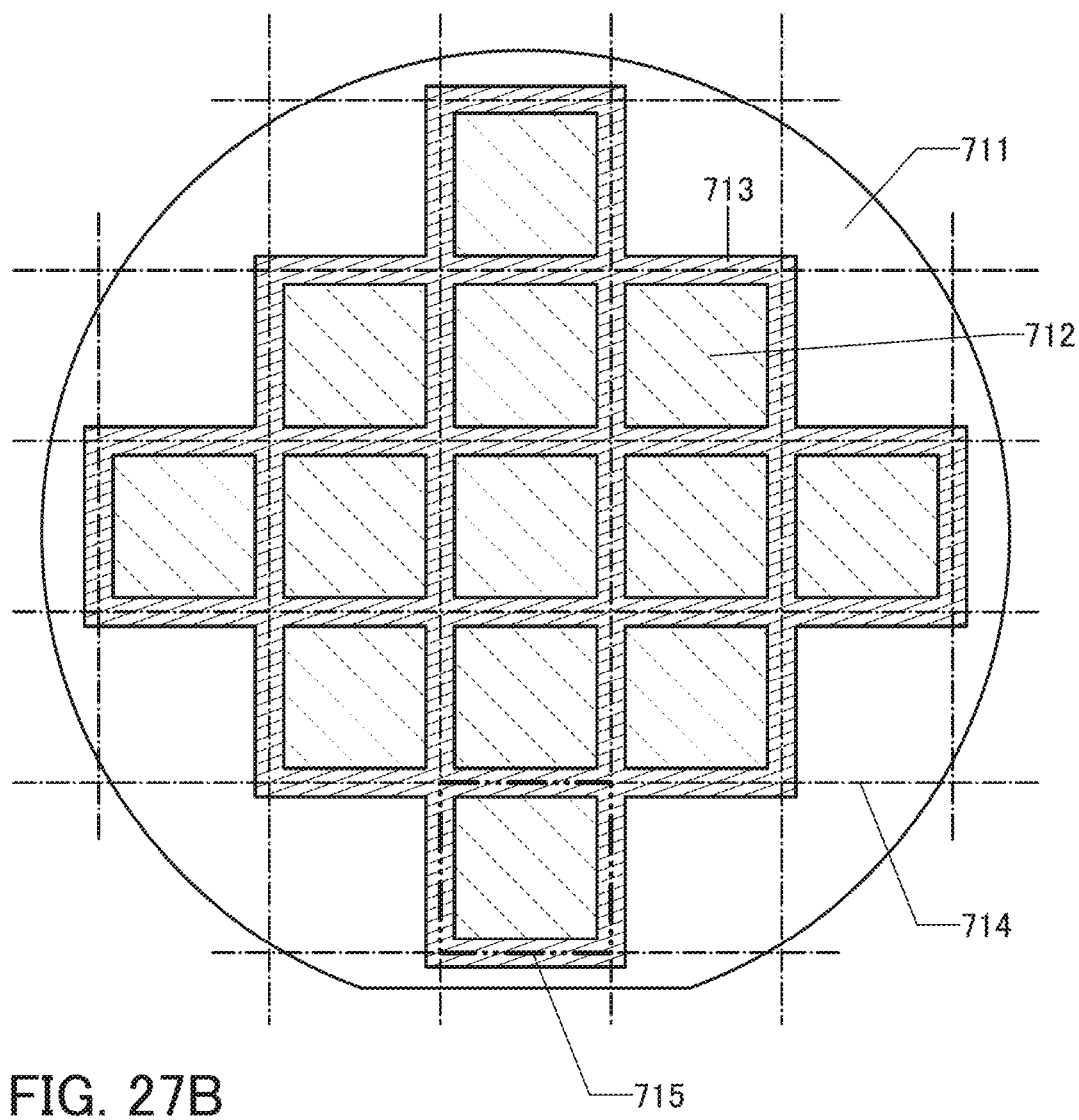
FIGS. 27A and 27B are top views of a semiconductor wafer.

FIG. 27A is a top view of a substrate 711 before dicing treatment. As the substrate 711, a semiconductor substrate (also referred to as a "semiconductor wafer") can be used, for example. A plurality of circuit regions 712 are provided over the substrate 711. A semiconductor device of one embodiment of the present invention or the like can be provided in the circuit region 712.

Figure 27B:
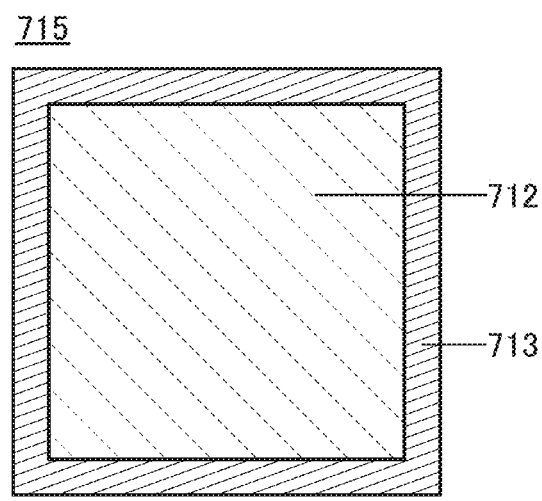

Each of the circuit regions 712 is surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 27B is an enlarged view of the chip 715.

A conductor, a semiconductor, or the like may be provided in the separation regions 713. Providing a conductor, a semiconductor, or the like in the separation regions 713 relieves ESD that might be caused in a dicing step, preventing a decrease in the yield of the dicing step. A dicing step is generally performed while pure water whose specific resistance is decreased by dissolution of a carbonic acid gas or the like is supplied to a cut portion, in order to cool down the substrate, remove swarf, and prevent electrification, for example. Providing a conductor, a semiconductor, or the like in the separation regions 713 allows a reduction in the usage of the pure water. Thus, the cost of manufacturing semiconductor devices can be reduced. In addition, semiconductor devices can be manufactured with improved productivity.

<Electronic Component>

Figure 28A:
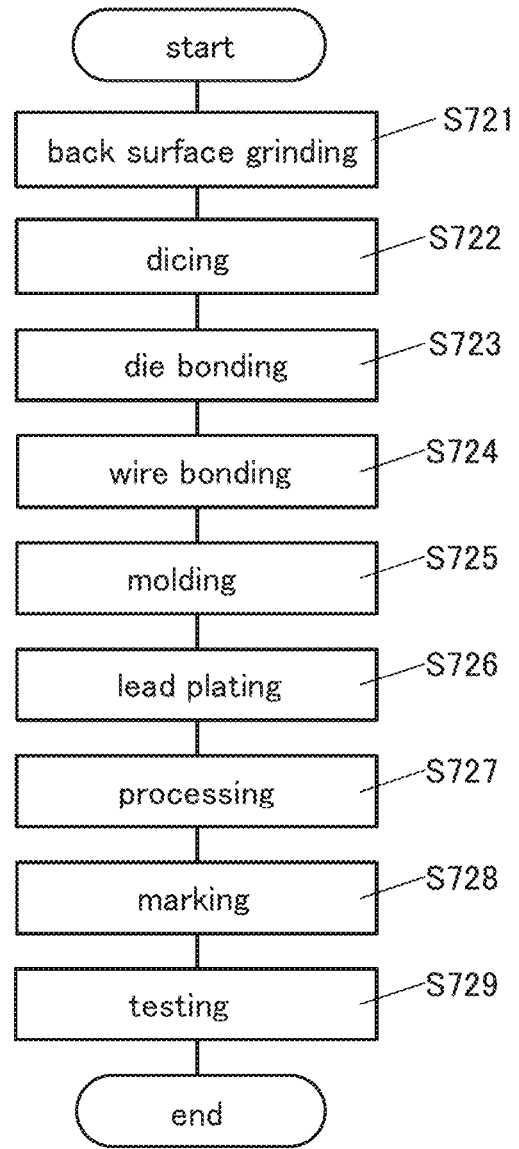
FIG. 28A is a flow chart showing an example of a method for manufacturing electronic components.

An example of an electronic component using the chip 715 is described with reference to FIGS. 28A and 28B. Note that an electronic component is also referred to as a semiconductor package or an IC package. For electronic components, there are various standards, names, and the like in accordance with the direction in which terminals are extracted, the shapes of terminals, and the like.

The electronic component is completed when the semiconductor device described in any of the above embodiments is combined with components other than the semiconductor device in an assembly process (post-process).

The post-process is described with reference to a flow chart in FIG. 28A. After the semiconductor device of one embodiment of the present invention and the like are formed over the substrate 711 in a pre-process, a back surface grinding step in which the back surface (the surface where a semiconductor device and the like are not formed) of the substrate 711 is ground is performed (Step S721). When the substrate 711 is thinned by grinding, the size of the electronic component can be reduced.

Next, the substrate 711 is divided into a plurality of chips 715 in a dicing step (Step S722). Then, the divided chips 715 are individually bonded to a lead frame in a die bonding step (Step S723). To bond the chip 715 and a lead frame in the die bonding step, a method such as resin bonding or tape-automated bonding is selected as appropriate depending on products. Note that the chip 715 may be bonded to an interposer substrate instead of the lead frame.

Next, a wire bonding step for electrically connecting a lead of the lead frame and an electrode on the chip 715 through a metal wire is performed (Step S724). As the metal wire, a silver wire, a gold wire, or the like can be used. Ball bonding or wedge bonding can be used as the wire bonding.

The wire-bonded chip 715 is subjected to a molding step of sealing the chip with an epoxy resin or the like (Step S725). Through the molding step, the inside of the electronic component is filled with a resin, so that a wire for connecting the chip 715 to the lead can be protected from external mechanical force, and deterioration of characteristics (decrease in reliability) due to moisture or dust can be reduced.

Subsequently, the lead of the lead frame is plated in a lead plating step (Step S726). Through the plating process, corrosion of the lead can be prevented, and soldering for mounting the electronic component on a printed circuit board in a later step can be performed with higher reliability. Then, the lead is cut and processed in a formation step (Step S727).

Next, a printing (marking) step is performed on a surface of the package (Step S728). After a testing step (Step S729) for checking whether an external shape is good and whether there is malfunction, for example, the electronic component is completed.

Figure 28B:
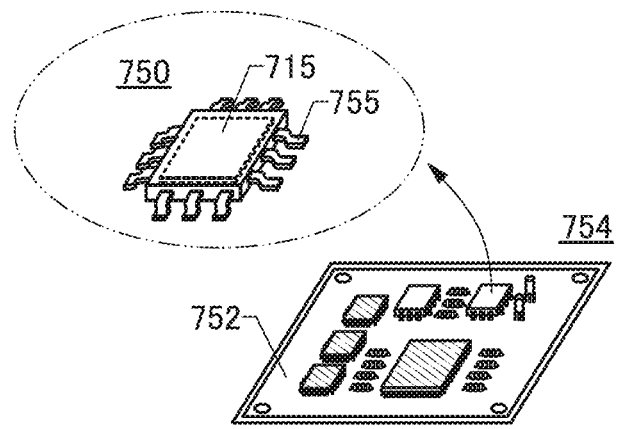
FIG. 28B is a schematic perspective view thereof.

FIG. 28B is a perspective schematic diagram of a completed electronic component. FIG. 28B shows a perspective schematic diagram of a quad flat package (QFP) as an example of an electronic component. An electronic component 750 in FIG. 28B includes a lead 755 and the chip 715. The electronic component 750 may include a plurality of chips 715.

The electronic component 750 in FIG. 28B is mounted on a printed circuit board 752, for example. A plurality of electronic components 750 are combined and electrically connected to each other over the printed circuit board 752; thus, a circuit board on which the electronic components are mounted (a circuit board 754) is completed. The completed circuit board 754 is provided in an electronic device or the like.

The structures, methods, and the like described in this embodiment can be combined as appropriate with any of the structures, methods, and the like described in the other embodiments.

Embodiment 4

<Electronic Device>

A semiconductor device of one embodiment of the present invention can be used for a variety of electronic devices. FIGS. 29A to 29F each illustrate a specific example of an electronic device including the semiconductor device of one embodiment of the present invention.

Figure 29A:
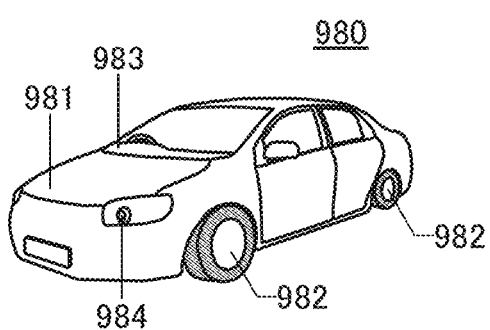
FIGS. 29A to 29F are diagrams each illustrating an electronic device.

FIG. 29A is an external view illustrating an example of a car. A car 980 includes a car body 981, wheels 982, a dashboard 983, lights 984, and the like. The car 980 also includes an antenna, a battery, and the like. The car 980 including the semiconductor device of one embodiment of the present invention can have reduced power consumption.

Figure 29B:
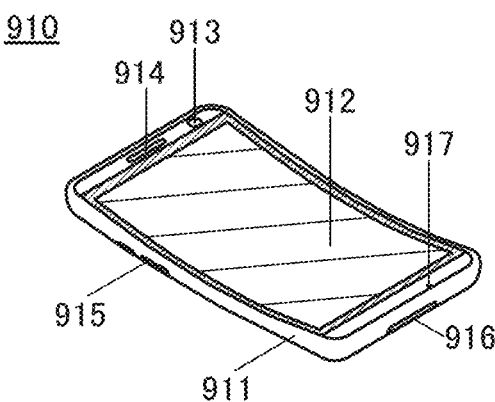

An information terminal 910 illustrated in FIG. 29B includes a housing 911, a display portion 912, a microphone 917, a speaker portion 914, a camera 913, an external connection portion 916, an operation switch 915, and the like. A display panel and a touch screen that use a flexible substrate are provided in the display portion 912. The information terminal 910 also includes an antenna, a battery, and the like inside the housing 911. The information terminal 910 can be used as, for example, a smartphone, a mobile phone, a tablet information terminal, a tablet personal computer, or an e-book reader. The information terminal 910 including the semiconductor device of one embodiment of the present invention can have reduced power consumption.

Figure 29C:
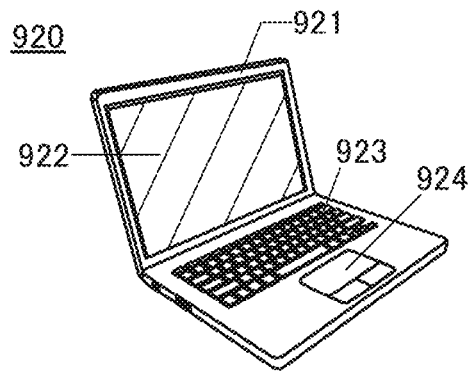

A notebook personal computer 920 illustrated in FIG. 29C includes a housing 921, a display portion 922, a keyboard 923, a pointing device 924, and the like. The notebook personal computer 920 also includes an antenna, a battery, and the like inside the housing 921. The notebook personal computer 920 including the semiconductor device of one embodiment of the present invention can have reduced power consumption.

Figure 29D:
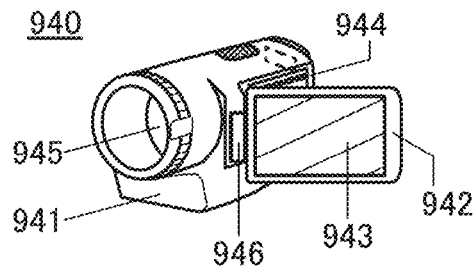

A video camera 940 illustrated in FIG. 29D includes a housing 941, a housing 942, a display portion 943, operation switches 944, a lens 945, a joint 946, and the like. The operation switches 944 and the lens 945 are provided on the housing 941, and the display portion 943 is provided on the housing 942. The video camera 940 also includes an antenna, a battery, and the like inside the housing 941. The housing 941 and the housing 942 are connected to each other with the joint 946, and the angle between the housing 941 and the housing 942 can be changed with the joint 946. By changing the angle between the housings 941 and 942, the orientation of an image displayed on the display portion 943 may be changed or display and non-display of an image may be switched. The video camera 940 including the semiconductor device of one embodiment of the present invention can have reduced power consumption.

Figure 29E:
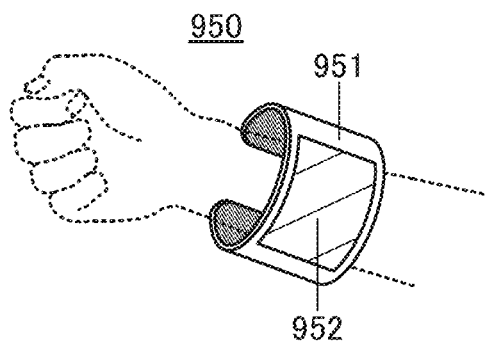

FIG. 29E illustrates an example of a bangle-type information terminal. An information terminal 950 includes a housing 951, a display portion 952, and the like. The information terminal 950 also includes an antenna, a battery, and the like inside the housing 951. The display portion 952 is supported by the housing 951 having a curved surface. A display panel with a flexible substrate is provided in the display portion 952, so that the information terminal 950 can be a user-friendly information terminal that is flexible and lightweight. The information terminal 950 including the semiconductor device of one embodiment of the present invention can have reduced power consumption.

Figure 29F:
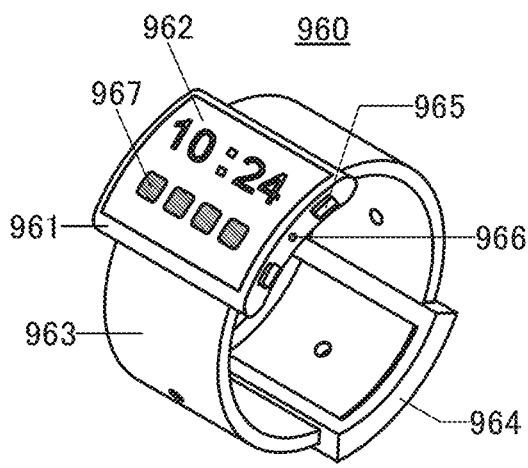

FIG. 29F illustrates an example of a watch-type information terminal. An information terminal 960 includes a housing 961, a display portion 962, a band 963, a buckle 964, an operation switch 965, an input/output terminal 966, and the like. The information terminal 960 also includes an antenna, a battery, and the like inside the housing 961. The information terminal 960 is capable of executing a variety of applications such as mobile phone calls, e-mailing, text viewing and editing, music reproduction, Internet communication, and computer games.

The display surface of the display portion 962 is bent, and images can be displayed on the bent display surface. Furthermore, the display portion 962 includes a touch sensor, and operation can be performed by touching the screen with a finger, a stylus, or the like. For example, an application can be started by touching an icon 967 displayed on the display portion 962. With the operation switch 965, a variety of functions such as time setting, ON/OFF of the power, ON/OFF of wireless communication, setting and cancellation of a silent mode, and setting and cancellation of a power saving mode can be performed. The functions of the operation switch 965 can be set by setting the operating system incorporated in the information terminal 960, for example.

The information terminal 960 can employ near field communication that is a communication method based on an existing communication standard. In that case, for example, mutual communication between the information terminal 960 and a headset capable of wireless communication can be performed, and thus hands-free calling is possible. Moreover, the information terminal 960 includes the input/output terminal 966, and data can be directly transmitted to and received from another information terminal via a connector. Power charging through the input/output terminal 966 is also possible. The charging operation may be performed by wireless power feeding without using the input/output terminal 966.

The information terminal 960 including the semiconductor device of one embodiment of the present invention can have reduced power consumption.

The structures, methods, and the like described in this embodiment can be combined as appropriate with any of the structures, methods, and the like described in the other embodiments.

REFERENCE NUMERALS

10: semiconductor device, 11: memory device, 12: device group, 13: transmission path, 20: memory unit, 21: arithmetic device, 22: auxiliary memory device, 23: power supply control device, 24: clock signal generation device, 25: memory unit, 30: interface, 40: insulator, 41: insulator, 42: insulator, 43: insulator, 44: insulator, 45: insulator, 46: insulator, 47: insulator, 100: transistor, 101: conductor, 101a: conductor, 101b: conductor, 102: metal oxide, 102a: metal oxide, 102A: metal oxide, 102b: metal oxide, 102B: metal oxide, 102c: metal oxide, 102C: metal oxide, 104a: conductor, 104A: conductor, 104b: conductor, 105: insulator, 105A: insulator, 106: conductor, 107: insulator, 107A: insulator, 108: insulator, 109: insulator, 200: transistor, 200_1: transistor, 2002: transistor, 201: conductor, 201a: conductor, 201b: conductor, 202: metal oxide, 202a_1: metal oxide, 202a_2: metal oxide, 202b_1: metal oxide, 202b_2: metal oxide, 202c: metal oxide, 204a: conductor, 204b: conductor, 205: insulator, 206: conductor, 207: insulator, 208: insulator, 209: insulator, 210: conductor, 210a: conductor, 210b: conductor, 211: conductor, 211a: conductor, 211b: conductor, 300: capacitor, 300_1: capacitor, 300_2: capacitor, 301: inverter, 302: inverter, 303: transistor, 304: switch, 305: switch, 306: inverter, 307: inverter, 310: circuit, 311: transistor, 312: transistor, 313: transistor, 314: transistor, 315: transistor, 316: transistor, 320: circuit, 405: controller, 410: row circuit, 411: decoder, 412: word line driver circuit, 413: column selector, 414: sense amplifier driver circuit, 415: column circuit, 416: global sense amplifier array, 417: input/output circuit, 420: MC-SA array, 422: memory cell array, 423: sense amplifier array, 425: local memory cell array, 426: local sense amplifier array, 444: switch array, 445: memory cell, 446: sense amplifier, 447: global sense amplifier, 501: CPU core, 502: power controller, 503: power switch, 505: bus interface, 506: debug interface, 507: control unit, 508: PC, 509: pipeline register, 510: pipeline register, 511: ALU, 512: register file, 521: power management unit, 522: peripheral circuit, 523: data bus, 600: flip-flop circuit, 601: memory circuit, 602: memory circuit, 603: memory circuit, 604: circuit, 609: transistor, 610: transistor, 612: transistor, 613: transistor, 615: transistor, 617: transistor, 618: transistor, 619: capacitor, 620: capacitor, 640: wiring, 641: wiring, 643: wiring, 644: wiring, 711: substrate, 712: circuit region, 713: separation region, 714: separation line, 715: chip, 750: electronic component, 752: printed circuit board, 754: circuit board, 755: lead, 910: information terminal, 911: housing, 912: display portion, 913: camera, 914: speaker portion, 915: operation switch, 916: external connection portion, 917: microphone, 920: notebook personal computer, 921: housing, 922: display portion, 923: keyboard, 924: pointing device, 940: video camera, 941: housing, 942: housing, 943: display portion, 944: operation switch, 945: lens, 946: joint, 950: information terminal, 951: housing, 952: display portion, 960: information terminal, 961: housing, 962: display portion, 963: band, 964: buckle, 965: operation switch, 966: input/output terminal, 967: icon, 980: car, 981: car body, 982: wheel, 983: dashboard, 984: light This application is based on Japanese Patent Application Serial No. 2017-098686 filed with Japan Patent Office on May 18, 2017, the entire contents of which are hereby incorporated by reference.

The invention claimed is:

1. A semiconductor device comprising:
a first memory cell;
a second memory cell; and
a first interface,
wherein the first memory cell comprises a first transistor,
wherein the second memory cell comprises a second transistor,
wherein a threshold voltage of the second transistor is higher than a threshold voltage of the first transistor,
wherein the first transistor comprises a first metal oxide,
wherein the second transistor comprises a second metal oxide,
wherein each of the first metal oxide and the second metal oxide comprises a channel formation region,
wherein each of the first metal oxide and the second metal oxide comprises In, an element M, and Zn, M being Al, Ga, Y, or Sn,
wherein an atomic ratio of the element M to In in the second metal oxide is greater than an atomic ratio of the element M to In in the first metal oxide, and
wherein the first interface comprises the second memory cell,
wherein the first interface is electrically connected to a memory device, and
wherein the memory device comprises the first memory cell.

2. The semiconductor device according to claim 1, wherein an electron affinity of the second metal oxide is smaller than an electron affinity of the first metal oxide.

3. The semiconductor device according to claim 1, wherein the memory device comprises a plurality of memory cells which have a same structure,
wherein the first memory cell is one of the plurality of the memory cells, and
wherein the plurality of the memory cells are arranged in a matrix in the memory device.

4. The semiconductor device according to claim 1, wherein the second memory cell is included in an auxiliary memory device.

5. The semiconductor device according to claim 1, wherein the second memory cell is included in an arithmetic device, a power supply control device or a clock signal generation device.

6. A semiconductor device comprising:
a first memory cell; and
a second memory cell,
wherein the first memory cell comprises a first transistor,
wherein the second memory cell comprises a second transistor,
wherein the first transistor comprises a first insulator, a second insulator, a first semiconductor, a second semiconductor, and a first conductor,
wherein the second transistor comprises the first insulator, a third insulator, a third semiconductor, a fourth semiconductor, a fifth semiconductor, and a second conductor,
wherein the first semiconductor is provided over the first insulator,
wherein the first semiconductor comprises a first source region, a first drain region, and a first channel formation region, wherein the second semiconductor overlaps with the first channel formation region, wherein the second insulator is provided over the second semiconductor, wherein the first conductor is provided over the second insulator, wherein the third semiconductor and the fourth semiconductor are provided over the first insulator, wherein the third semiconductor comprises a second source region, wherein the fourth semiconductor comprises a second drain region, wherein the fifth semiconductor comprises a second channel formation region, wherein the third insulator is provided over the fifth semiconductor, and wherein the second conductor is provided over the third insulator.

7. The semiconductor device according to claim 6, wherein the first semiconductor, the third semiconductor, and the fourth semiconductor have a same composition, and wherein the second semiconductor and the fifth semiconductor have a same composition.

8. The semiconductor device according to claim 6, wherein the first semiconductor, the third semiconductor, and the fourth semiconductor are formed by etching a first semiconductor film, and wherein the second semiconductor and the fifth semiconductor are formed by etching a second semiconductor film.

9. The semiconductor device according to claim 6, wherein an electron affinity of the fifth semiconductor is smaller than an electron affinity of the first semiconductor.

10. The semiconductor device according to claim 6, wherein the first to fifth semiconductors comprise a metal oxide.

11. The semiconductor device according to claim 10, wherein the metal oxide comprises In, an element M, and Zn, M being Al, Ga, Y, or Sn.

12. The semiconductor device according to claim 11, wherein an atomic ratio of the element M to In in the fifth semiconductor is greater than an atomic ratio of the element M to In in the first semiconductor.

13. The semiconductor device according to claim 6, wherein a threshold voltage of the second transistor is higher than a threshold voltage of the first transistor.

14. The semiconductor device according to claim 6, wherein the first transistor comprises a third conductor, and wherein the third conductor is provided below the first conductor to include a region overlapping with the first channel formation region.

15. The semiconductor device according to claim 6, further comprising a memory device, wherein the memory device comprises a plurality of memory cells which have a same structure, wherein the first memory cell is one of the plurality of the memory cells, and wherein the plurality of the memory cells are arranged in a matrix in the memory device.

16. The semiconductor device according to claim 6, further comprising a first interface, wherein the first interface comprises the second memory cell, wherein the first interface is electrically connected to a memory device, and wherein the memory device comprises the first memory cell.

17. The semiconductor device according to claim 6, wherein the second memory cell is included in an auxiliary memory device.

18. The semiconductor device according to claim 6, wherein the second memory cell is included in an arithmetic device, a power supply control device or a clock signal generation device.

* * * * *